(12) United States Patent
Bennett et al.

(10) Patent No.: US 6,917,731 B2
(45) Date of Patent: Jul. 12, 2005

(54) OPTICAL AMPLIFICATION MODULE

(75) Inventors: Kevin W Bennett, Hammondsport, NY (US); Jeffery A DeMeritt, Painted Post, NY (US); Paul A Jakobson, Big Flats, NY (US); Kenneth R Lane, Corning, NY (US); Richard G Smart, Horseheads, NY (US); Jason S Watts, Horseheads, NY (US); Peter G Wigley, Corning, NY (US)

(73) Assignee: Corning Incorporated, Cornin, NY (US)

( * ) Notice: Subject to any disclaimer, the term of this patent is extended or adjusted under 35 U.S.C. 154(b) by 217 days.

(21) Appl. No.: 10/109,474

(22) Filed: Mar. 27, 2002

(65) Prior Publication Data

US 2003/0185486 A1 Oct. 2, 2003

(51) Int. Cl.[7] .............................. G02B 6/26; G02B 6/42
(52) U.S. Cl. ............................. 385/15; 385/88; 385/92; 385/135; 359/333; 359/341.1; 359/341.3; 359/341.33
(58) Field of Search .............................. 359/333, 341.1, 359/341.3, 341.33; 385/15, 88, 92, 135

(56) References Cited

U.S. PATENT DOCUMENTS

| | | | |
|---|---|---|---|
| 4,527,285 A | 7/1985 | Kekas et al. ................. | 455/607 |
| 4,962,995 A | 10/1990 | Andrews et al. ........... | 350/96.34 |
| 4,995,696 A * | 2/1991 | Nishimura et al. .......... | 359/333 |
| 5,198,684 A | 3/1993 | Sudo ........................... | 257/79 |
| 5,241,414 A | 8/1993 | Giles et al. .................. | 359/341 |
| 5,253,104 A | 10/1993 | Delavaux .................... | 359/341 |
| 5,280,383 A | 1/1994 | Federici et al. ............. | 359/341 |
| 5,383,051 A | 1/1995 | Delrosso et al. ............ | 359/341 |
| 5,392,154 A | 2/1995 | Chang et al. ................ | 359/341 |
| 5,457,763 A | 10/1995 | Kerry et al. ................. | 385/135 |
| 5,469,526 A | 11/1995 | Rawlings .................... | 385/135 |
| 5,475,592 A | 12/1995 | Wnuk et al. ............. | 364/424.05 |
| 5,500,756 A | 3/1996 | Tsushima et al. ........... | 359/174 |
| 5,504,609 A | 4/1996 | Alexander et al. .......... | 359/125 |
| 5,504,771 A | 4/1996 | Vahala et al. ................. | 372/94 |
| 5,515,200 A | 5/1996 | Delrosso et al. ............ | 359/341 |

(Continued)

OTHER PUBLICATIONS

Japan abstract. JP362076332A. Apr. 8, 1987. Fuji Electric Col Ltd., Sakamaki, Takeshi et al.
"Characterization Of Erbium–Doped Fibers And Application To Modeling 980–nm and 1480–nm Pumped Amplifiers" C.R. Giles et al., IEEE Photonics Technology Letters, vol. 3, No. 4, Apr. 1991, 363–365.
"Plug–In Type 1.3–$\mu$m Fiber Amplifier Module For Rack–Mounted Shelves" Yoshiki Nishida et al., IEEE Photonics Technology Letters, vol. 9, No. 8, Aug. 1997, 1097–1098.
"Erbium–Doped Fiber Amplifiers" P.C. Becker et al. Academic Press, San Diego, 1999, 251–319.
"Merriam–Webster's Collegiate Dictionary" 746.
"Design And Performance Of Single–Mode Plug–In Type Optical–Fiber Connectors" Shin'Ichi Iwano et al., Journal Of Lightwave Technology, vol. 8, No. 11, Nov. 1990, 1750–1756.

Primary Examiner—Brian Healy
Assistant Examiner—Daniel Petkovsek
(74) Attorney, Agent, or Firm—Svetlana Z. Short

(57) ABSTRACT

According to one embodiment of the present invention an amplification module comprises a housing containing a plurality of optical ports. This housing: (i) at least partially encloses at least one amplification medium, (ii) provides at least one position for at least one optical filter, and (iii) includes a first optical port configured to provide both signal and pump light to the amplification module. According to an embodiment of the present invention the amplification module does not include a WDM for multiplexing pump light and signal light.

32 Claims, 80 Drawing Sheets

U.S. PATENT DOCUMENTS

| | | | |
|---|---|---|---|
| 5,532,864 A | 7/1996 | Alexander et al. | 359/177 |
| 5,557,439 A | 9/1996 | Alexander et al. | 359/130 |
| 5,572,617 A | 11/1996 | Bernhardt et al. | 385/135 |
| 5,577,151 A | 11/1996 | Hoffer | 385/135 |
| 5,579,154 A | 11/1996 | Mueller-Fiedler et al. | 359/341 |
| 5,594,825 A | 1/1997 | Kawasaki et al. | 385/60 |
| 5,657,153 A | 8/1997 | Endriz et al. | 359/341 |
| 5,696,615 A | 12/1997 | Alexander | 359/134 |
| 5,703,991 A * | 12/1997 | Izumi | 385/135 |
| 5,726,796 A * | 3/1998 | Regener et al. | 359/341.2 |
| 5,727,110 A | 3/1998 | Smith et al. | 385/147 |
| 5,737,194 A | 4/1998 | Hopkins et al. | 361/800 |
| 5,757,998 A | 5/1998 | Thatcher et al. | 385/75 |
| 5,764,826 A | 6/1998 | Kuhara et al. | 385/24 |
| 5,767,999 A | 6/1998 | Kayner | 359/163 |
| 5,778,132 A | 7/1998 | Csipkes et al. | 385/135 |
| 5,798,855 A | 8/1998 | Alexander et al. | 359/177 |
| 5,808,785 A | 9/1998 | Nakabayashi | 359/341 |
| 5,809,196 A | 9/1998 | Meli et al. | 385/123 |
| 5,879,173 A | 3/1999 | Poplawski et al. | 438/138 |
| 5,915,061 A | 6/1999 | Vanoli | 385/135 |
| 5,917,648 A * | 6/1999 | Harker | 359/341.3 |
| 6,008,934 A | 12/1999 | Fatehi et al. | 359/341 |
| 6,023,366 A | 2/2000 | Kinoshita | 359/341 |
| 6,049,413 A | 4/2000 | Taylor et al. | 359/337 |
| 6,052,393 A | 4/2000 | Islam | 372/6 |
| 6,058,235 A | 5/2000 | Hiramatsu et al. | 385/135 |
| 6,101,024 A | 8/2000 | Islam et al. | 359/334 |
| 6,132,104 A | 10/2000 | Bliss et al. | 385/53 |
| 6,134,047 A | 10/2000 | Flood et al. | 359/341 |
| 6,144,792 A * | 11/2000 | Kim et al. | 385/135 |
| 6,178,038 B1 | 1/2001 | Taylor et al. | 359/341 |
| 6,208,797 B1 | 3/2001 | Vanderhoof et al. | 385/135 |
| 6,215,582 B1 * | 4/2001 | Sudo et al. | 385/137 |
| 6,236,498 B1 * | 5/2001 | Freeman et al. | 359/337.1 |
| 6,236,499 B1 | 5/2001 | Berg et al. | 359/341 |
| 6,275,317 B1 | 8/2001 | Doerr et al. | 359/180 |
| 6,292,291 B1 | 9/2001 | Yoon et al. | 359/337.13 |
| 6,310,717 B1 * | 10/2001 | Naganuma et al. | 359/341.1 |
| 6,344,911 B1 | 2/2002 | Dailey, Jr. et al. | 359/127 |
| 6,384,961 B2 * | 5/2002 | Lawrence | 359/333 |
| 6,433,925 B1 * | 8/2002 | Sakano et al. | 359/341.43 |
| 6,483,978 B1 * | 11/2002 | Gao et al. | 385/135 |
| 6,574,393 B2 * | 6/2003 | Gao | 385/24 |
| 6,603,896 B1 * | 8/2003 | MacCormack et al. | 385/24 |
| 6,650,818 B2 * | 11/2003 | Gao | 385/132 |
| 6,687,050 B2 * | 2/2004 | Griggs et al. | 359/341.4 |
| 2004/0126057 A1 * | 7/2004 | Yoo | 385/16 |

\* cited by examiner

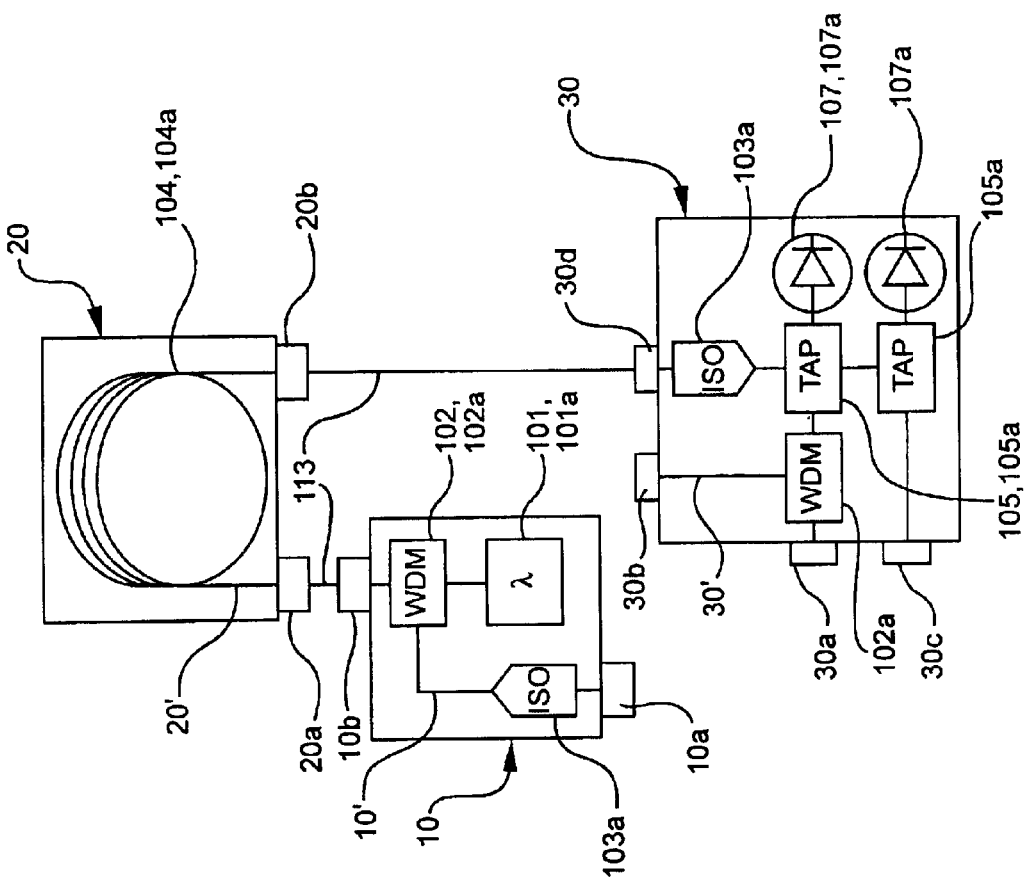
FIG. 3 Amplifier 1B
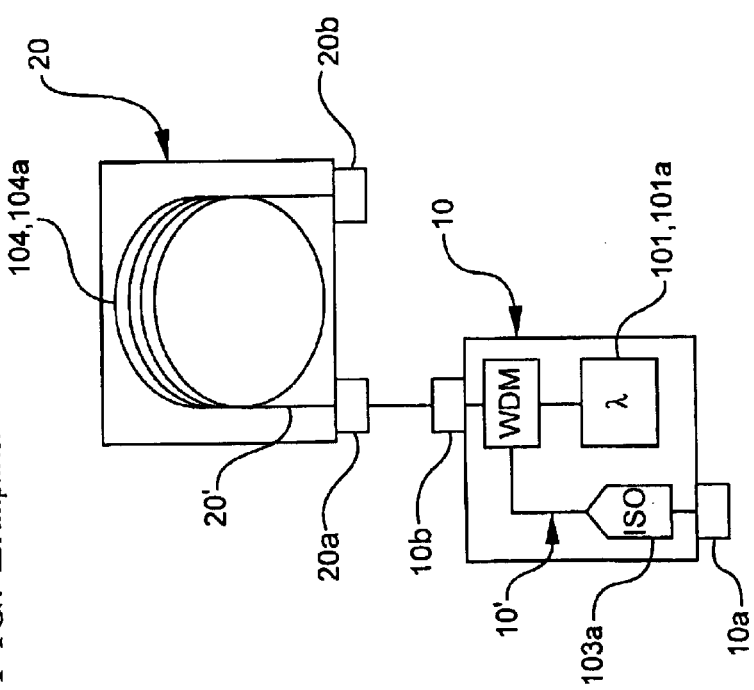
FIG. 2 Amplifier 1A

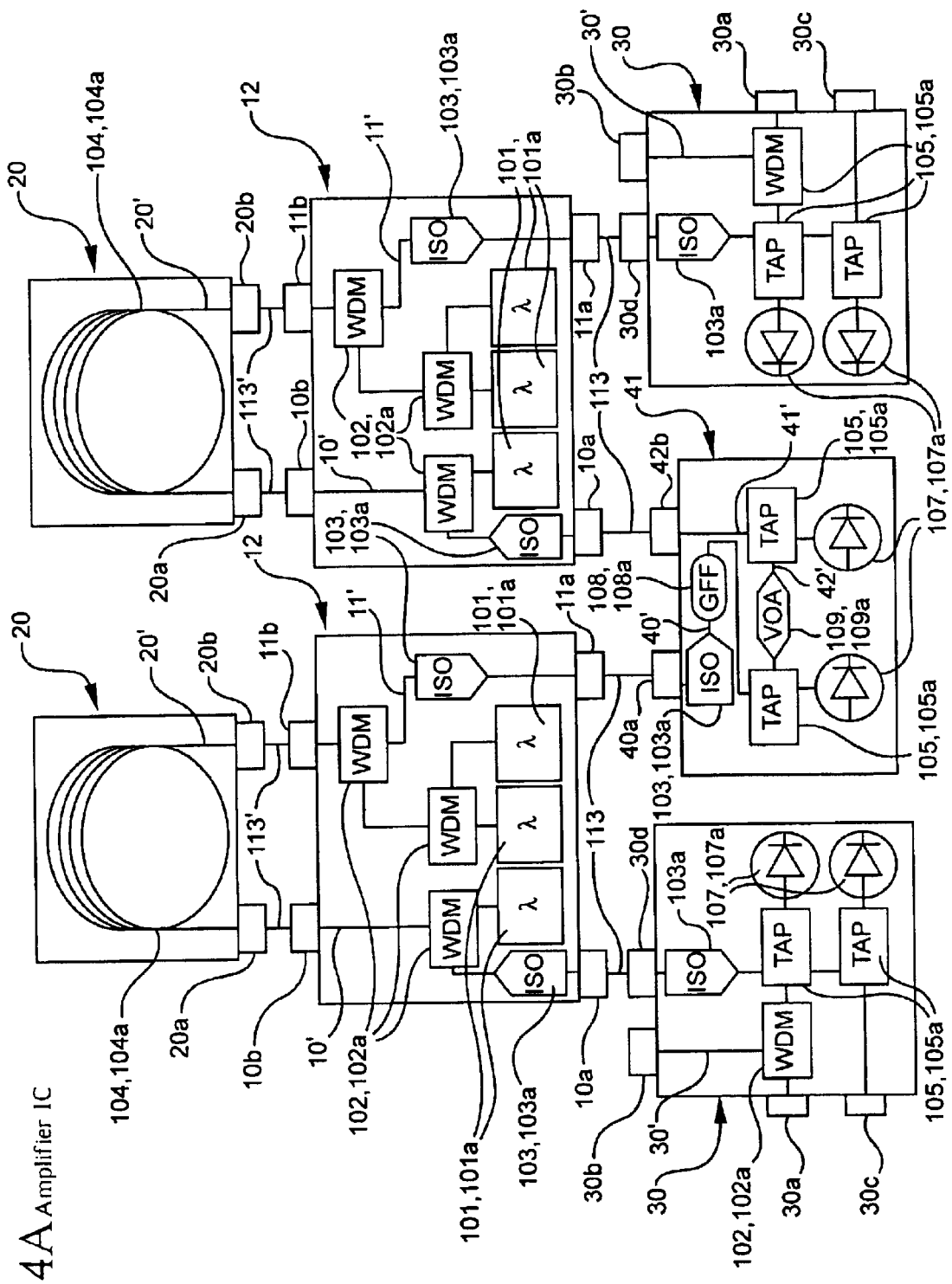
FIG. 4A Amplifier IC

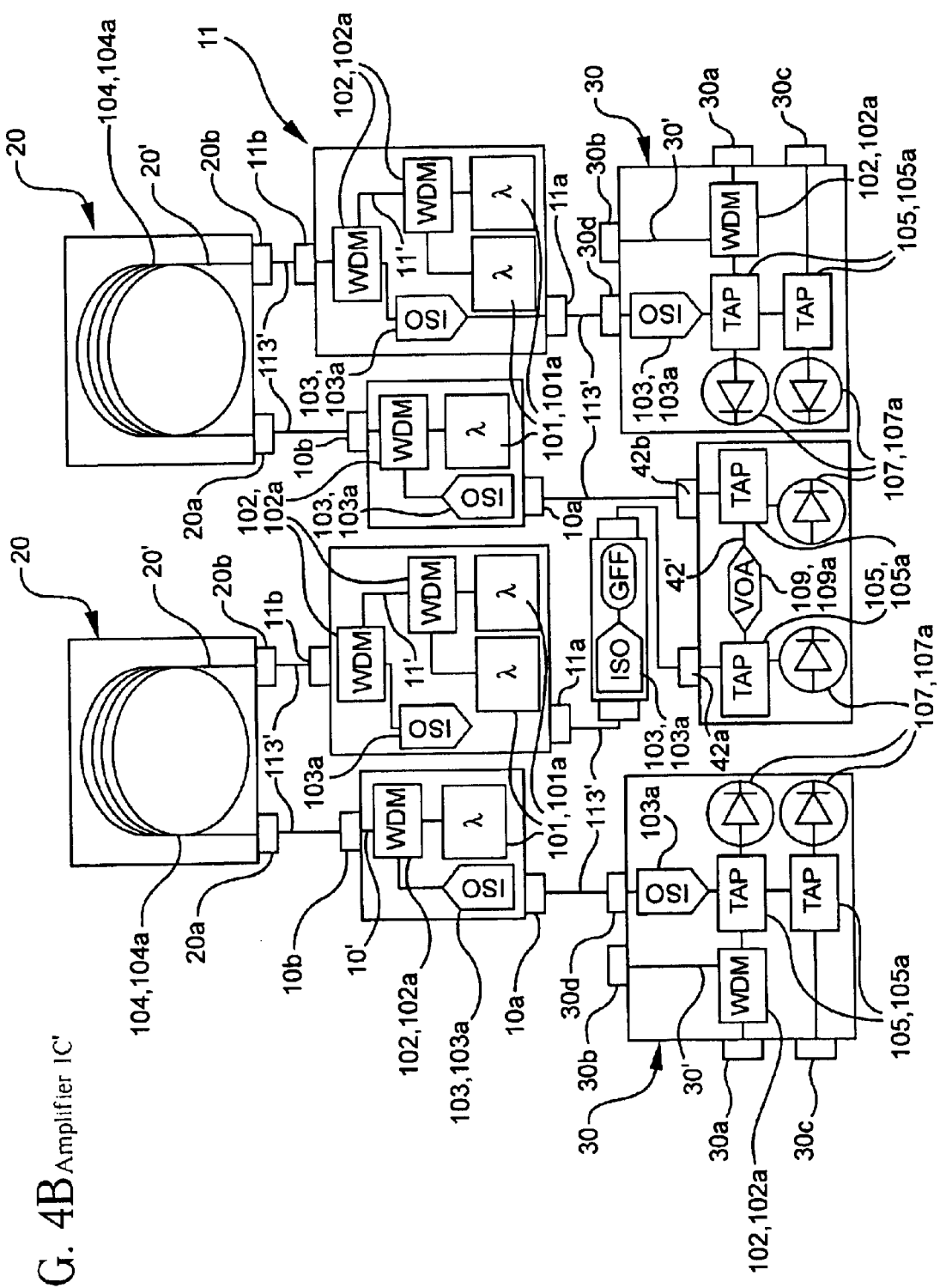
FIG. 4B Amplifier IC'

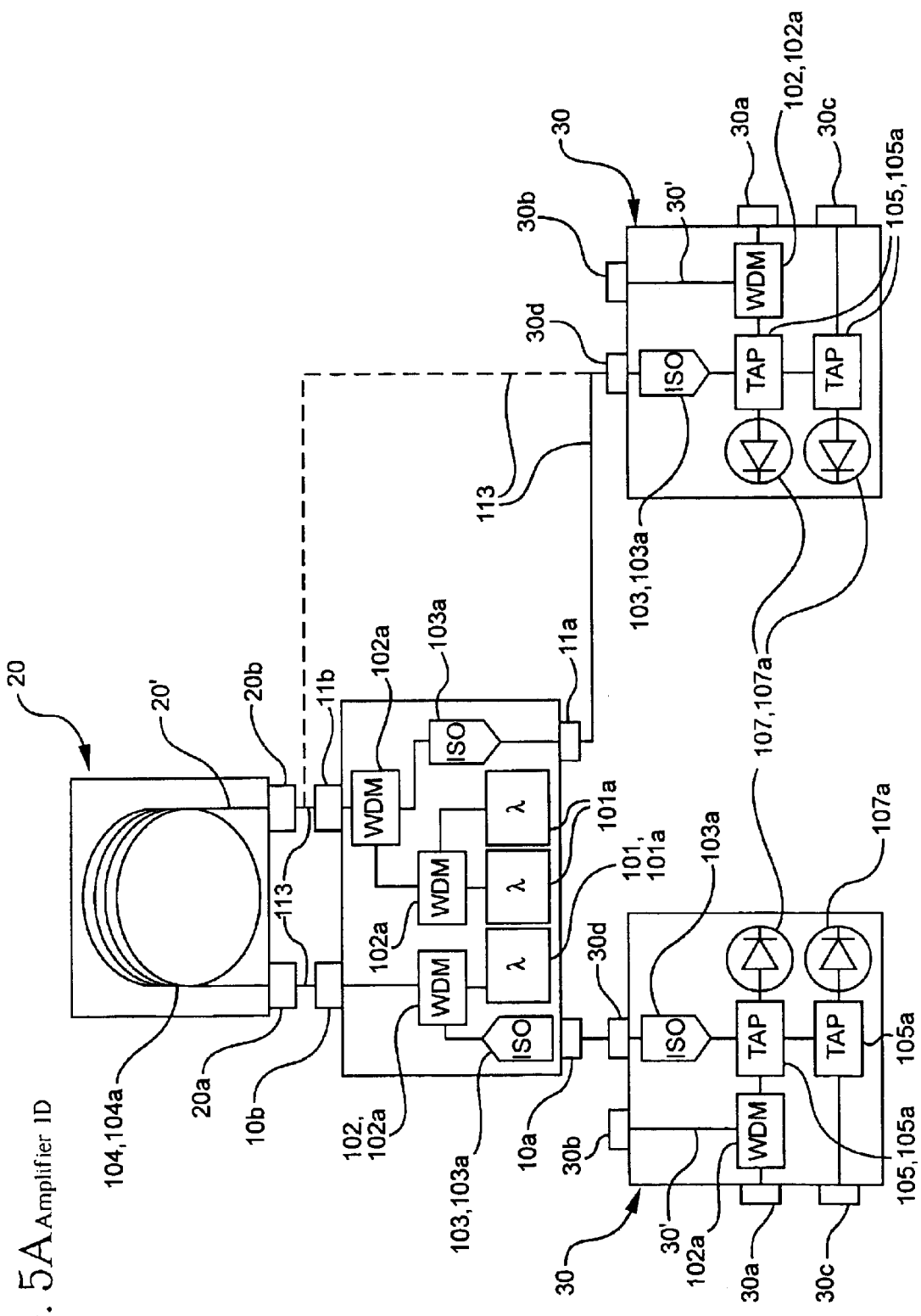
FIG. 5A Amplifier 1D

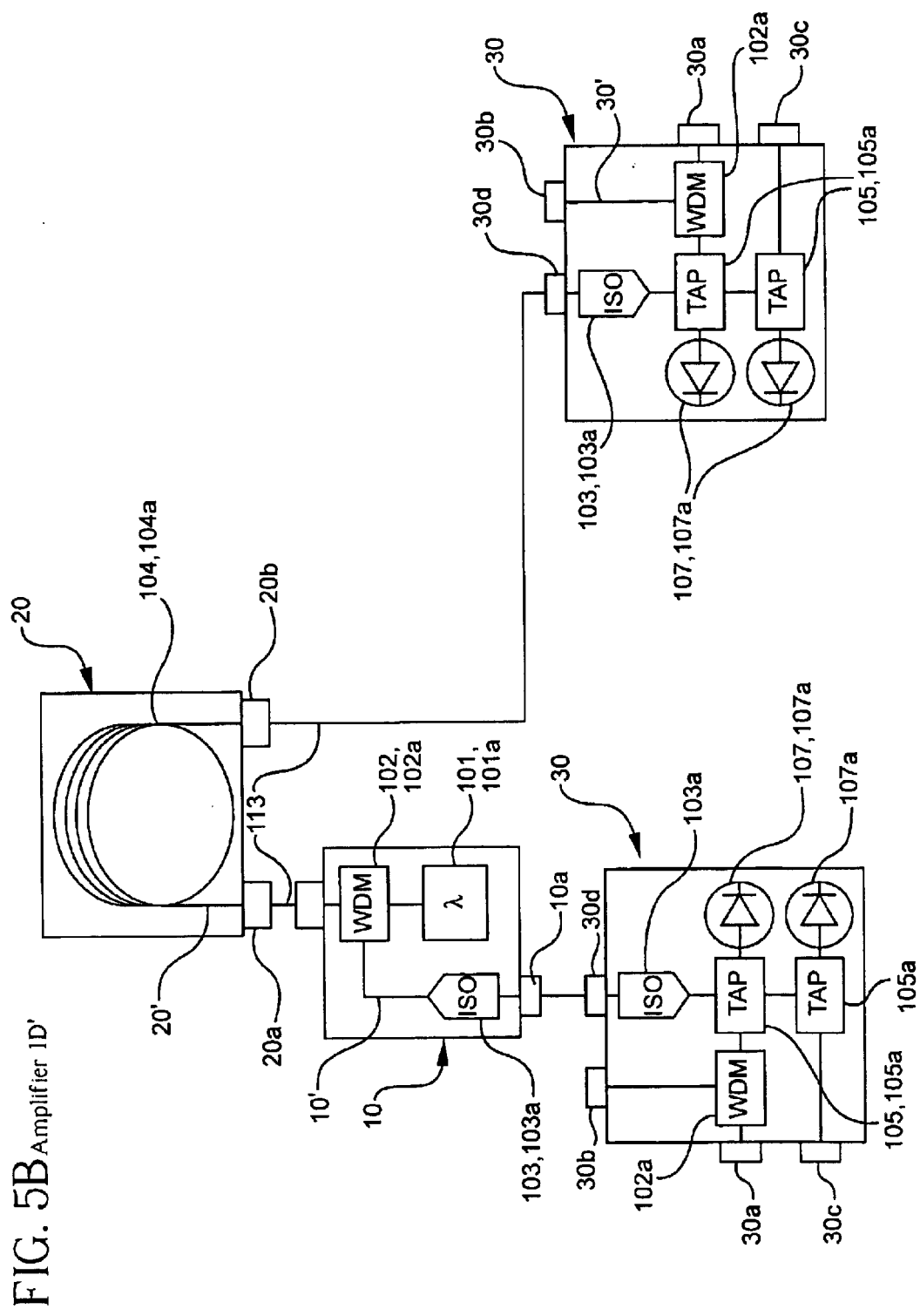
FIG. 5B Amplifier 1D'

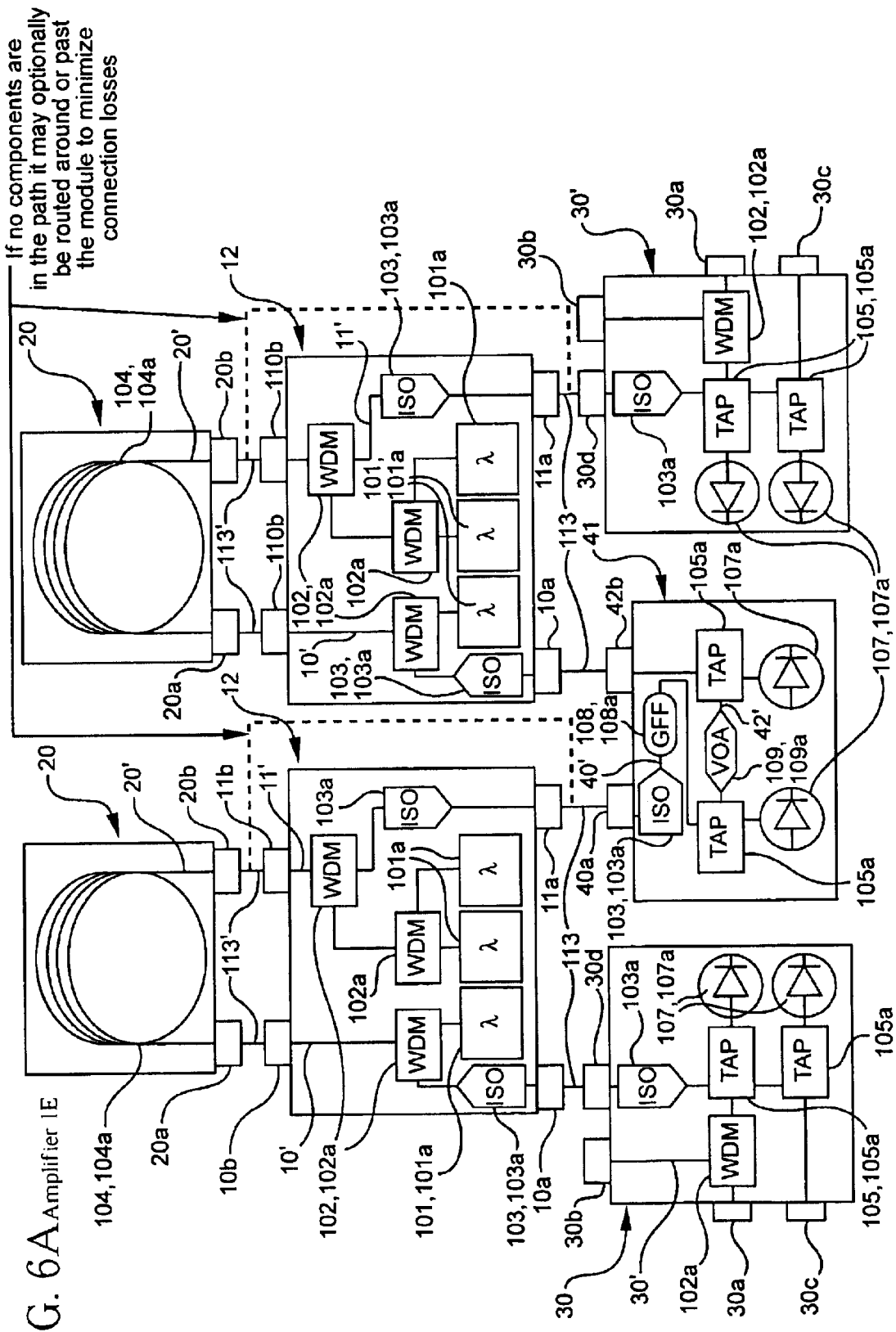
FIG. 6A Amplifier 1E

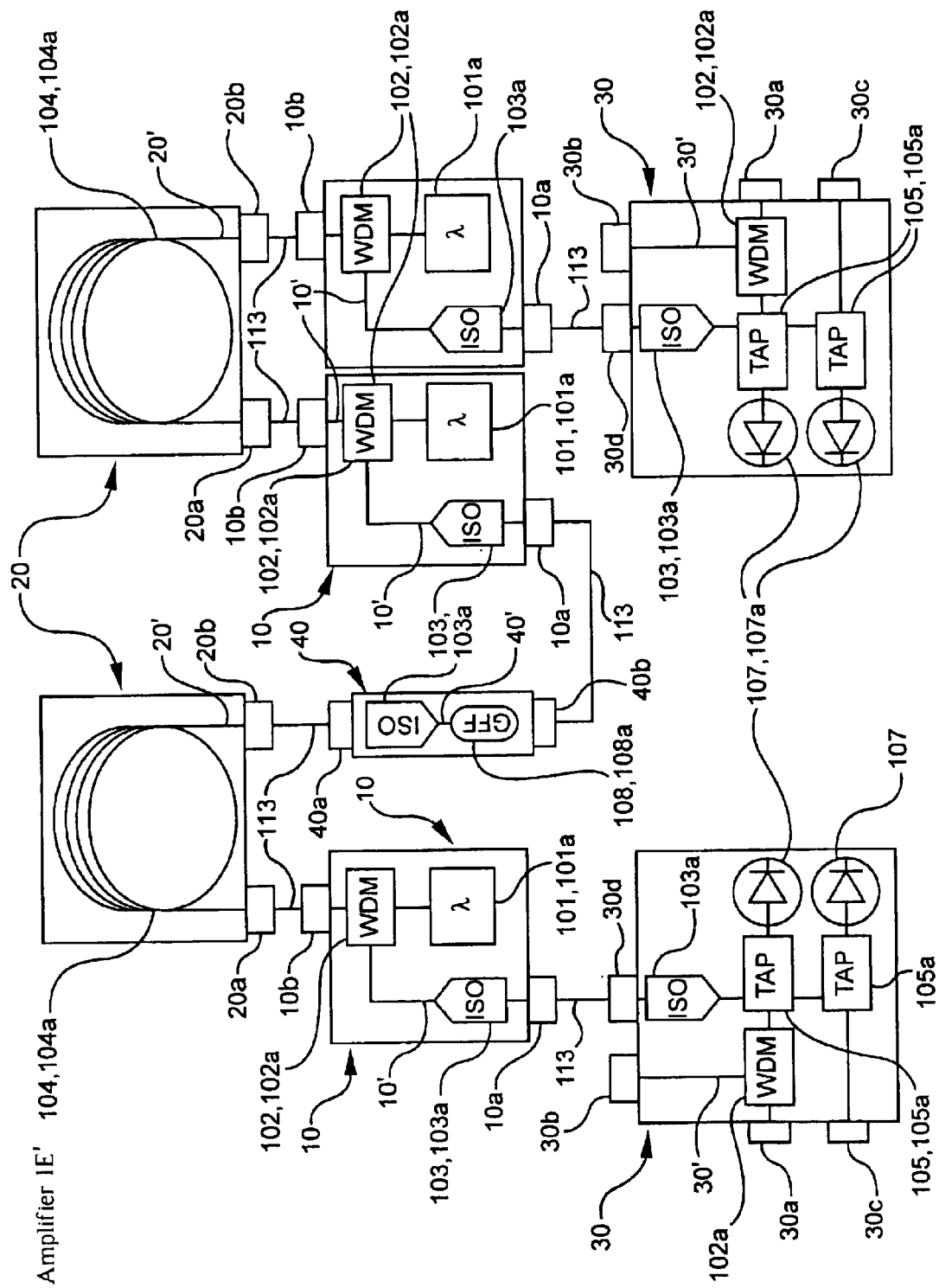
FIG. 6B Amplifier 1E'

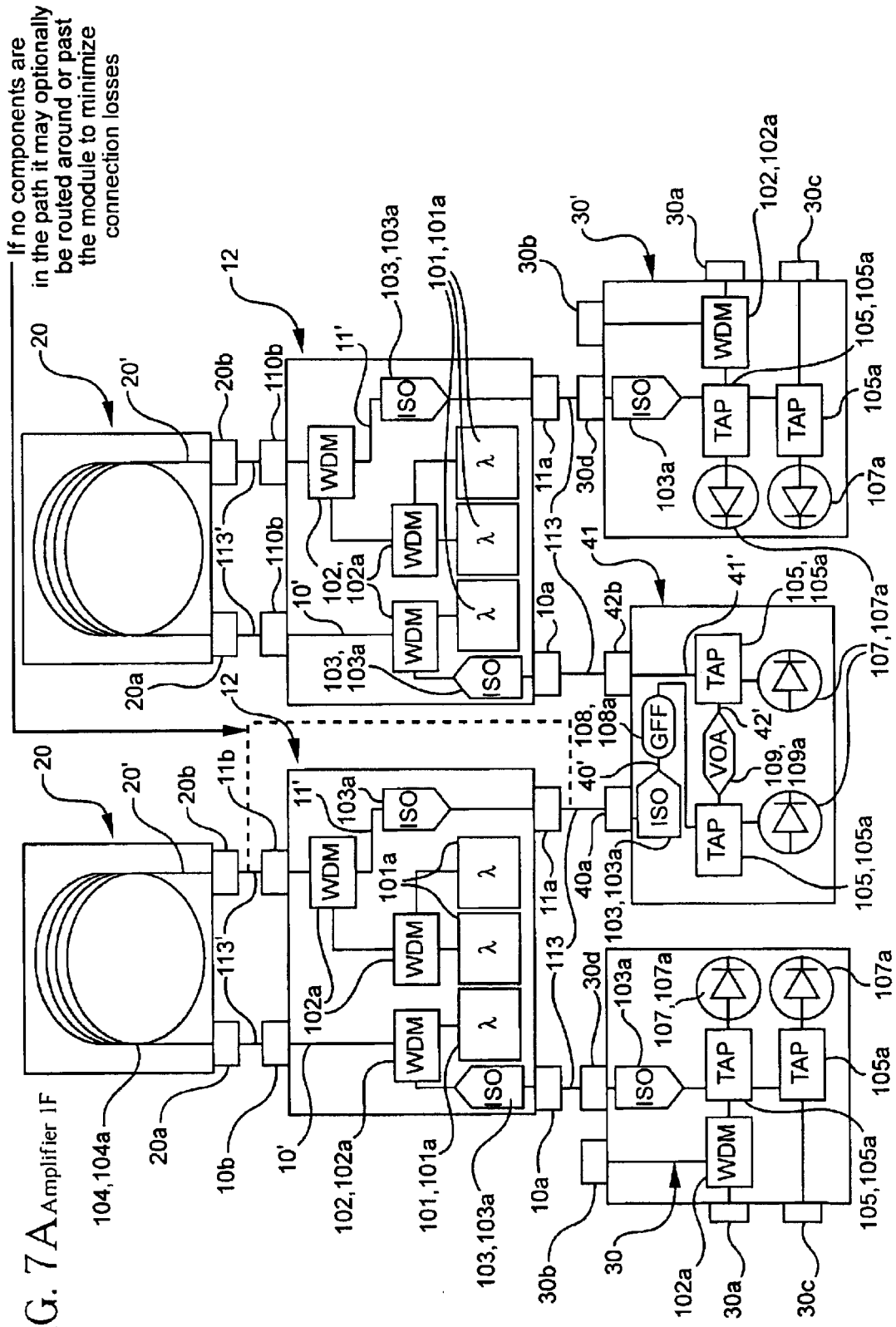
FIG. 7A Amplifier 1F

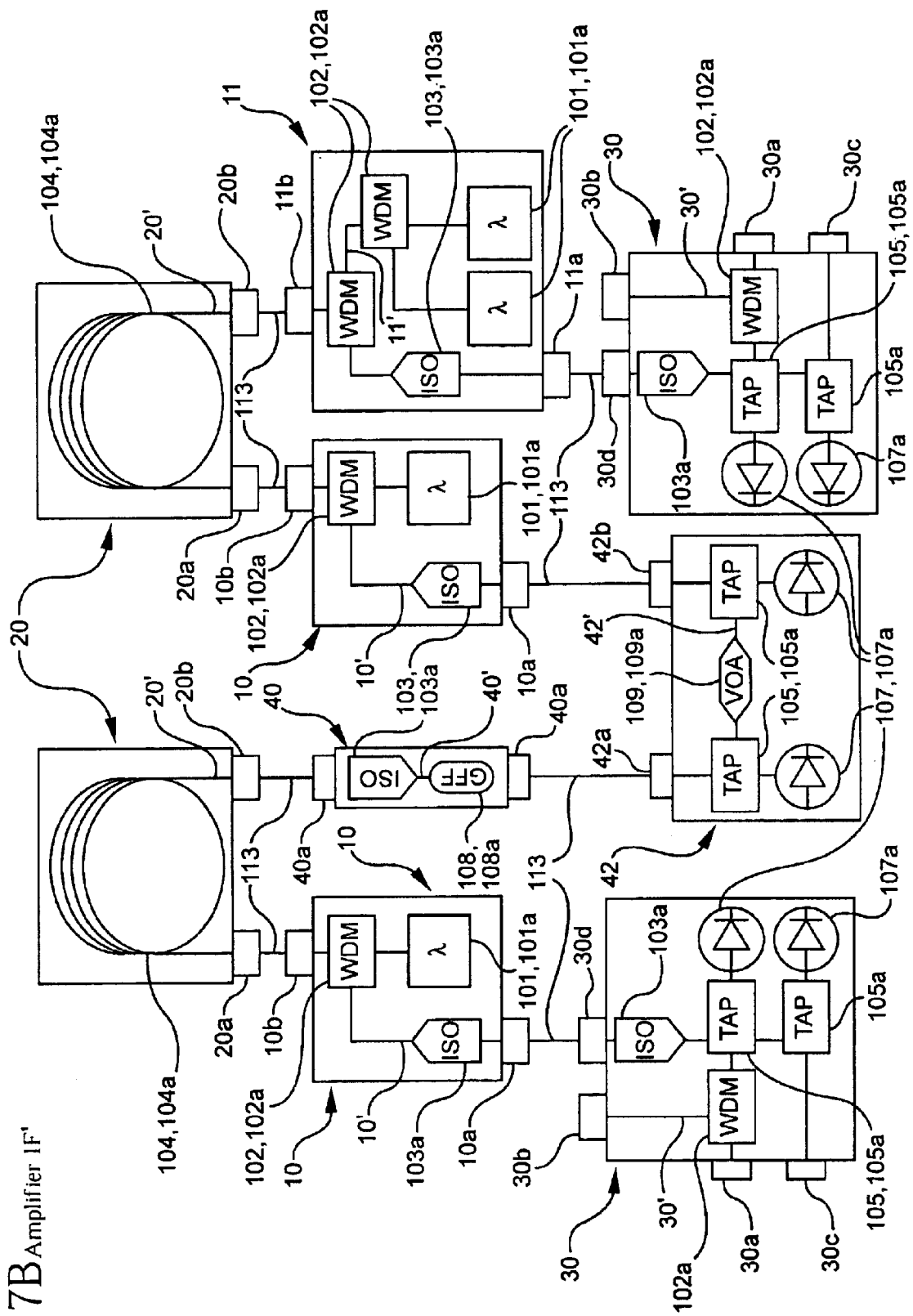
FIG. 7B Amplifier 1F'

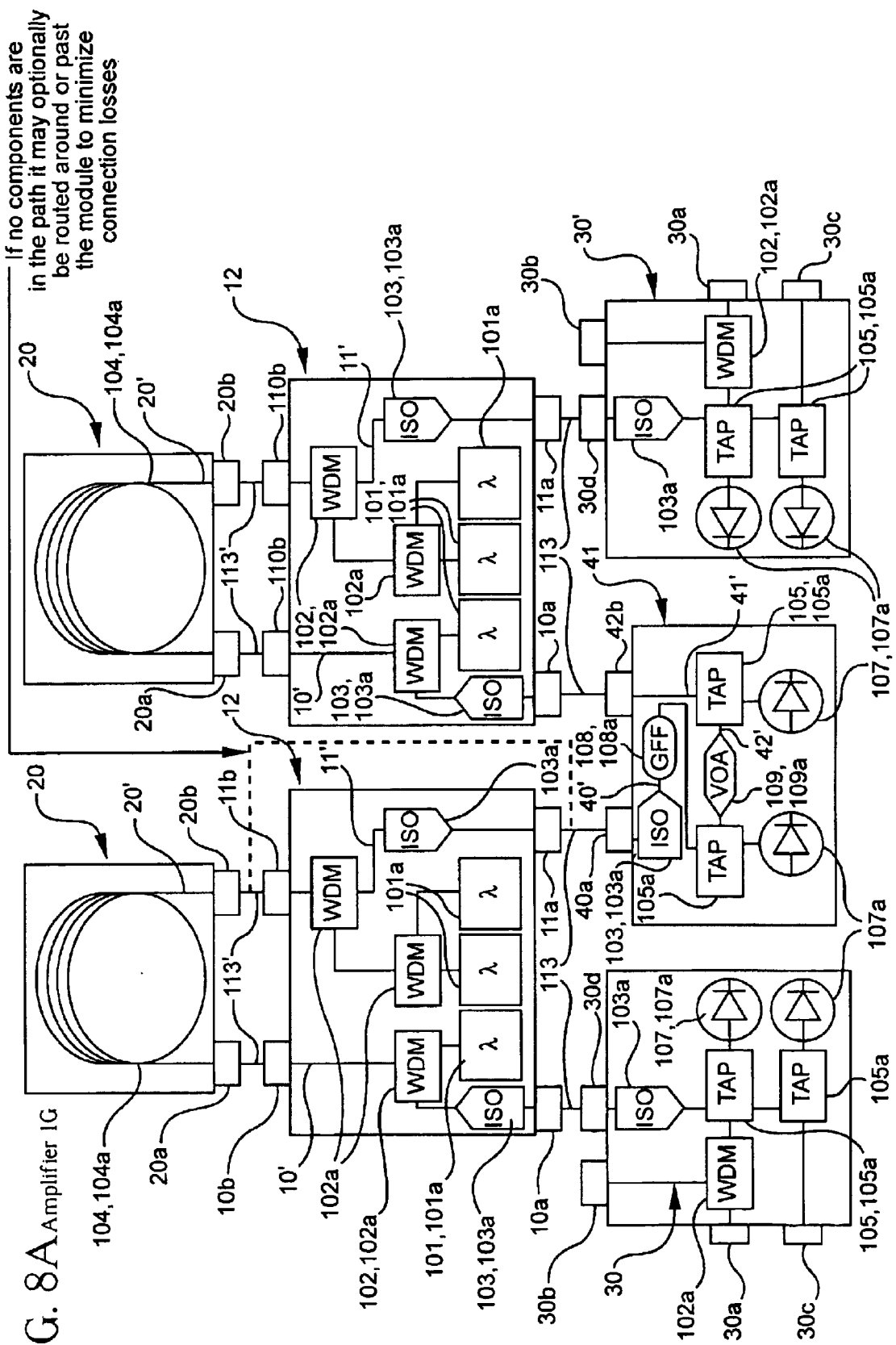
FIG. 8A Amplifier 1G

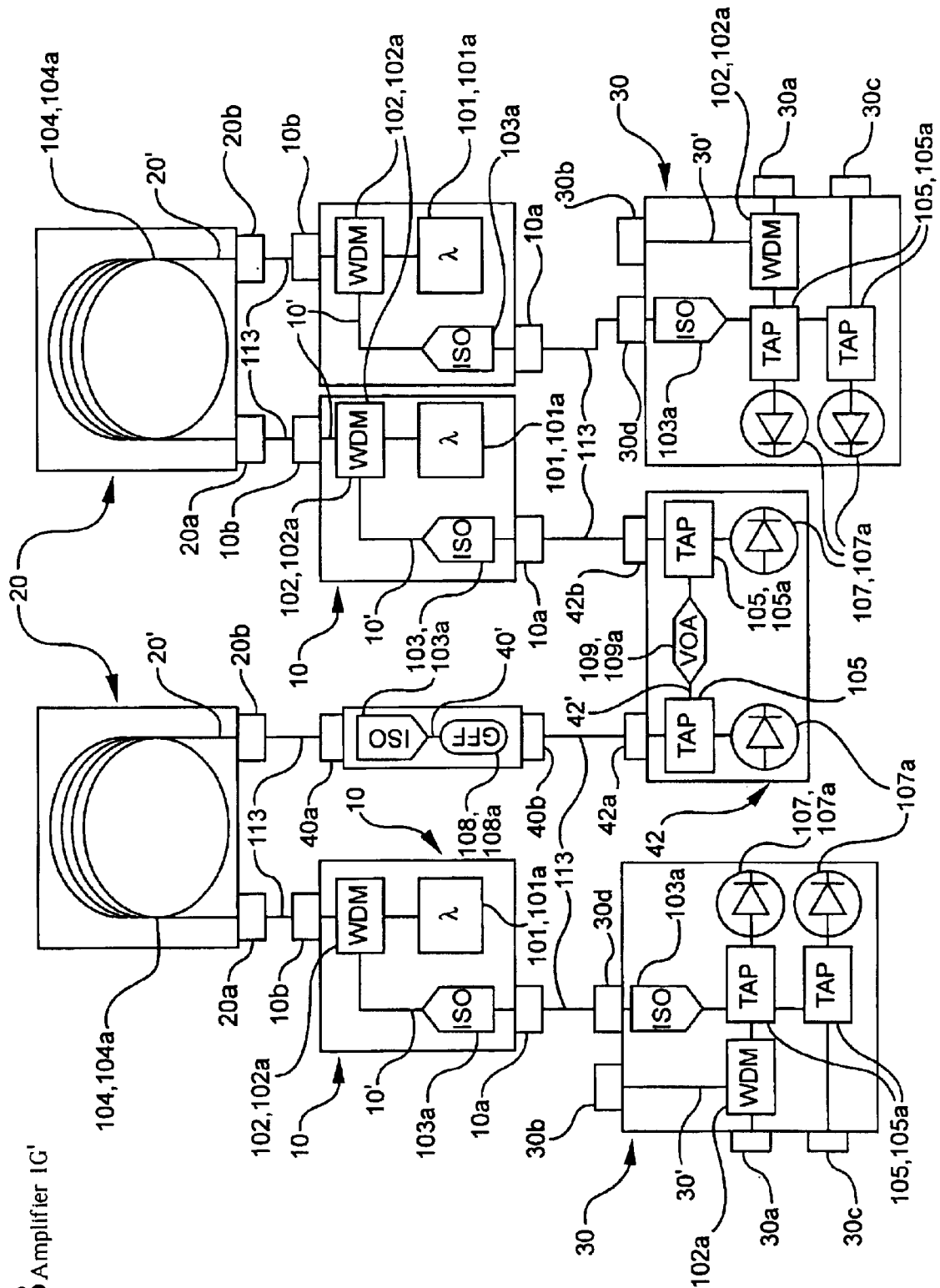
FIG. 8B Amplifier 1G'

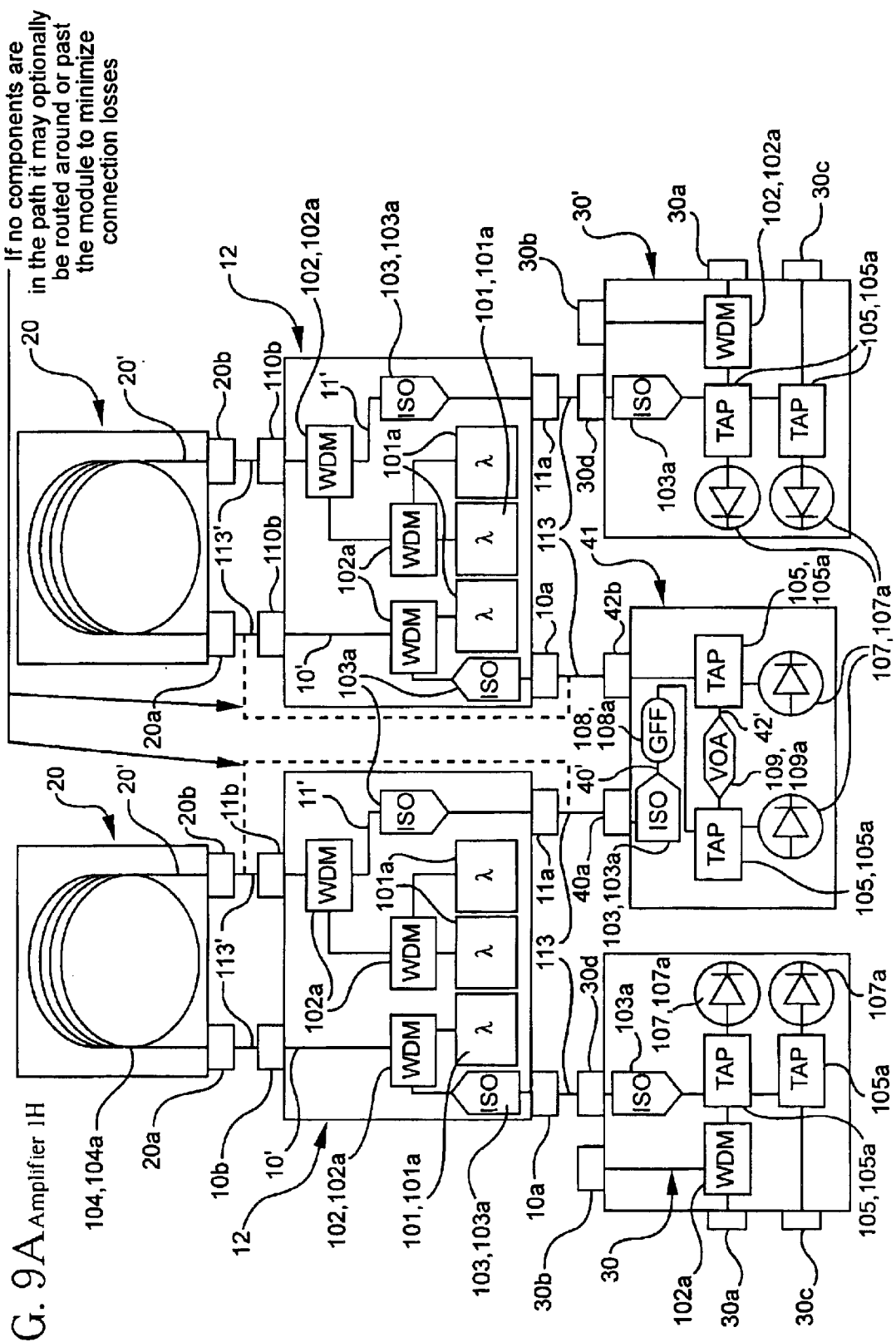
FIG. 9A Amplifier 1H

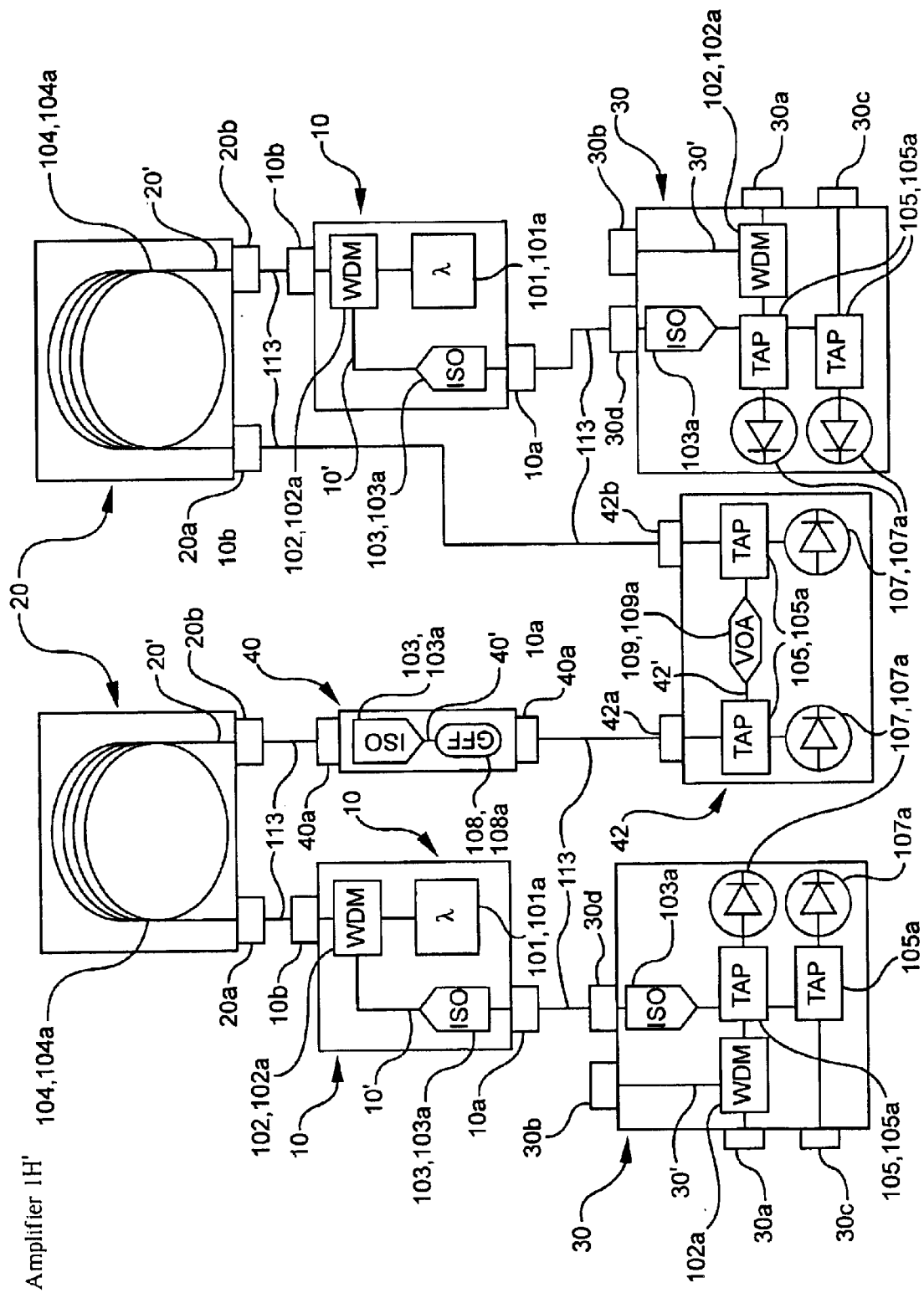
FIG. 9B Amplifier 1H'

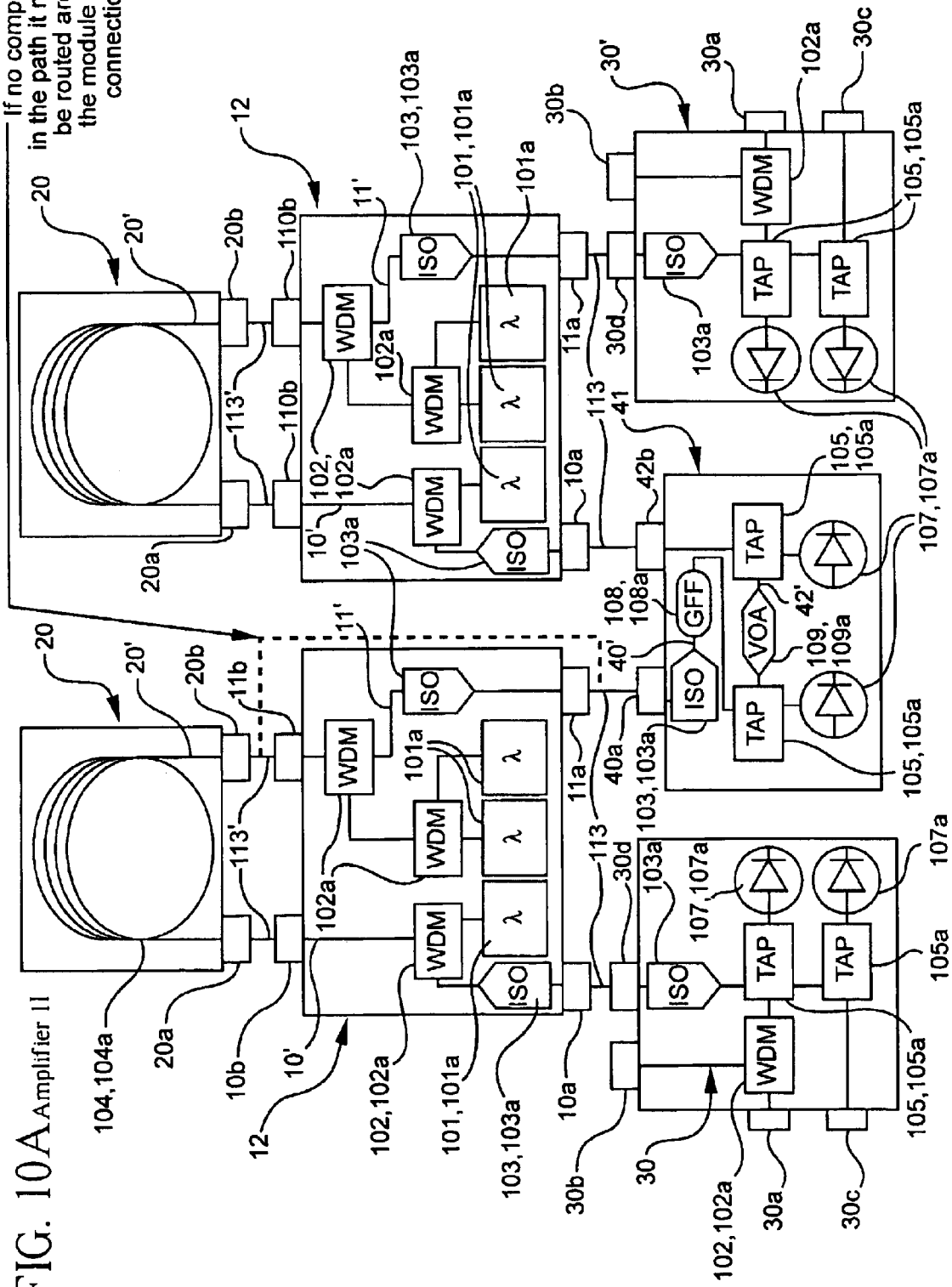
FIG. 10A Amplifier II

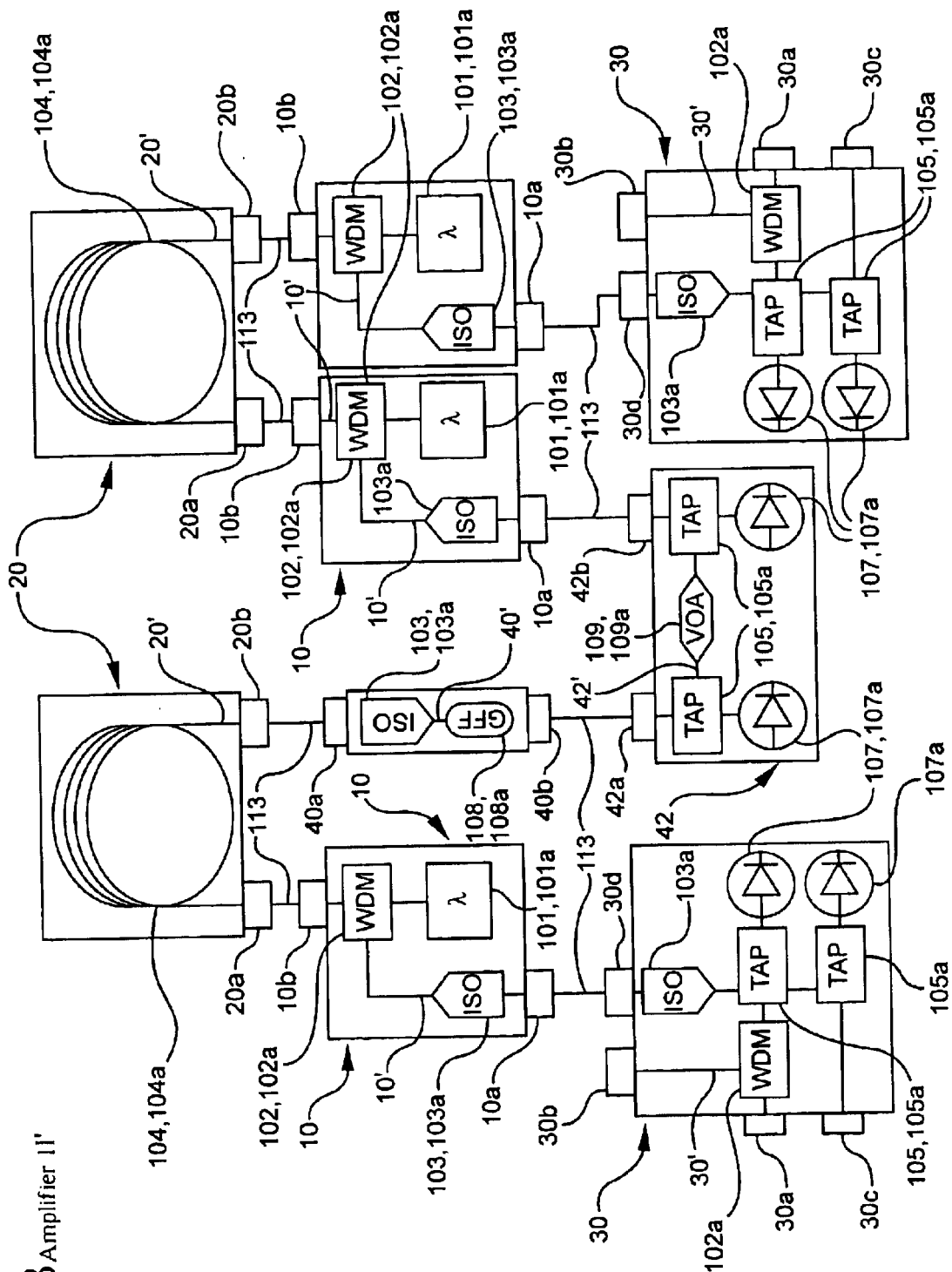
FIG. 10B Amplifier II'

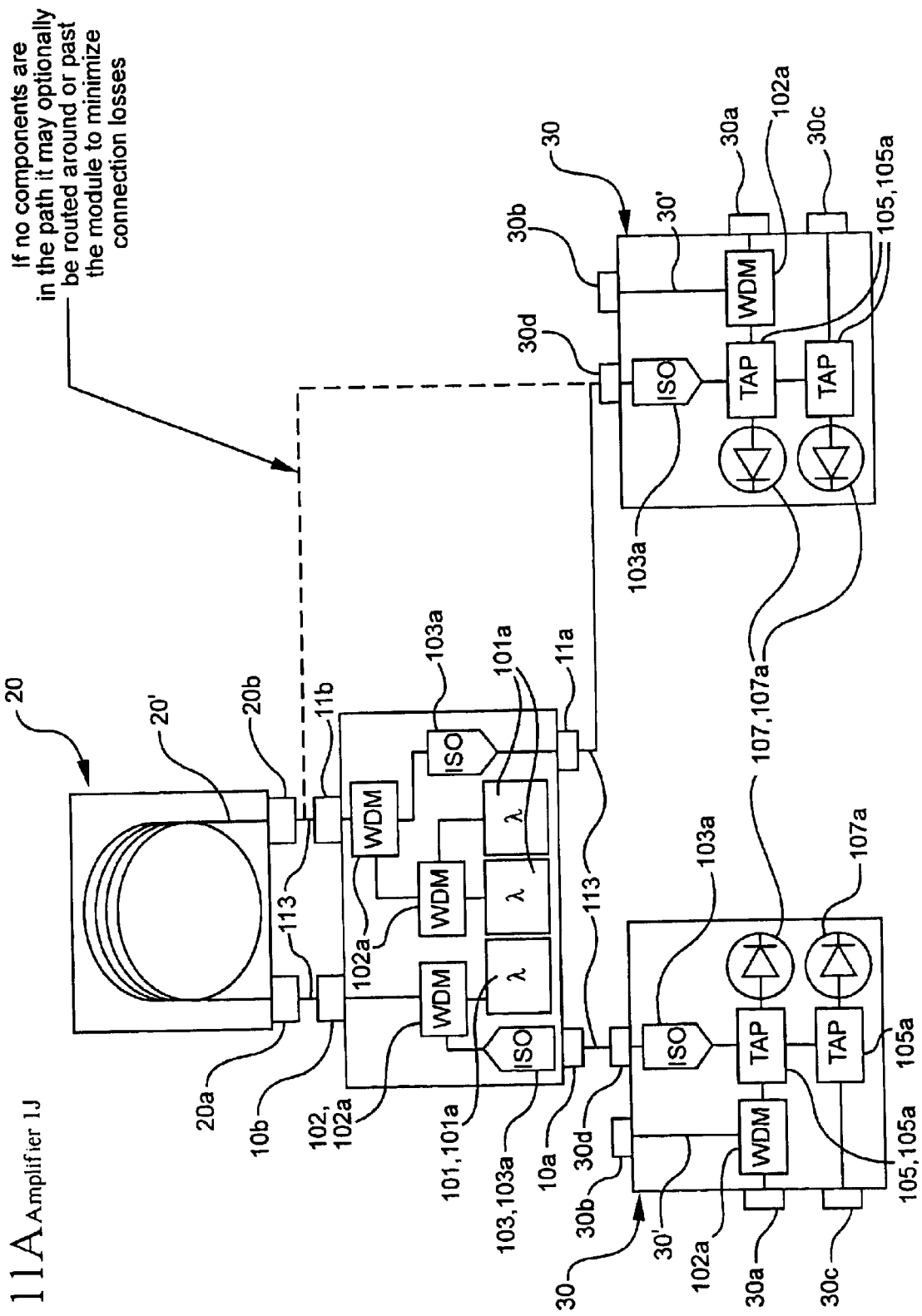
FIG. 11A Amplifier 1J

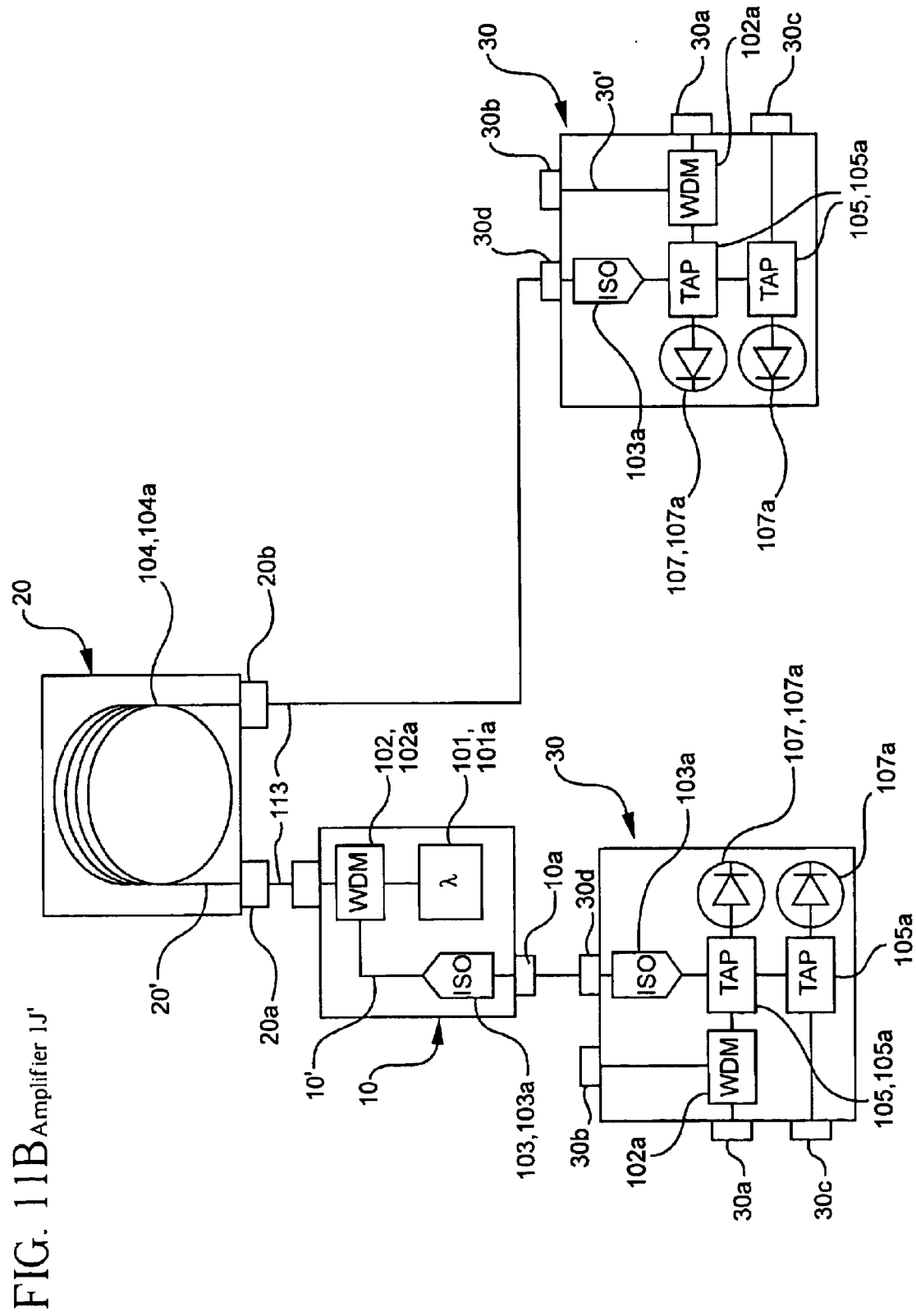
FIG. 11B Amplifier 1J'

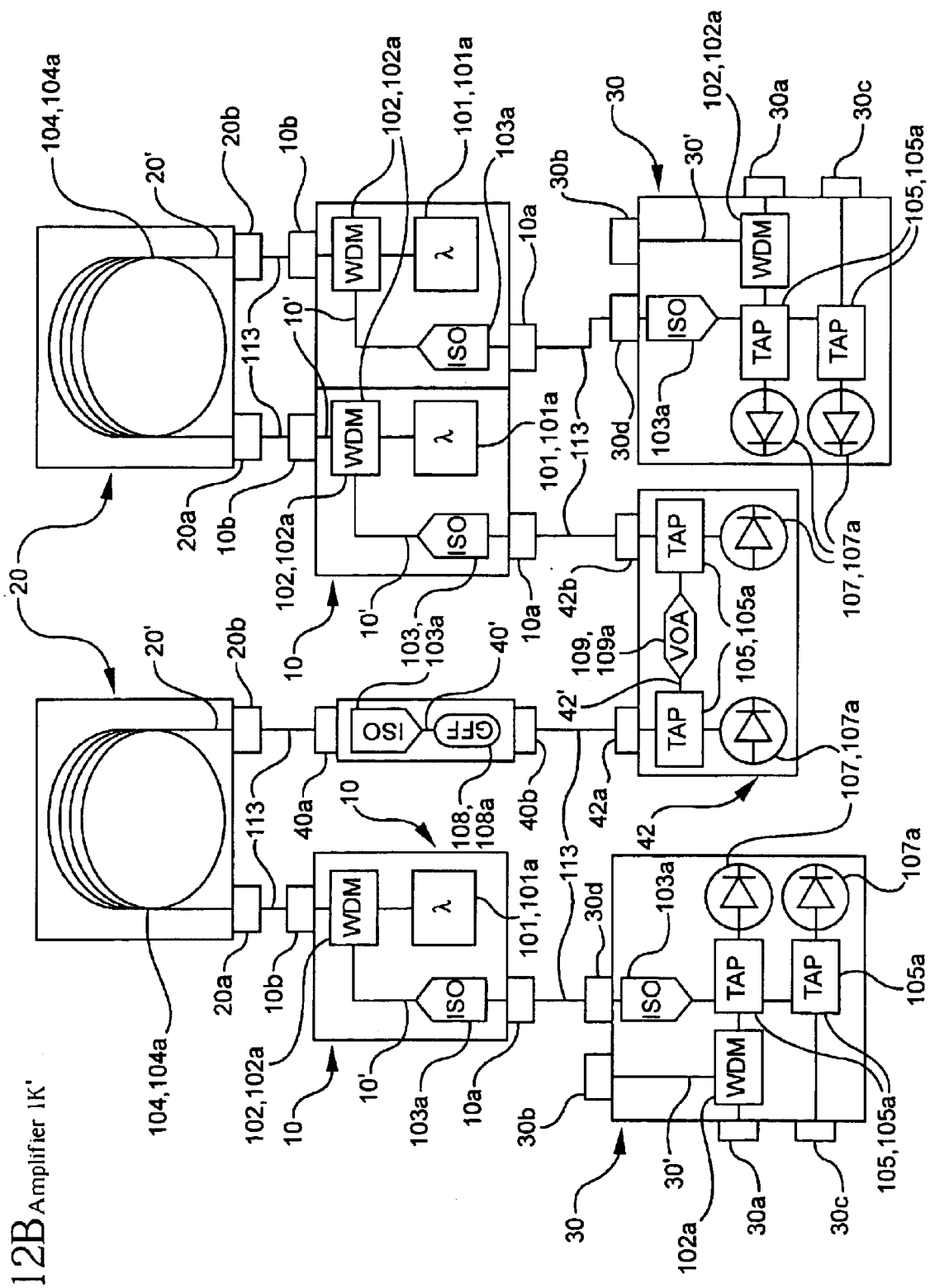
FIG. 12B Amplifier 1K'

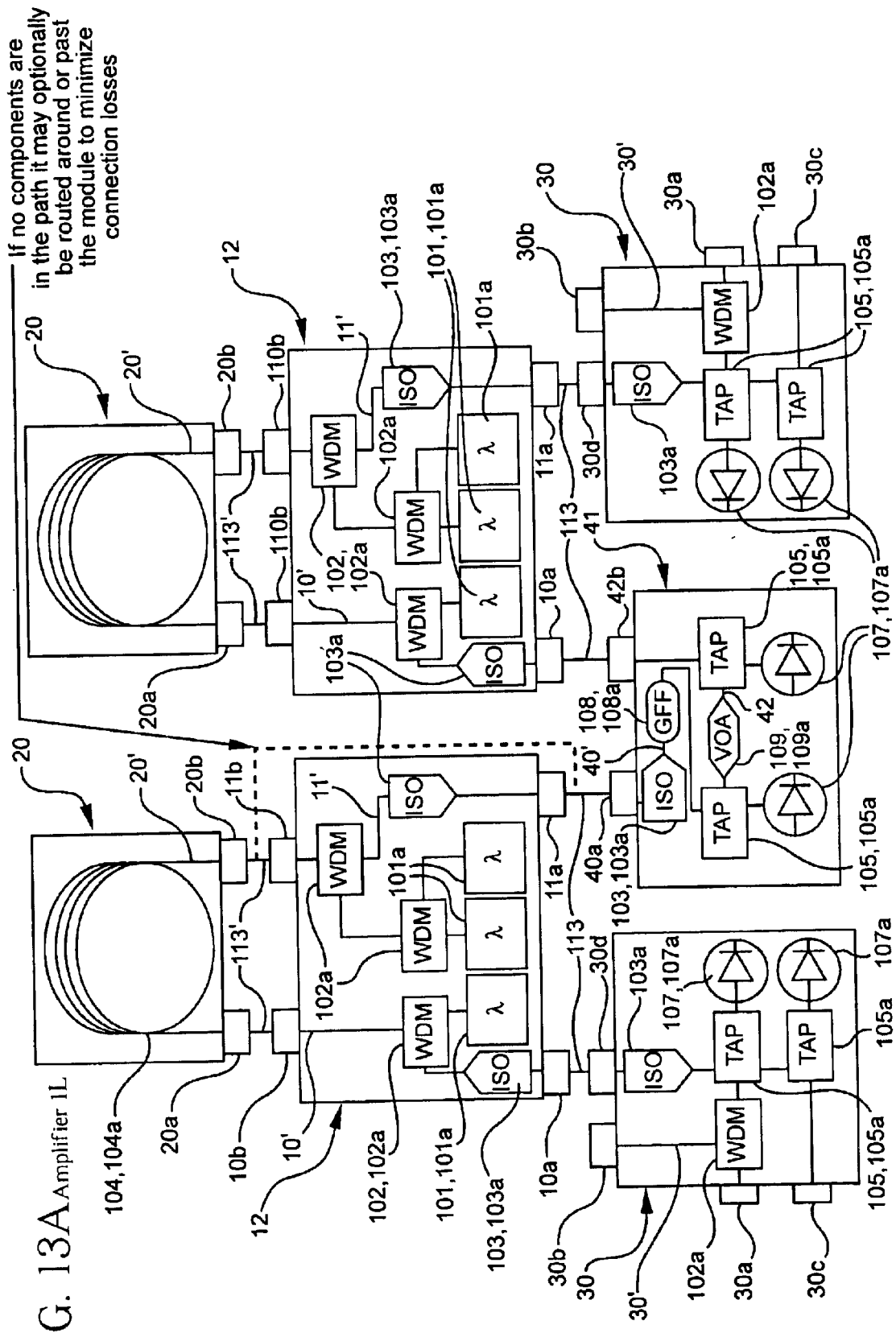
FIG. 13A Amplifier 1L

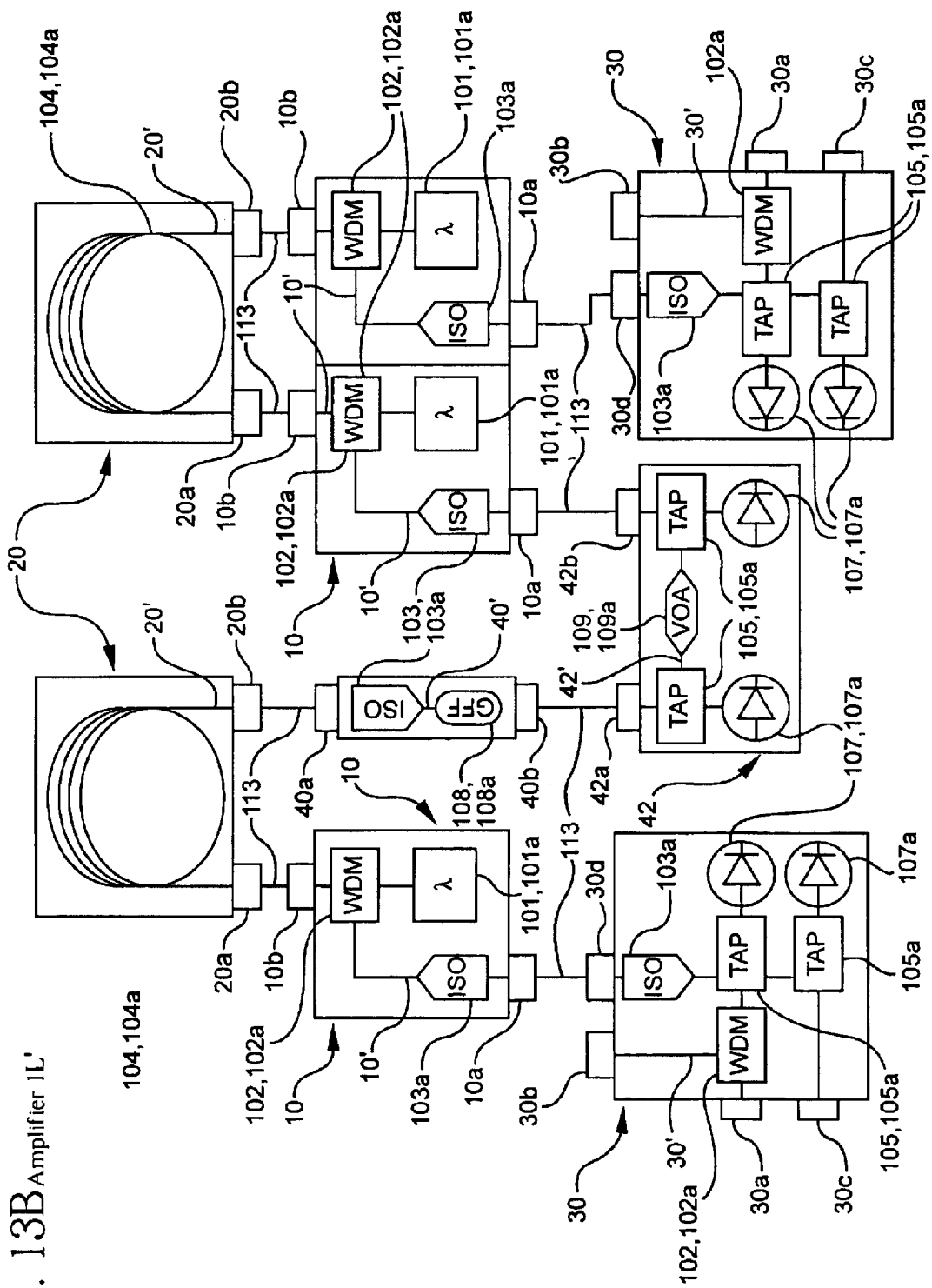
FIG. 13B Amplifier 1L'

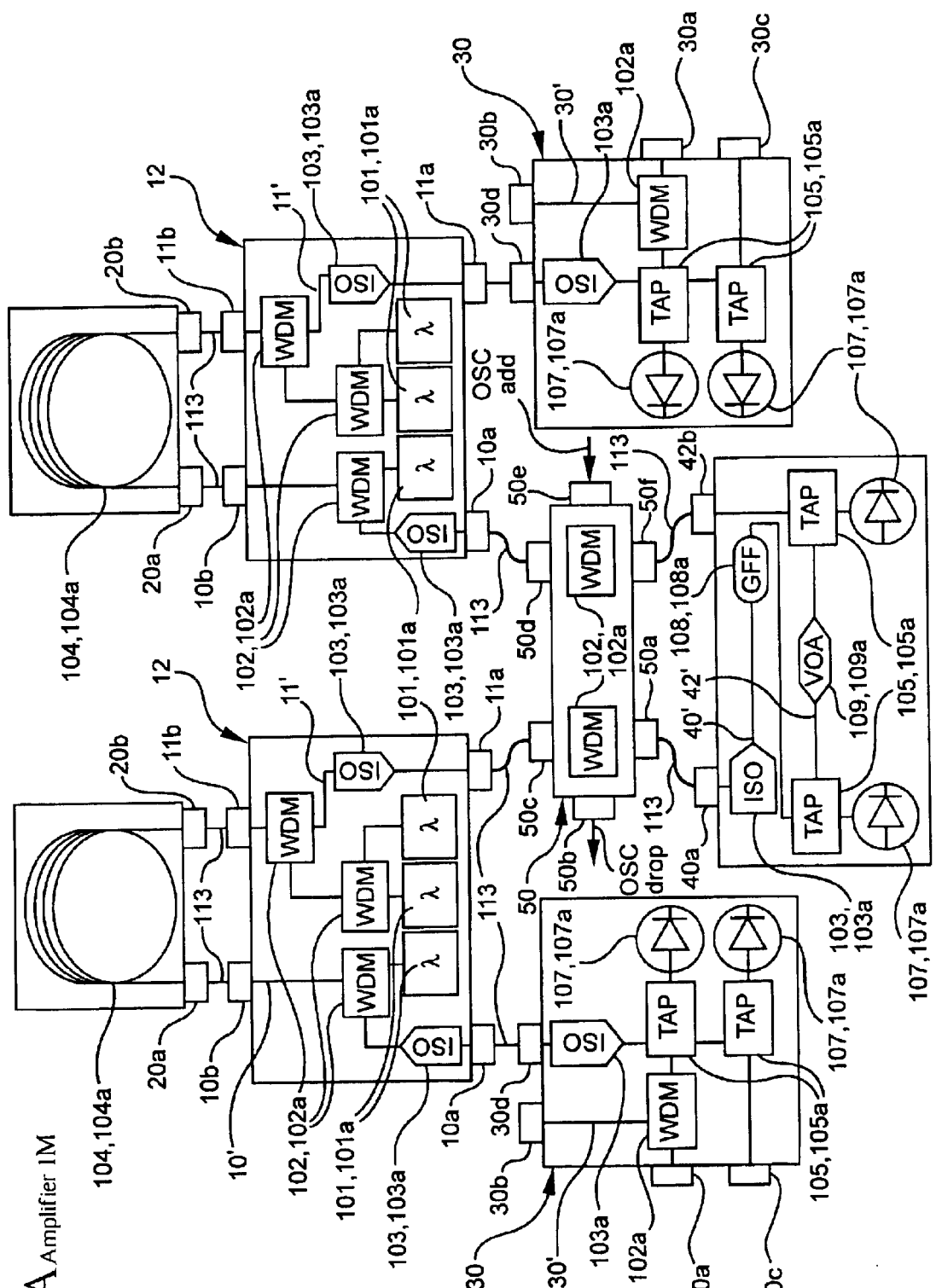
FIG. 14A Amplifier 1M

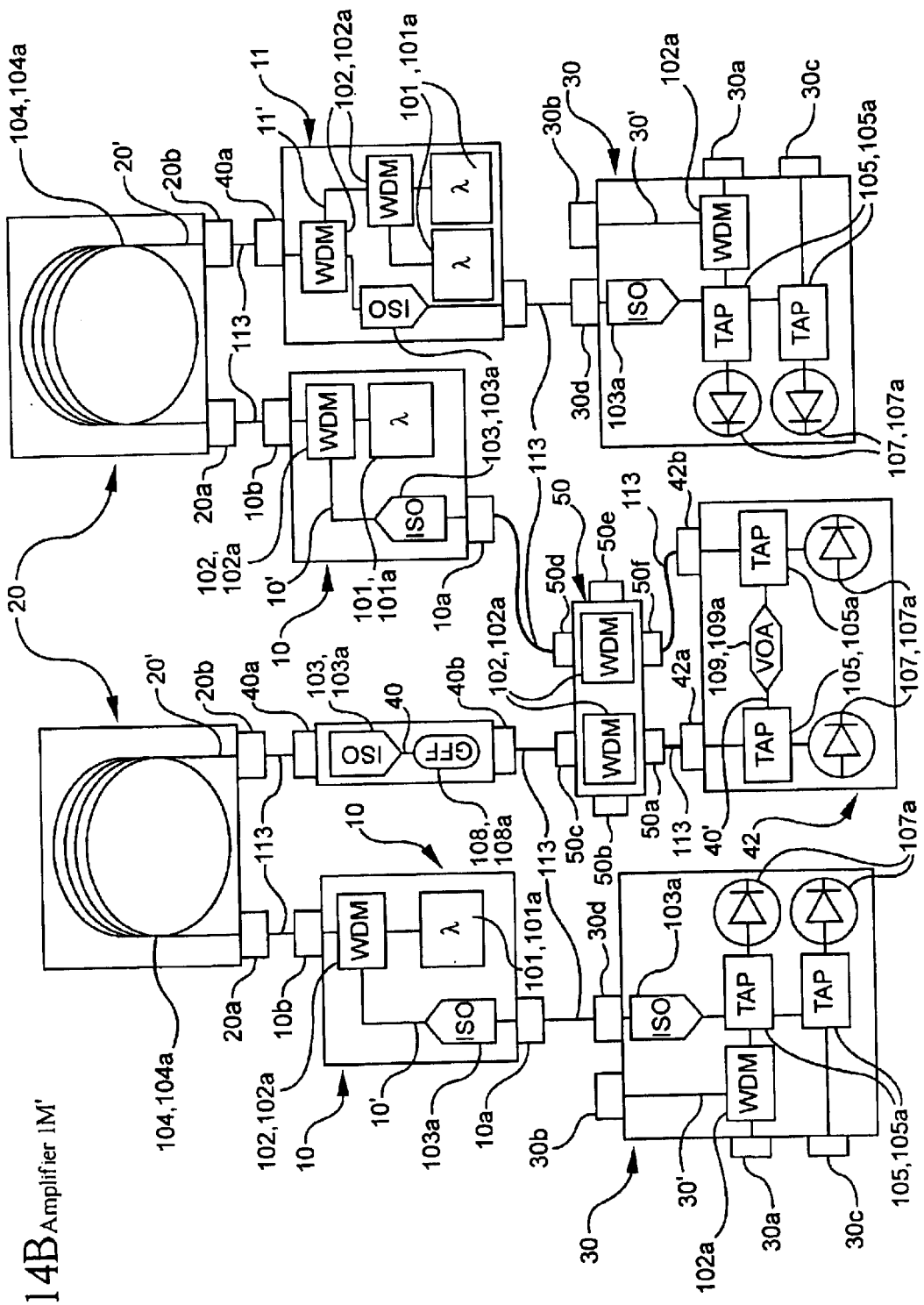
FIG. 14B Amplifier 1M'

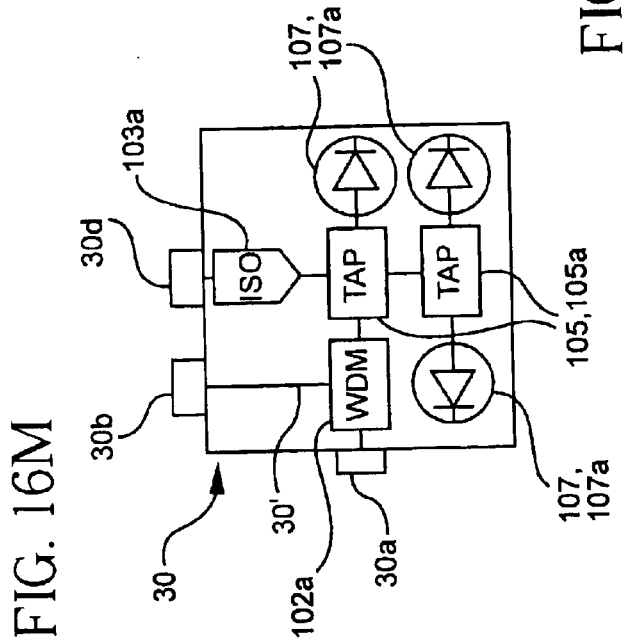
FIG. 16M
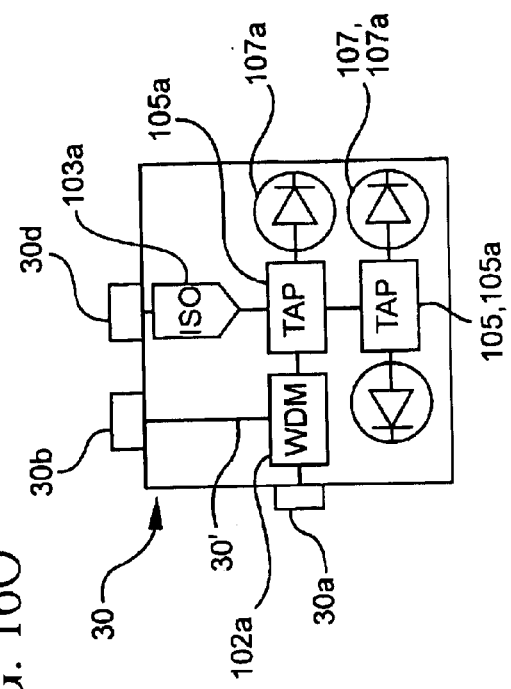
FIG. 16N
FIG. 16O

Fusion splices

Mechanical splices
M=Male connector, F=Female connector

Pigtail jumper

Module — Module
First — Second

Lenses / collimators (C=Collimator)

Fiber-to-fiber (not touching)

Planar Waveguide (not touching)

OPTICAL AMPLIFICATION MODULE

BACKGROUND OF THE INVENTION

1. Field of the Invention

The present invention relates to optical fiber telecommunication systems and, in particular, to the optical amplification modules utilized in optical amplifiers employed in such systems.

2. Technical Background

Presently, optical amplifiers for telecommunication networks are uniquely designed to meet specific customer needs in specific customer applications, according to the amplifier's role in each customer's proprietary system. There is very little commonality of either the optical designs or the physical embodiments between different amplifiers manufactured for either different customers and or different applications.

Custom design efforts add significant time and cost to the development of each amplifier. In addition, custom designs prevent achievement of efficient manufacturing scale, because only relatively few amplifiers of the same design are sold to each customer. The custom design approach also creates an inventory risk, as unsold product for one customer/application cannot be sold to another. Finally, custom designed amplifiers hinder future upgrade capability and hardware reuse.

U.S. Pat. No. 5,778,132 discloses a three "cassette" modular approach to assembly of optical amplifiers. The first cassette (first module) contains a first coil of rare earth doped optical fiber, an optical tap, an optical isolator and a wavelength division multiplexer (WDM). The second cassette (second module) contains an isolator and a WDM. The third cassette contains a second coil of rare earth doped optical fiber, a WDM, an isolator, and an optical tap. The laser sources are provided externally. The modular design approach disclosed in this patent has several shortcomings.

While this partitioning into three cassettes allows the disclosed optical amplifier to be manufactured, the three cassettes are of limited use in that they cannot be recombined to create many of today's more complex amplifiers. The disclosed partitioning of the amplifier into three cassettes does not constitute fundamental building blocks that would have wide commercial use. Furthermore, the specific cassette content does not include other components necessary for many currently available amplifier designs. For example: (a) the inclusion of the rare earth doped optical fiber in with the first and third cassettes does not allow for the manufacture of a complete, single coil amplifier; (b) the cassettes do not allow for gain flattening filters (GFFs) or variable optical attenuators (VOAs); and (c) the number and location of the bandsplitters are constrained, yet they are not always present or always present in the same configuration in commercial optical amplifiers.

Second, the cassettes are not designed to be effectively integrated. For example, the laser sources are provided externally, with no allowance for cost-effective integration of the laser sources into the cassettes.

SUMMARY OF THE INVENTION

According to one aspect of the present invention an amplification module comprises a housing containing a plurality of optical ports. The housing: (i) at least partially encloses at least one amplification medium, (ii) provides at least one position for at least one optical filter, and (iii) includes, a first optical port configured to provide both signal and pump light to the amplification module.

According to one embodiment of the present invention an amplification module comprises a housing containing a plurality of optical ports. The amplification module does not include a WDM for multiplexing pump light and signal light. The housing (i) has a pump interconnection port, (ii) at least partially encloses at least one amplification medium, and (iii) provides at least one position for an additional optical filter.

According to another embodiment of the present invention an amplification module includes a housing containing a plurality of optical ports. At least one of these optical ports is configured to provide both signal and pump light to the amplification module. The housing at least partially encloses at least one amplification medium and provides at least one position for a wavelength combiner/separator.

BRIEF DESCRIPTION OF THE DRAWINGS

The drawings provided illustrate, schematically, numerous embodiments of the present invention. The drawings are provided for further understanding, and are meant to be exemplary in nature, and not exhaustive.

FIGS. 1a, 1b, 1c illustrate, schematically, three embodiments of an Optical Power Supply module. FIGS. 1k, 1l, 1m, 1n illustrate, schematically, additional embodiments of an Optical Power Supply module.

FIG. 2 illustrates, schematically, a first embodiment of a first optical amplifier, comprised of a first Optical Power Supply module, optically connected to a first Amplification module 20.

FIG. 3 illustrates, schematically, a second embodiment of a second optical amplifier. The optical amplifier of the second embodiment comprises a first Optical Power Supply first module, optically connected to a first Amplification module, further optically connected to a first Monitoring and Access module.

FIGS. 4 through 14 illustrate, schematically, other embodiments of optical amplifiers, each comprised of unique combinations of configurable amplifier modules.

DETAILED DESCRIPTION OF THE PREFERRED EMBODIMENTS

Optical amplifiers for telecommunication networks are typically uniquely designed to meet specific customer needs in specific customer applications, according to the amplifier's role in each customer's proprietary system. There is very little commonality of either the optical designs or the physical embodiments between different amplifiers manufactured for either different customers and or different applications. Custom design efforts add significant time and cost to the development of each product, and prevent efficient manufacturing scale from being achieved. Custom designs also create inventory risk, as unsold product for one customer/application cannot be sold to another. Finally, custom designed amplifiers hinder future upgrade capability and hardware reuse.

It is therefore desirable to simplify the design and manufacture of optical amplifiers by identifying the minimum, common "building blocks", that could be used to make a wide variety of optical amplifiers 1. As used herein, the term "modules" means the building blocks. Several examples of such building blocks or modules are illustrated in FIGS. 1a–1j. According to an embodiment of the present invention, this approach requires the definition of a top level, fully operable total optical amplifier circuit which includes all the desired amplifier features. An optical amplifier circuit is defined as a collection of optical and electro-optic components, and light paths traversing between and through, to, and from these optical and electro-optic components. This total optical amplifier circuit is subsequently partitioned into commonly utilized, smaller optical circuits 10', 11', 20', 30', 31', 40', 41', 50', that can be incorporated into amplifier modules 10, 11, 12, 20, 30, 31, 40, 41, 42 and 50, shown in FIGS. 1a–1j. These modules can be efficiently manufactured and combined to create a variety amplifiers 1, as shown in FIGS. 2–14b. Each amplifier module performs a specific function, or set of functions, and can interact with other modules.

Variety in features within each module is accomplished by selective configuration of the modules. That is, each module is designed to be configurable. That is, the modules have optical circuits that are designed to optionally allow the inclusion or exclusion of certain optical, opto-electrical, and electronic components during manufacturing, without design changes. The manufactured modules are operable with or without the optional components. Examples of how the modules 10, 11, 12, 20, 30, 31, 40, 41, 42, 50 can be selectively configured in order to achieve specific module and optical circuit features are shown schematically In FIGS. 15–17, and are described in detail below.

Used together, unique combination of common, yet configurable, optical amplifier modules allows for the manufacture of a wide variety of commercially available optical amplifiers as illustrated schematically in FIGS. 5–14, and described in detail below.

Figure 1B:
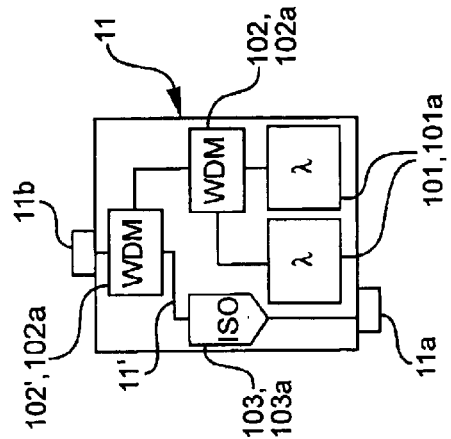
Figure 1A:
FIGS. 1a–1n illustrate schematically a plurality of amplifier modules. More specifically.

FIG. 1a illustrates, schematically, a first embodiment of an Optical Power Supply module 10, including a Optical Power Supply optical circuit 10'. This optical circuit 10' includes a first light source 101' having a first wavelength $\lambda_1$, a first bidirectional light combiner/separator 102' optically connected to the light source 101', and a directional optical attenuator 103' optically connected to the bidirectional light combiner/separator 102'. A light source 101' is an electro-optical device that generates optical radiation, that radiation having a wavelength known to cause amplification in rare earth doped optical medium, such as optical fiber. A bidirectional light combiner/separator 102' is an optical device that combines two or more light paths. Conversely, the same device, allowing light to pass in the reverse direction, can separate light into two or more light paths. Such separation can be according to wavelength, as in a wavelength division multiplexer, or according to polarization, as in a polarization combiner. An example of such an optical device is wavelength division multiplexer (WDM) 102. A directional optical attenuator 103' is an optical device that can function only as a one-way optical filter. An example of such an optical device is an optical isolator 103. In this and all other illustrations, the direction of passing-through light is indicated by the pointed end of the figure symbolizing the optical isolator 103. Furthermore, it is understood that the orientation of this optical component may be optionally reversed in the optical circuit in order to accomplish the same function in the opposite direction.

In this embodiment, the first light source 101' is a laser source 101, having a wavelength of approximately 960 nm, 980 nm or 1480 nm. Such pump laser sources are available, for example, from Corning Lasertron, located in Bedford, Mass. Optical laser sources of other wavelengths may also be utilized. In this embodiment, the first bidirectional light combiner/separator 102' is wavelength division multiplexer 102 (WDM), and the directional optical attenuator 103' is optical isolator 103. Other optical components with the same or similar function can be substituted for laser source 101, wavelength division multiplexer 102 (WDM), and optical isolator 103. WDMs are available, for example, from Corning Incorporated, located in Corning, N.Y.

The isolator 103 is optically connected to optical port 10a, and the wavelength division multiplexer 102 is connected to optical port 10b. An optical port provides a connection path for optical communication. More specifically, an optical port in a module provides external optical access to the optical circuit of the module. Such optical access allows for connection between optical circuits of two connected modules. Examples of optical ports include the input/output surface of a waveguide, such as end faces of optical fiber pigtails. Other optical ports may include apertures, input/output surfaces of a planar waveguide, lenses or mirrors facing the outside of the module.

FIG. 1b illustrates a second embodiment of an Optical Power Supply module 11. The second embodiment of the Optical Power Supply module is similar to the Optical Power Supply module 10 described in FIG. 1a, but has an optical circuit 11' that includes two laser sources 101 optically connected to a second wavelength division multiplexer 102. The second wavelength division multiplexer 102 is optically connected to the first wavelength division multiplexer 102, and to optical port 11b. Both laser sources are of a wavelength known to cause amplification in rare-earth doped optical fiber, and may provide a laser source wavelength of, for example, approximately 980 nm or 1480 nm. It is known that the laser source wavelength may vary, due to manufacturing tolerances, by ±5 nm, and preferably by less than ±1 nm, and most preferably by ±0.5 nm or less. The first wavelength division multiplexer 102, is optically connected to the isolator 103. The isolator 103 is optically connected to optical port 11a.

Figure 1C:
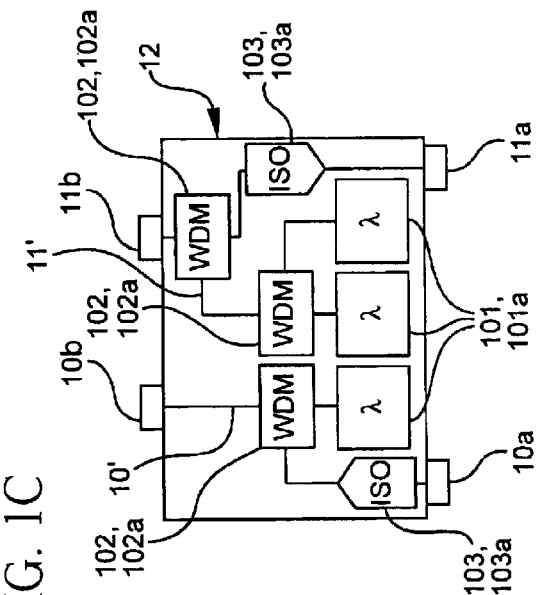

FIG. 1c illustrates a third embodiment of an Optical Power Supply module 12. The Optical Power Supply module 12 is similar to the Optical Power Supply modules 10 and 11 shown in FIGS. 1a and 1b. Optical Power Supply module 12 includes the optical circuits 10' and 11' shown in FIGS. 1a and 1b. The optical circuit 10' possesses independent optical ports 10a and 10b from the optical circuit 11', yet both are contained in the same module 12.

Figure 1E:
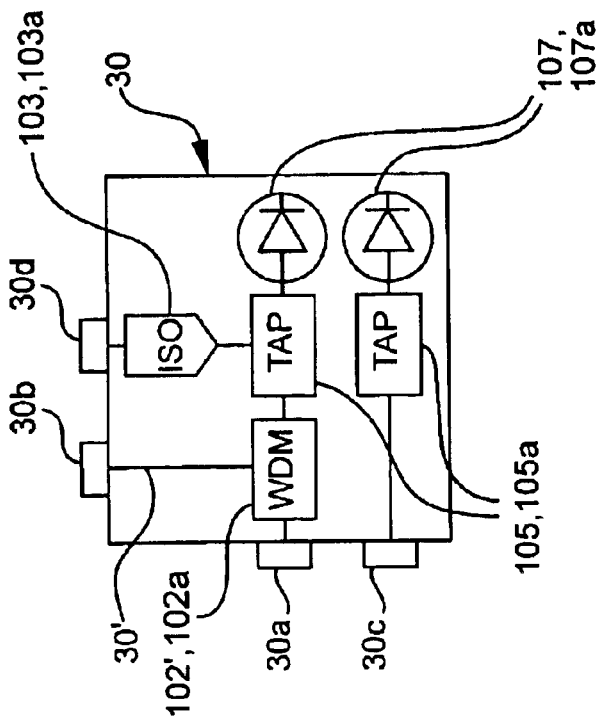
FIGS. 1e and 1f illustrate, schematically, embodiments of Monitoring and Access modules.
Figure 1D:
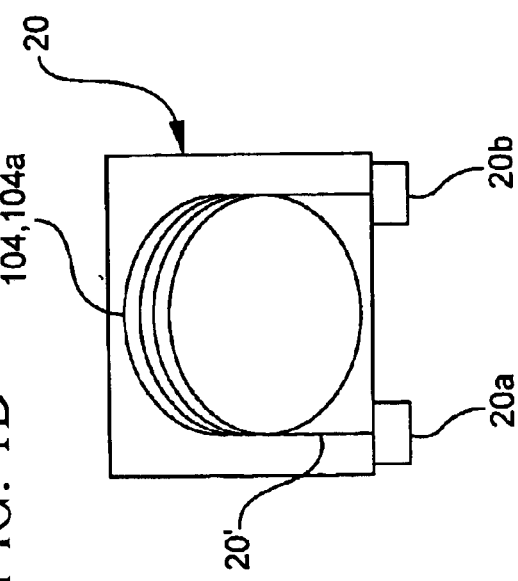
FIG. 1d illustrates, schematically, an embodiment of an Amplification module.

FIG. 1d illustrates, schematically, one embodiment of Amplification module 20. The optical circuit 20' includes an amplification medium 104' optically connected to two optical ports 20a, 20b. In this embodiment, the amplification medium 104' is a coil of rare earth doped fiber 104. More specifically, in this embodiment, the optical fiber is doped with erbium. Other optical components with the same or similar function can be substituted for the optical fiber 104. For example, a planar waveguide gain medium may also be utilized.

FIG. 1e illustrates, schematically, a first embodiment of a Monitoring and Access module 30, including a Monitoring and Access optical circuit 30', including a wavelength division multiplexer 102, optically connected to two optical ports 30a, 30b. The wavelength division multiplexer 102 is further optically connected to a first optical tap 105'. The optical tap 105' is further optically connected to an optical isolator 103, and to a second, optical tap 105'. In this embodiment, the first optical tap 105' is a three port optical tap coupler 105, and the second optical tap 105' is a four port optical tap coupler 105, which are each, in turn, connected to an associated optical sensor 107'. The three port optical tap 105 is further optically connected to an optical port 30c, and the isolator 102 is optically connected to an optical port 30d.

An optical tap 105' is an optical device whose function is to separate light according to predetermined optical power ratios, predominantly independent of wavelength or polarization. An example of such a device is a multiclad or fused biconic taper coupler. These couplers are available, for example, from Corning Incorporated, of Corning N.Y.

An optical sensor 107' is an opto-electronic device with a light sensitive material that provides electrical signal output that indicates the power of the light incident on this device. An example of an optical sensor is a photodiode, or a photodiode with further electronic signal modification.

In this embodiment, the optical sensor 107' is a photodiode 107. Other optical components with the same or similar function can be substituted for the taps 105, and photodiode 107. For example, the taps could be micro-optic taps or planar waveguide taps, available, for example, from JDS Uniphase Corporation, of San Jose, Calif. The photodiode 107 may include a photodiode with a integrated electronics for electronic signal processing. Such photodiodes are available, for example, from Epitaxx Inc, West Trenton, N.J. Integrated optical taps, incorporating a photodiode, are available, for example, from DiCon Fiberoptics Inc, Berkeley, Calif.

Figure 1G:
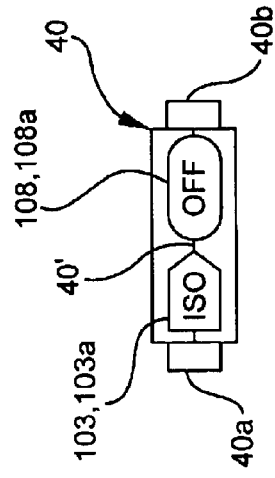
FIGS. 1g, 1h, and 1i illustrate, schematically, three embodiments of an Optical Processing module.
Figure 1H:
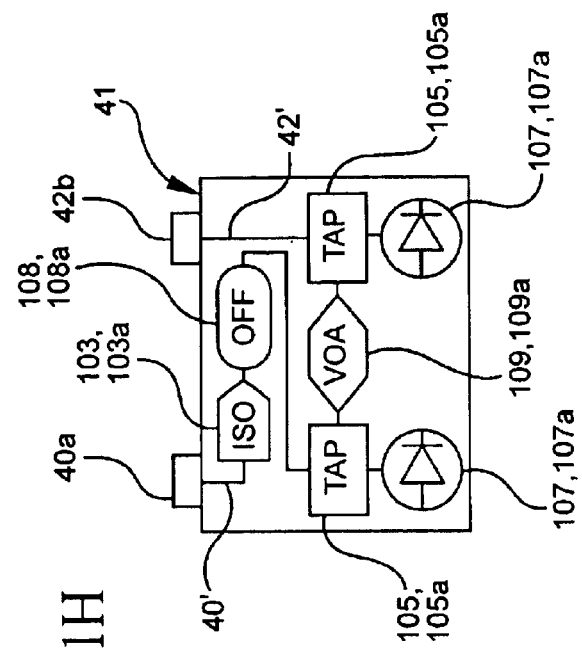
Figure 1F:
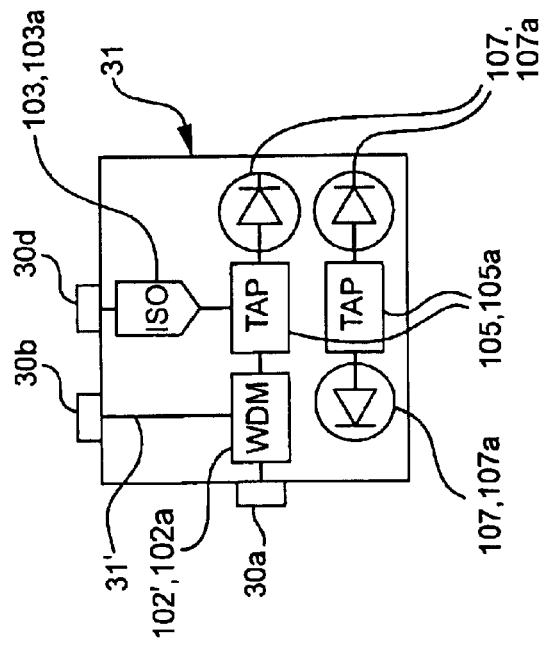

FIG. 1f illustrates a second embodiment of a Monitoring and Access module 30. This second embodiment of a Monitoring and Access module 30 includes an optical circuit 31' similar to the optical circuit 30' described in FIG. 1e, but configured to include an additional photodiode 107 instead of an optical port 30c.

FIG. 1g illustrates, schematically, one embodiment of an Optical Processing module 40, including the Optical Processing optical circuit 40', comprising an optical isolator 103, optically connected to a first optical port 40a and a light filter 108'. The light filter 108' is further optically connected to a second optical port 40b.

A light filter 108', 109' is an optical device that provides light attenuation in at least one direction-i.e., it attenuates light that passes from the filter input to the filter output. The filtering strength, and the wavelength dependence and/or or polarization dependence of the filtering effect is determined by the type of filter employed. The filter may alternatively be a wavelength dependent filter, or predominantly wavelength independent filter. The light filter, whether of a wavelength dependent nature, or of a wavelength independent nature, may also be of a fixed nature, a settable nature, or of a dynamically adjustable nature. A wavelength dependent filter is a filter that transmits and/or reflects light based on light's wavelength. A predominately wavelength independent filter is a filter that reduces the intensity of incident light substantially equally across the wavelengths of interest. An example of such a filter is a VOA or a neutral density filter.

A filter of a fixed nature is a filter that has pre-determined, known, and non-adjustable filtering characteristics. These include, for example, a fixed gain flattening filter.

A slope adjusting filter is a filter with a wavelength dependent attenuation that can provide adjustment of the slope of the wavelength dependence of attenuation with wavelength $(dL(\lambda)/d\lambda$, where $L(\lambda)$ is Loss as a function of wavelength, and $\lambda$ is wavelength).

An example of a fixed, predominantly wavelength independent light filter device is a neutral density filter, or a fixed attenuator, available, for example, from RIFOCS Corp, of Camarillo, Calif.

A filter of a settable nature has adjustable filtering characteristics, but is implemented in such a way as to allow final adjustment at the time of manufacture, and is not intended for dynamic adjustment following manufacture. An example of a settable, predominantly wavelength independent light filter device is a mechanically tuned variable optical attenuator, tuned with a set-screw, available, for example, from JDS Uniphase Corporation of San Jose, Calif. as model number MV 50.

A filter of a dynamically adjustable nature has adjustable filtering characteristics, and is implemented in such a way as to allow active modulation of the filtering characteristics in situ based on a dynamically changing control system. An example of a dynamically adjustable, wavelength dependent light filter device is a dynamic gain flattening filter. Such a filter is available, for example, from Corning Incorporated, of Corning, N.Y. Such a filter may also be a dynamic slope-adjusting filter driven by a control circuit. Such dynamic slope adjusting filters are available, for example, from Coadna Photonics Inc., of San Jose, Calif. An example of a dynamically adjustable, predominantly wavelength independent light filter device is a variable optical attenuator driven by a control circuit. Such a variable optical attenuator is available, for example, from Corning Incorporated, of Corning, N.Y.

In this embodiment, the light filter 108' is gain flattening filter (GFF) 108. Other optical components with the same or similar function can be substituted for the gain flattening filter 108. For example, the light filter 108' could be a thin film dielectric filter-based gain flattening filter operating in transmission or reflection. Such a filter could also be a fiber Bragg grating-based gain flattening filter operating in transmission or reflection available. Alternatively, a long period fiber Bragg grating-based gain flattening filter may also be utilized. Alternatively, fiber evanescent coupler-based gain flattening filter may also be used. Such filters are available, for example, ITF Optical Technologies of Montreal, Canada.

FIG. 1h illustrates, schematically, a second embodiment of an Optical Processing module 41. This second embodiment of an Optical Processing module 41 includes the optical circuits 40' and 42', as illustrated in FIGS. 1g and 1i. However, the optical circuit 40' is optically connected to the optical circuit 42' between the gain flattening filter 108 and the first three port optical tap 105. This first optical tap 105 is connected directly to the GFF 108.

FIG. 1i illustrates, schematically, a third embodiment of an Optical Processing module 42, including the Optical Processing optical circuit 42'. The Optical Processing optical circuit 42' comprises a first, three port optical tap 105 optically connected to optical port 42a, a first photodiode 107, and a light filter 109'. In this embodiment, the light filter 109' is a variable optical attenuator (VOA) 109. The VOA 109 is further optically connected to a second, three port optical tap 105. The second three port optical tap 105 is further optically connected to a second photodiode 107 and a second optical port 42b. Other optical components with the same or similar function can be substituted for the variable optical attenuator 109. The optical amplifier may also utilize a Telemetry Drop/Add module 50. The exemplary Telemetry Drop/Add module 50 is illustrated schematically in FIG. 1j and includes two locations 102a for wavelength division multiplexer (WDM) components. Either one or both of these locations 102a may be receive a WDM at the manufacturing stage. For example, the Telemetry Add/Drop module 50 of FIG. 1j comprises two wavelength division multiplexers 102, each optically connected to three optical ports 50a–c and 50d–f.

Figure 1J:
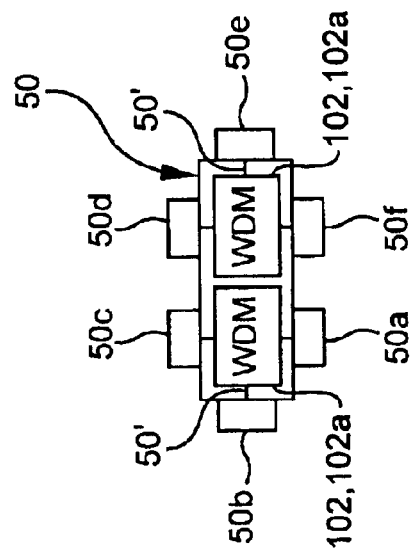
FIG. 1j illustrates, schematically, an embodiment of a Telemetry Add/Drop module.
Figure 1I:
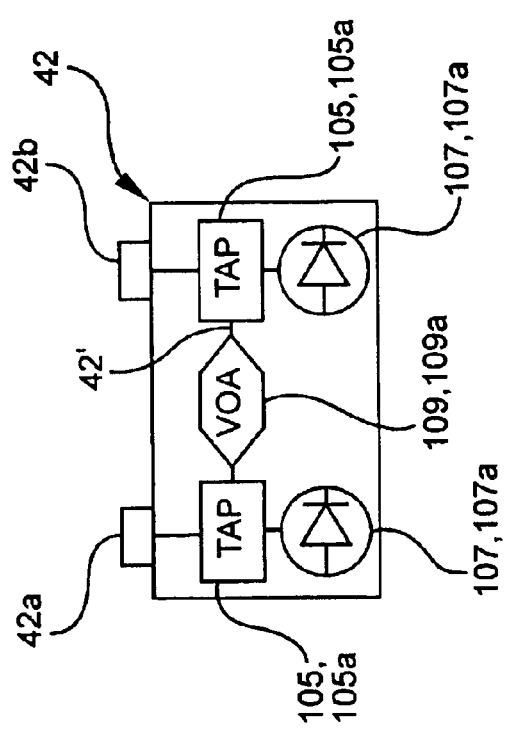
Figure 1L:
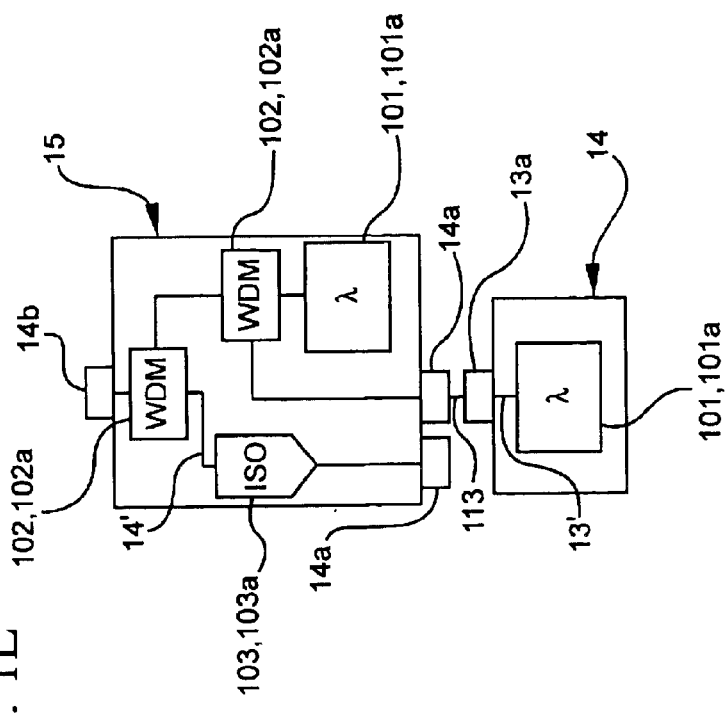
Figure 1K:
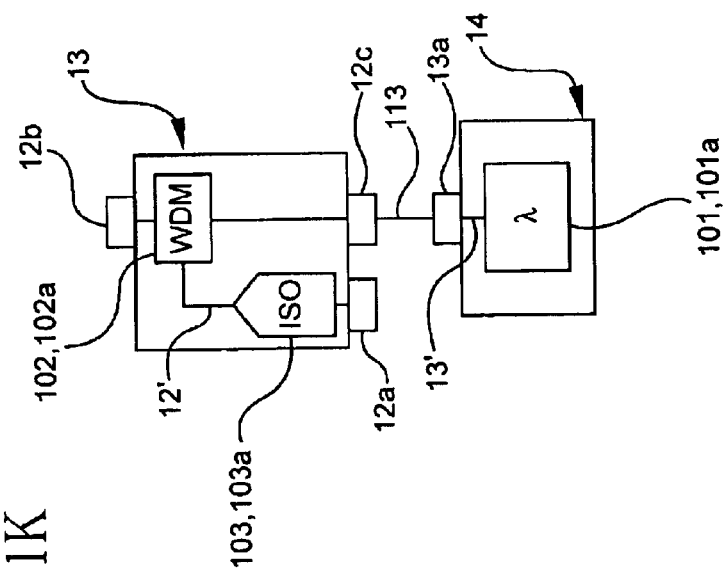

FIG. 1k illustrates, schematically a fourth embodiment of an Optical Power Supply module 13, including a Optical Power Supply optical circuit 12'. Optical Power Supply module 13, is similar to the Optical Power Supply module illustrated in FIG. 1a, except that Optical Power Supply module 15 utilizes one external pump laser source 101, instead of an internal laser source 101. Thus, optical circuit 12' includes an optical signal port 12a that provides a connection to an external optical pump source 101 that forms a part of the optical circuit 13' of the additional pump module 14. The optical circuit 12' of the an Optical Power Supply module 13 also includes a bi-directional light combiner/separator such as a wavelength division multiplexer WDM 102 optically connected to the light source 101 via optical ports 12c and 13a, and a directional optical attenuator such as an isolator 103 optically connected to the wavelength division multiplexer (WDM) 102. The wavelength division multiplexer WDM 102 combines optical signal power and optical pump power received through the optical ports 12a and 12c, respectively and provides it to the optical port 12b.

A fifth embodiment of the Optical Power Supply module 15 is shown in FIG. 1l. Optical Power Supply module 15, is similar to the Optical Power Supply module illustrated in FIG. 1b, except that Optical Power Supply module 15 utilizes one external pump laser source 101, in addition to the internal laser source 101. In this embodiment, the external laser source 101 is provided in additional pump module 14.

Figure 1M:
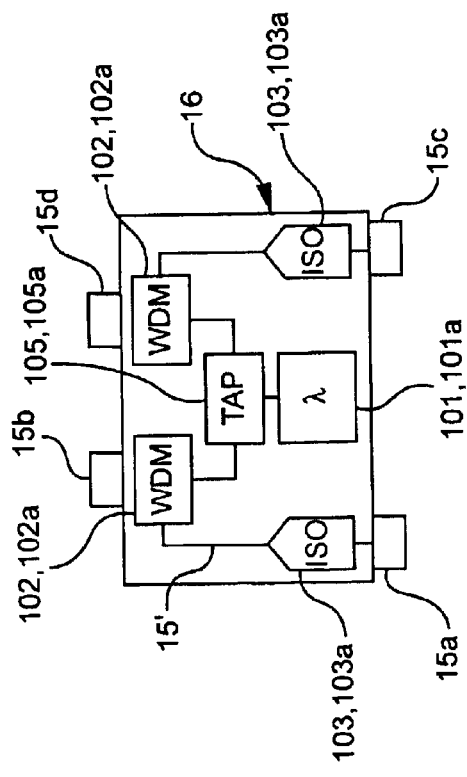

FIG. 1m illustrates an Optical Power Supply module 16. This Optical Power Supply module contains a laser source 101, a first and a second wavelength division multiplexer (WDM) 102, and two optical isolators 103. The first wavelength division multiplexer (WDM) 102 is optically coupled to the optical port 15b. The second wavelength division multiplexer (WDM) 102 is optically coupled to the optical port 15d. The laser source 101 is connected to the optical tap 105 which splits the optical pump power provided by the laser source 101 into two directions. One portion of the optical pump power is provided to the first wavelength division multiplexer WDM 102 and another portion of the optical pump power is provided to the second a wavelength division multiplexer WDM 102. It is noted that optical isolators 103, may be present in the locations 103a, but in a reverse orientation. Finally, the optical isolator 103 which is located between the second WDM 102 and the optical port 15c may also be moved so as to be positioned between the optical port 15d and the second WDM 102.

Figure 1N:
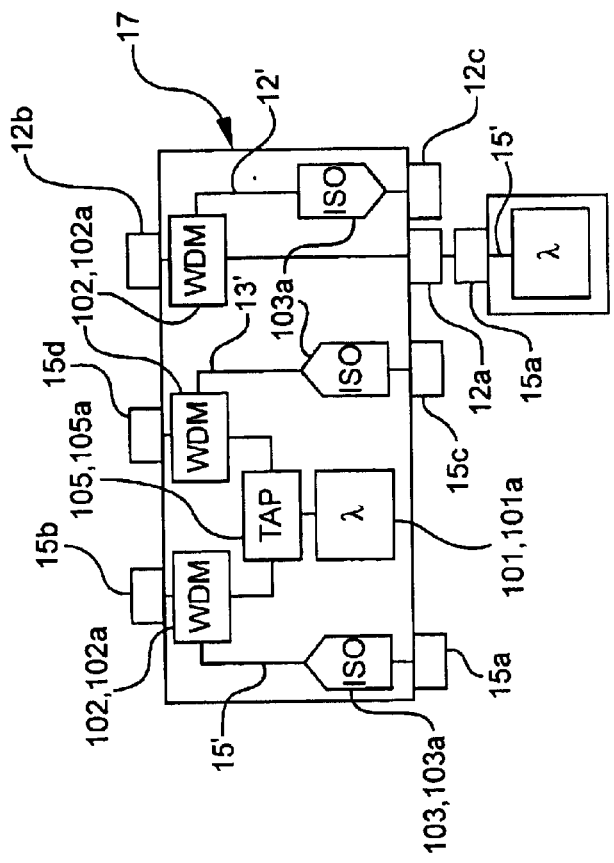

FIG. 1n illustrates another embodiment of the Optical Power Supply module. The Optical Power Supply module 17 of FIG. 1n includes two optical circuits, i.e.—optical circuits 15' and 12'. The Optical circuit 15' is identical to the optical circuit of Optical Power Supply module 16 of FIG. 1m. The Optical circuit 12' is similar to the optical circuit 12' of the Optical Power Supply module 13 illustrated in FIG. 1k, but has the optical isolator 103 oriented in an opposite direction.

FIG. 2 illustrates, schematically, one embodiment of a first optical amplifier 1A of the present invention. The optical amplifier 1A of the first embodiment includes at least one Optical Power Supply module 10 and at least one Amplification module 20. The first and second modules 10, 20 are optically connected to one another.

Optical Power Supply module 10 includes optical circuit 10' that comprises (i) at least one optical port 10a and at least one optical port 10b, (ii) at least a first light source 101' having a first wavelength known to cause amplification in rare earth doped optical fiber 104, such as a laser source 101 for example; (iii) at least one a bidirectional light combiner/separator 102', such as a wavelength division multiplexer (WDM) 102 for example, and (iv) at least one position 103a for a directional optical attenuator 103', such as an optical isolator 103 for example. In this embodiment, the optical isolator position 103a does not include optional optical isolator 103, and the wavelength division multiplexer 102 is optically connected to optical port 10a.

As illustrated here and in subsequent figures, a position that contains an associated optical or electro-optic component is shown as an outline of the component, which is filled with dark gray (or black in the case of optical ports). A position that does not contain the associated component is shown as a transparent outline of this component.

The optical circuit 10' of the Optical Power Supply module 10 in FIG. 2 does not include the isolator 103 and, therefore, does not provide optional optical isolation feature. However, the optical circuit 10' of the Optical Power Supply module 10 in FIG. 2 is fully operable without the directional optical attenuator 103'. The design of this module allows for the optional addition of this optical component during manufacture, without design changes, to upgrade the capability of the optical supply module 10 to include the optical isolation feature. Thus, the Optical Power Supply module 10 is configurable at the manufacturing stage.

The light source 101' may be a laser source 101 operable at approximately 980 nm, or 1480 nm for example. If non-erbium doped amplification medium is used, for example Thulium doped fiber, the appropriate laser source wavelengths are approximately 1050 nm, 1400 nm, or 1550 nm. If Neodymium, or Holmium-doped amplification medium is used, the laser source wavelengths are approximately 800 nm, or 1300 nm, respectively. If Raman amplification is utilized, optical laser sources in wavelength range of 1425 nm to 1510 nm may be used. As stated above, the term "approximately" means that laser source wavelength variation is within ±5 nm of the above specified wavelengths. It is preferable that it is within ±2 nm, and more preferably within ±1 nm of the above specified wavelengths. It is most preferable that they be within ±0.5 nm of their specified wavelengths. Multiple laser sources of the same or different wavelengths may be utilized.

Amplification module 20 includes optical circuit 20' comprising (i) at least one optical port 20a and at least one optical port 20b, (ii) and at least one amplification medium 104'. The amplification medium 104' in this embodiment is an erbium doped optical fiber coil 104. However, other rare-earth dopants may also be utilized. Furthermore, a planar waveguide amplification medium may also be utilized.

The modules 10 and 20 are mounted to either a common support structure or to each other. A support structure is a mechanical support, such as a support board, base module, rack, frame, rod, chassis, or shelf. In one embodiment, modules may take a form of optical circuit boards that plug into a "mother board" and are then placed into the amplifier housing. In another embodiment, these modules may be stacked together mechanically, interconnecting to each other's housing, in a manner of Lego™ blocks, for example. In yet another embodiment, these modules may be located independently within a larger frame, yet optically and electrically connected so as to form the desired optical and electrical circuits.

An optical amplifier of the present invention may also include at least one, third, Monitoring and Access module 30. As an example, FIG. 3 illustrates, schematically, a second embodiment of an optical amplifier 1B, comprised of a first Optical Power Supply first module 10, optically connected to a first Amplification module 20, further optically connected to a first Monitoring and Access module 30.

The Monitoring and Access module 30 shown in FIG. 3 includes an optical circuit 30' comprising: (i) at least one optical port 30a and at least one optical port 30b, (ii) at least one, first optical tap 105' (such as four port optical tap coupler 105), (iii) at least one optical sensor 107' (such as photodiode 107) associated with each tap, and (iv) at least one location with a capacity to accept an optical component such as a WDM 102, isolator 103, or tap coupler 105, in order to provide at least one additional optical function. More specifically, this optical function is provided by inclusion of least one additional optical component that forms part of the optical circuit and is connected to the first optical tap 105'. The optical sensor 107' is preferably an optoelectronic device with a light sensitive material connected to an electrical apparatus for the purposes of sensing the power of the incident light and converting it to an electrical signal. The electrical signal output is dependent on the power of the incident light. For example, optical sensor 107' could be photodiode 107. The optical sensor 107' may also include further electronic signal modification. The additional optical function may be bidirectional light combination/separation, optical tap coupling, or directional optical attenuation, provided for example, by a WDM 102, a tap coupler 105, or optical isolator 103, respectively.

In this embodiment, the optical circuit 30' of the Monitoring and Access module 30 is minimally configured, i.e. it includes only the minimum filled positions. Specifically, the isolator position 105a, the WDM position 102a, the three port optical tap position 105a, and one of the photodiode positions 107a, do not contain the associated isolator 103, wavelength division multiplexer 102, tap 105, and photodiode 107 as described above. This is illustrated in the figures by transparent outlines of these associated optical and electro-optic components. Consequently, the four port optical tap 105 is optically connected to the photodiode 107, optical ports 30c, and 30d. The last optical connection from the four port optical tap 105 may optionally be optically connected to optical port 30a or 30b. However, alternative configurations of the Monitoring and Access module may also be utilized and are shown in FIGS. 1e and 1f. These figures illustrate that the positions 102a, 105a, and 103a have been filled by the appropriate optical components, such as taps 105, WDMs 102, and isolators 103.

The first, second, and third modules are optically connected so as to complete the overall optical circuit of the optical amplifier 1B. These modules are mounted to either a common support structure, or to each other, as described previously.

According to additional embodiments of the present invention, an optical amplifier further includes at least one, fourth module 40, 41, 42. These modules 40, 41, 42 are illustrated in FIGS. 1g–1i. The modules 40, 41, 42, are referred to as Optical Processing modules, and include at least one of the optical circuits 40', 42'. The optical circuits 40', 42' include: (i) at least one first optical port 40a, 42a, and at least one second optical port 40b, 42b, (ii) at least one light filter 108', 109', and (iii) a location with the capacity to include an optical and/or opto-electronic component that provides at least one additional optical and/or opto-electronic function. This additional optical component, when present, forms a part of the optical circuit 40', 41' and is connected to the light filter 108', 109. The additional optical function may be, for example, optical tap coupling, directional optical attenuation, or sensing.

Two embodiments of an optical amplifier 1C, 1C' utilizing one or more Optical Processing modules are shown in FIGS. 4a and 4b. All of the amplifier modules are optically connected so as to complete the overall optical circuit of the optical amplifier 1C, 1C'. These modules are mounted to either a common support structure, or to each other, as described previously.

Furthermore, the optical amplifier may include more than one of each type of module. For example, the optical amplifier 1C depicted in FIG. 4a includes two Monitoring and Access modules 30, two Optical Power Supply modules 12, two Amplification modules 20, and one optical processing module 41. The optical amplifier 1C' depicted in FIG. 4b includes two Monitoring and Access modules 30, two Optical Power Supply modules 12, two Amplification modules 20, and two optical processing modules 40 and 42.

The optical amplifier embodiments of FIGS. 4a and 4b are functionally similar to each other, and will serve as a reference for comparison with other, similar amplifiers illustrated in FIGS. 5–14, and discussed below.

As illustrated in FIG. 4a, Optical Power Supply module 12 comprises optical circuits 10' and 11', each with respective independent optical ports 10a, 10b and 11a, 11b. This Optical Power Supply module 12 is optically connected to a first Amplification module 20, a first Monitoring and Access module 30, and a first Optical Processing module 41. Optical port 10a of the optical circuit 10' of the first Optical Power Supply module 12 is optically connected to optical port 30d of the first Monitoring and Access module 30. Optical port 10b of the first Optical Power Supply module 12 is optically connected to optical port 20a of the of the first Amplification module 20. Optical port 11b of the first Optical Power Supply module 12 is optically connected to optical port 20b of the of the first Amplification module 20. Optical port 11a of the first Optical Power Supply module 12 is optically connected to optical port 40a of the first Optical Processing module 41. Furthermore, a second Optical Power Supply module 12 includes optical circuits 10' and 11', each with independent optical ports 10a, 10b and 11a, 11b, is optically connected to the first Optical Processing module 41 and a second Amplification module 20, and a second Monitoring and Access module 30. Optical port 10a of the optical circuit 10' of the first Optical Power Supply module 12 is optically connected to optical port 42b of the first Optical Processing module 41. Optical port 10b of the second Optical Power Supply module 12 is optically connected to optical port 20a of the of the second Amplification module 20. Optical port 11b of the second Optical Power Supply module 12 is optically connected to optical port 20b of the of the second Amplification module 20. Optical port 11b of the first Optical Power Supply module 12 is optically connected to optical port 30d of the second Monitoring and Access module 30. In this embodiment, all optical positions in circuits 10', 11', 20', 40', and 42' are filled.

Monitoring and Access module 30 of the optical amplifiers 1C, 1C' shown in FIGS. 4a and 4b provides bandsplitting of telemetry channels, and provides bidirectional signal power monitoring of the input and output optical power. For example, in Monitoring and Access module 30 on the left side of FIG. 4b, optical Port 30a is the optical input to the device for signal and telemetry supervisory channel. From WDM 102, the telemetry supervisory channel is output at optical Port 30b. The optical signal quality is monitored electrically and optically via the photodiodes 107 and the optical output at optical port 30c. For example, photodiodes 107 connected to the 4 port optical tap 105 measures input optical signal power, and photodiode 107 connected to the 3 port optical tap 105 measures optical back-reflectance.

Optical Processing module 41 includes an isolator 103 that optically isolates the first rare-earth-doped fiber of the first Amplification module 20 coil from the second coil of the second Amplification module 20 with respect to the backwards traveling amplified spontaneous emission and signal power. This leads to amplifiers with lower noise figure and superior multi-path interference properties. The GFF 108 of the Optical Processing module 41 (FIG. 4a) flattens the resultant gain spectrum provided by the two coils. It is understood that other amplification media may also be used. They are, for example, Thulium-, Neodymium-, or Holmium-doped fibers. Furthermore, the amplification medium may be present in a planar waveguide, instead of fiber waveguide form. Finally, if an amplifier is Raman amplifier, amplification medium is transmission fiber and the optical laser sources of Optical Power Supply module 10, 11, 12 utilize optical laser sources 101 in wavelength range of 1425 nm to 1510 nm.

Optical Processing module 41 of FIG. 4b includes VOA 109 that adjusts the overall gain of the amplifier to maintain amplifier gain spectrum flatness as the input power to the amplifier changes. The photodiodes 107 in module 42 allow the monitoring of signal power in front of and behind of the VOA 109 to allow for the adjustment of the VOA 109.

The optical processing modules 40, 41, 42 are optically and functionally located between the amplification modules 20 so as to optimize optical performance of the amplifier assembly, by minimizing their impact on noise figure NF and on amplifier output power conversion efficiency. The amplifier output power conversion efficiency is defined by how much output power is provided by an amplifier given a certain amount of pump power.

In FIG. 4b a first Optical Power Supply module 10 (with optical ports 10a, 10b), is optically connected to a first Amplification module 20 via optical connection 113 between optical ports 10b and 20a, and to a first Monitoring and Access module 30 via second optical connection 113 between optical ports 10a and 30d. The first Amplification module 20 is further optically connected to a second Optical Power Supply module 11 via optical connection 113 between optical ports 20b and 11b. The second Optical Power Supply module 11 is optically connected to a first Optical Processing module 40 via optical connection 113 between optical ports 11a and 40a. The first Optical Processing module 40 is optically connected to a second Optical Processing module 42 via optical connection 113 between optical ports 40b and 42a. The second Optical Processing module 42 is optically connected to a third Optical Power Supply module 10 via optical connection 113 between optical ports 42b and 10a. The third Optical Power Supply module 10 is optically connected to a second Amplification module 20 via optical connection 113 between optical ports 10b and 20a. The second Amplification module 20 is optically connected to a fourth Optical Power Supply module 11 via optical connection 113 between optical ports 20b and 11b. The fourth Optical Power Supply 11 is optically connected to a second Monitoring and Access module 30 via optical connection 113 between optical ports 11a and 30b. The Optical Processing modules 40, 42 in FIG. 4b perform the same function as Optical Processing module 41 of FIG. 4a.

In both embodiments of FIGS. 4a and 4b, only the isolator positions 103a in the Monitoring and Access modules 30 are vacant.

In both embodiments, the optical signal enters through port 30a of the module 30 and is routed through port 30d to the module 10, through its input port 10a. The optical signal is then routed through the isolator 103, which prevents laser source light and amplified spontaneous emission from leaking backwards into the monitoring photodiodes, 107, and transmission fiber, and is combined within the WDM 102 with the laser source light output by the laser source 101. The combined signal/laser source light is routed toward the first Amplification module 20. The optical signal (and laser source light from module 10) then enters, through the input port 20a, the first amplification module 20 and the amplified optical signal exits the first amplification module 20 through the output port 20b. The amplified signal is routed through module 12 (FIG. 4a) or 11 (FIG. 4b), where it is separated by a WDM 102, and provided to one or more Optical processing modules 40, 41, 42, through optical port(s) 40a, 42a. The Optical processing modules 40, 41, 42 are configured to process the amplified signal and to adjust the gain magnitude and the shape of gain spectrum, by adjusting gain, at different wavelengths, by an appropriate amount. The processed, amplified signal exits Optical processing modules, 41 (FIG. 4a), 42 (FIG. 4b) through the optical ports 42b and is routed, through module 12 (FIG. 4a), 10 (FIG. 4b) to the second amplification module 20, for further amplification. The signal enters the second amplification module 20 through port 20a, is further amplified by the rare-earth doped fiber coil 104 and exits the second amplification module 20 through port 20b. The signal light than is routed through modules 12 and 30 (FIG. 4a) or modules 11 and 30 (FIG. 4b) and exits the module 30 either through port 30a or 30c. The amplified signal is then ideally disposed for coupling to a transmission fiber, for transmission over a large distance, or for coupling to an additional optical component or module before it is coupled into a transmission fiber or another downstream optical network element.

Amplifier Variety

The amplifier modules described herein are used as building blocks to provide a large variety of customized amplifiers. However, because each of the amplifiers is made of common blocks, they can be manufactured quickly and inexpensively, and if a purchase order is canceled, the modules can be re-used to manufacture other amplifiers. Furthermore, the modules themselves are configurable, as needed at the time of manufacture and may or may not utilize optional optical components.

All of the modules may be mounted to either a common support structure or to each other, as described previously.

Thus, according to the present invention, the unique combination of common, yet configurable, optical amplifier modules 10, 11, 12, 20, 30, 31, 40, 41, 42, 50 allows for the manufacture of a wide variety of commercially available optical amplifiers. This is illustrated schematically in FIGS. 5–14, which depict the embodiments of alternate optical amplifiers similar to the optical amplifier embodiments 1C, 1C' illustrated schematically in FIGS. 4a and 4b and described in detail above. The amplifiers of FIGS. 5–14 show variation in the presence or absence of optical amplifier modules 10, 11, 12, 20, 30, 31, 40, 41, 42, 50, and in the selective configuration (presence or absence of electro-optic and optical components) of the module optical circuits 10', 11', 12', 20', 30', 31', 40', 41', 42', 50', as described previously. The embodiments of the optical amplifiers in each of FIGS. 5–14 are similar in functionality to each other, and are compared to the two embodiments of the optical amplifiers 1C and 1C' shown schematically in FIGS. 4a and 4b, respectively, and described in detail above.

For example, in comparison to the optical amplifier 1C of FIG. 4a, optical amplifier 1D of FIG. 5a includes a first Optical Power Supply module 12, a first Amplification module 20, and a first and second Monitoring and Access modules 30. The optical circuits included in each module are configured as in FIG. 4a, except as indicated in the figures. For example, optical circuit 11' of Optical Power Supply module 12 does not contain any optical components. Furthermore, optical circuit 30' in the first Monitoring and Access module 30 does not contain WDM 102, isolator 103, three port optical tap 105 with associated photodiode 107. Furthermore, the second Monitoring and Access module 30 includes optional isolator 103. Finally, FIG. 5a illustrates an alternative connection between optical ports 20b and 30b which bypasses the Optical Power Supply module 12 entirely in order to minimize connection losses. Likewise, in comparison to FIG. 4b, amplifier 1D' of FIG. 5b is comprised of a first Optical Power Supply module 10, a first Amplification module 20, and a first and second Monitoring and Access module 30. Modules 20 and 30 are configured as described for FIG. 5a. As one can see from the illustration, the amplifier 1E' of FIG. 5b utilizes a simpler and smaller Optical Power Supply module 10 than that of the amplifier of FIG. 5a. However, because the configuration of Optical Power Supply module 12 of FIG. 5a includes the same optical components as the Optical Power Supply module 10 depicted in FIG. 5b, it performs the same function and operates identically.

FIGS. 6a and 6b illustrate, schematically, two alternative embodiments of optical amplifier 1E, 1E'.

Amplifier 1E of FIG. 6a is similar to the optical amplifier of FIG. 4a because it includes the same modules—i.e., first and second Optical Power Supply modules 12, first and second Amplification modules 20, first and second Monitoring and Access modules 30, and a first Optical Processing module 41. However, the modules 12, 30, and 41 depicted in FIG. 6a, are configured differently than those of FIG. 4a. For example, optical circuit 11' of the first Optical Power Supply module 12 of FIG. 6a does not contain any optical components. Furthermore, optical circuit 11' of the second Optical Power Supply module 12 of FIG. 6a contains a WDM 102. In addition the optical circuit 30' in the first Monitoring and Access module 30 of FIG. 6a does not contain WDM 102, isolator 103, three port optical tap 105 with associated photodiode 107. Furthermore, the second Monitoring and Access module 30 includes optional isolator 103. Finally, optical circuit 42' of the first Optical Processing module 41 of FIG. 6a does not contain any optical components.

Likewise, in comparison to FIG. 4b, amplifier 1E' of FIG. 6b includes a first, second and third Optical Power Supply module 10, a first and second Amplification module 20, a first and second Monitoring and Access module 30, and only a first Optical Processing module 40. Modules 20 and 30 are configured as illustrated in FIG. 6a. The third Optical Power Supply module 10 of FIG. 6b contains only a WDM 102.

FIGS. 7a and 7b illustrate, schematically, two alternative embodiments of optical amplifier 1F, 1F'.

Optical amplifier 1F of FIG. 7a is similar to the optical amplifier depicted in FIG. 4a. The amplifier 1F illustrated in FIG. 7a includes a first and second Optical Power Supply module 12, a first and second Amplification module 20, and a first and second Monitoring and Access module 30, and a first Optical Processing module 41. The optical circuits included in each module are configured similar to those of FIG. 4a, except for the differences illustrated in the figure.

For example, optical circuit 11' of the first Optical Power Supply module 12 provides for the inclusion of optical components but does not contain a complete set of optical components. Furthermore, optical circuit 30' in the first Monitoring and Access module 30 does not contain WDM 102, isolator 103, three port optical tap 105 with associated photodiode 107. Finally, the second Monitoring and Access module 30 does not contain three port optical tap 105 with associated photodiode 107.

Amplifier 1F' of FIG. 7b is similar to the amplifier depicted in FIG. 4b. The amplifier 1F' illustrated in FIG. 7b includes a first and second Optical Power Supply module 10, and a first Optical Power Supply module 11, a first and second Amplification module 20, and a first and second Monitoring and Access module 30, and a first Optical Processing module 40 with a second Optical Processing module 42. Modules 20 and 30 of the amplifier 1F' of FIG. 7b are configured as described for FIG. 7a.

FIGS. 8a and 8b illustrate, schematically, two alternative embodiments of optical amplifier 1G, 1G'.

Optical amplifier 1G of FIG. 8a is similar to the optical amplifier depicted in FIG. 4a. The amplifier 1G illustrated in FIG. 8a includes a first and second Optical Power Supply module 12, a first and second Amplification module 20, a first and second Monitoring and Access module 30, and a first Optical Processing module 41. The optical circuits included in each module are similar to those in FIG. 4a, except for the differences illustrated in the figure. For example, optical circuit 11' of the first Optical Power Supply module 12 provides for the inclusion of optical components but does not contain a complete set of optical components. Optical circuit 11' of the second Optical Power Supply module 12 contains a only first laser source 101, WDM 102 and isolator 103. Optical circuit 30' in the first Monitoring and Access module 30 does not contain WDM 102, isolator 103, and a three port optical tap 105 with associated photodiode 107. Finally, the optical circuit 42' of the first Optical Processing module 41 does not contain a first three port optical tap 105 with associated photodiode 107. As stated above, the included optical and electro-optic components are illustrated using dark blocks, while the unpopulated positions for optical components are shown as outlines of the associated components.

Optical Amplifier 1G' of FIG. 8b is similar to the amplifier depicted in FIG. 4b. The amplifier 1G' illustrated in FIG. 8b includes a first, second and third Optical Power Supply module 10, a first and second Amplification module 20, a first and second Monitoring and Access module 30, a first Optical Processing module 40, and a second Optical Processing module 42. Modules 20 and 30 are configured as described for FIG. 8a. However, the third Optical Power Supply module 10 contains a laser source 101, a WDM 102, and an isolator 103 and optical circuit 42' of the second Optical Processing module 42 is configured as described for FIG. 8a, but the optical circuit 10' for the Optical Power Supply module 10 does not provide for the inclusion of the additional optical components (i.e., additional laser sources, isolators, etc.) as does the Optical Power Supply module 12 of FIG. 8a.

FIGS. 9a and 9b illustrate, schematically, two alternative embodiments of optical amplifier 1H, 1H'.

Amplifier 1H of FIG. 9a is similar to the optical amplifier depicted in FIG. 4a. The amplifier 1H illustrated in FIG. 9a includes a first and second Optical Power Supply module 12, a first and second Amplification module 20, and a first and second Monitoring and Access module 30, and a first Optical Processing module 41. The optical circuits included in each module are configured as in FIG. 4a, except as indicated. For example, optical circuit 11' of the first Optical Power Supply module 12 and optical circuit 10' of the second Optical Power Supply module 12 provides for the inclusion of optical components but does not contain a complete set of optical components. Furthermore, optical circuit 11' of the second Optical Power Supply module 12 contains a laser source 101, WDM 102, and an isolator 103. Finally, optical circuit 30' in the first Monitoring and Access module 30 does not contain WDM 102, isolator 103, or three port optical tap 105 with associated photodiode 107.

Amplifier 1H' of FIG. 9b is similar to the optical amplifier depicted in FIG. 4b. The amplifier 1I illustrated in FIG. 9b includes a first and second Optical Power Supply module 10, a first and second Amplification module 20, and a first and second Monitoring and Access module 30, a first Optical Processing module 40, and a second Optical Processing module 42. Modules 20 and 30 are configured as described for FIG. 9a. The second Optical Power Supply module 10 contains an isolator 103 in the reverse orientation, and is optically connected between optical port 20a of the second Amplification module 20 and optical port 30b of the second Monitoring and Access module 30.

FIGS. 10a and 10b illustrate, schematically, two alternative embodiments of optical amplifier 1I, 1I'.

Amplifier 1I of FIG. 10a is similar to the amplifier depicted in FIG. 4a. The amplifier 1I illustrated in FIG. 10a includes a first and second Optical Power Supply module 12, a first and second Amplification module 20, and a first and second Monitoring and Access module 30, and a first Optical Processing module 41. The optical circuits included in each module are configured as in FIG. 4a, except as indicated. For example, optical circuit 11' of the first Optical Power Supply module 12 provides for the inclusion of optical components but does not contain a complete set of optical components. Furthermore, optical circuit 10' of the second Optical Power Supply module 12 does not contain isolator 103. Furthermore, optical circuit 11' of the second Optical Power Supply module 12 contains a only first laser source 101, WDM 102 and isolator 103. Finally, optical circuit 30' in the first Monitoring and Access module 30 does not contain WDM 102, isolator 103, three port optical tap 105 with associated photodiode 107.

Amplifier 1I' of FIG. 10b is similar to the amplifier depicted in FIG. 4b. The amplifier 1J' illustrated in FIG. 10b is comprised of a first, second and third Optical Power Supply module 10, a first and second Amplification module 20, a first and second Monitoring and Access module 30, a first Optical Processing module 40, and a second Optical Processing module 42. Modules 20 and 30 are configured as described for FIG. 10a. The second Optical Power Supply module 10 does not contain isolator 103. The third Optical Power Supply module 10 contains isolator 103 in the reverse orientation, and is optically connected between optical port 20a of the second Amplification module 20 and optical port 30b of the second Monitoring and Access module 30.

FIGS. 11a and 11b illustrate, schematically, two alternative embodiments of optical amplifier 1J, J'.

Amplifier 1J of FIG. 11a is similar to the amplifier depicted in FIG. 4a. The amplifier 1J illustrated in FIG. 11a includes a first Optical Power Supply module 12, a first Amplification module 20, and a first and second Monitoring and Access module 30. The optical circuits included in each module are configured as in FIG. 4a, except as indicated. For example, optical circuit 11' of Optical Power Supply module 12 provides for the inclusion of optical components but does not contain a complete set of optical components. Furthermore, optical circuit 30' in the first Monitoring and Access module 30 does not contain WDM 102, isolator 103, or three port optical tap 105 with associated photodiode 107. Finally, the second Monitoring and Access module 30 does not contain WDM 102.

Amplifier 1J' of FIG. 11b is similar to the amplifier depicted in FIG. 4b. The amplifier 1J' illustrated in FIG. 11b includes a first Optical Power Supply module 10, a first Amplification module 20, and a first and second Monitoring and Access module 30. Modules 20 and 30 are configured as described for FIG. 11a.

Figure 12A:
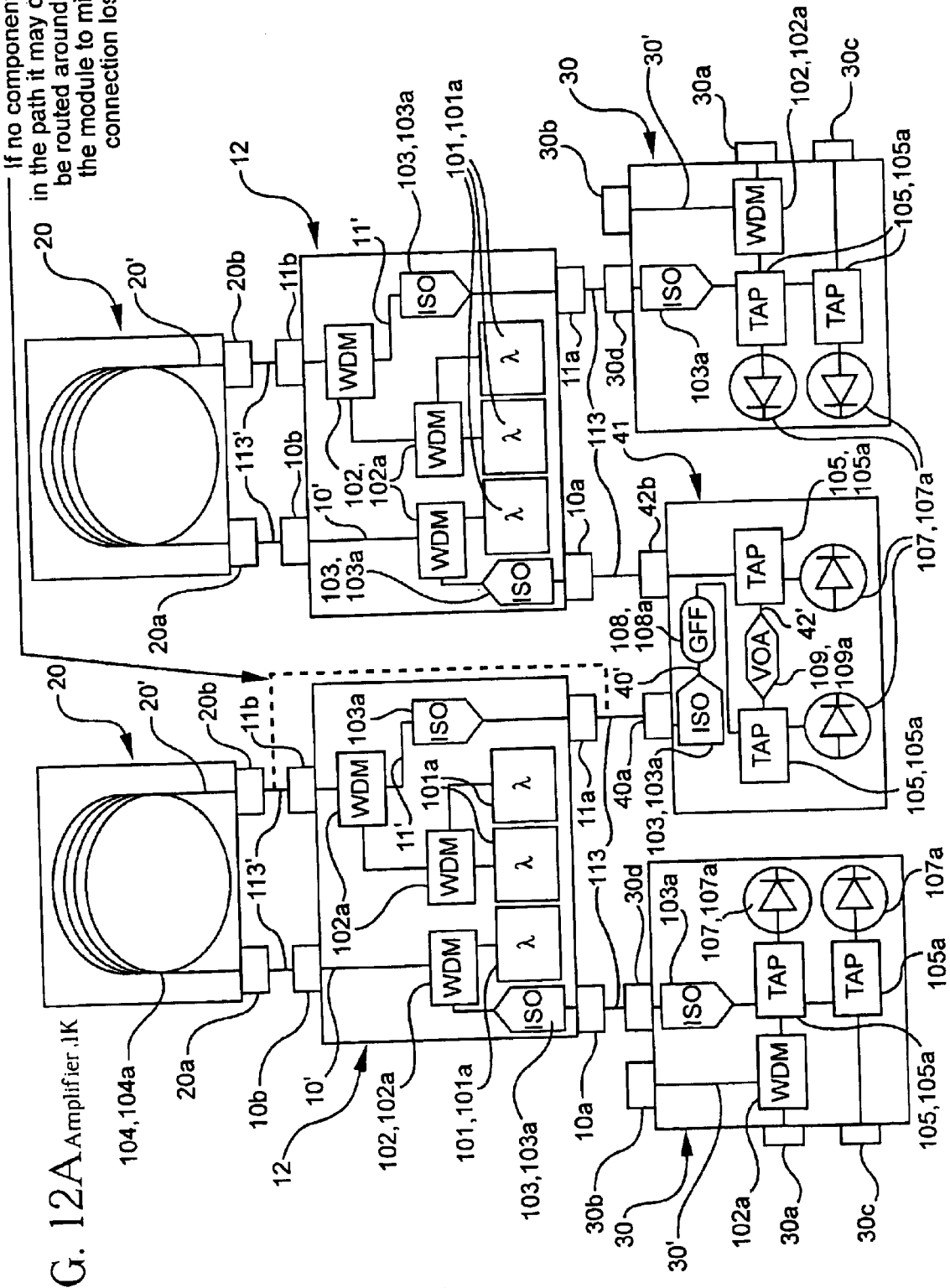

FIGS. 12a and 12b illustrate, schematically two alternative embodiments of optical amplifier 1K, 1K'.

Amplifier 1K of FIG. 12a is similar to the amplifier depicted in FIG. 4a. The amplifier 1K illustrated in FIG. 12a includes a first and second Optical Power Supply module 12, a first and second Amplification module 20, and a first and second Monitoring and Access module 30, and a first Optical Processing module 41. The optical circuits included in each module are configured as in FIG. 4a, except as indicated. For example, optical circuit 11' of the first Optical Power Supply module 12 provides for the inclusion of optical components but does not contain a complete set of optical components; and optical circuit 30' in the first Monitoring and Access module 30 does not contain WDM 102, isolator 103, three port optical tap 105 with associated photodiode 107.

Amplifier 1K' of FIG. 12b is similar to the amplifier depicted in FIG. 4b. The amplifier 1K' illustrated in FIG. 12b includes a first and second Optical Power Supply module 10 and a first Optical Power Supply module 11, a first and second Amplification module 20, and a first and second Monitoring and Access module 30, and a first Optical Processing module 40 with a second Optical Processing module 42. Modules 20 and 30 are configured as described for FIG. 7a.

FIGS. 13a and 13b illustrates, schematically, two alternative embodiments of optical amplifier 1L, 1L'.

Amplifier 1L of FIG. 13a is similar to the amplifier depicted in FIG. 4a. The amplifier 1L illustrated in FIG. 13a includes a first and second Optical Power Supply module 12, a first and second Amplification module 20, and a first and second Monitoring and Access module 30, and a first Optical Processing module 41. The optical circuits included in each module are configured as in FIG. 4a, except as indicated. For example, optical circuit 11' of the first Optical Power Supply module 12 provides for the inclusion of optical components but does not contain a complete set of optical components. Furthermore, optical circuit 10' of the second Optical Power Supply module 12 does not contain isolator 103. Optical circuit 11' of the second Optical Power Supply module 12 contains a only first laser source 101, WDM 102 and isolator 103. Optical circuit 30' in the first Monitoring and Access module 30 does not contain WDM 102, isolator 103, three port optical tap 105 with associated photodiode 107. Finally, optical circuit 30' of the second Monitoring and Access module 30 does not contain WDM 102 or isolator 103.

Amplifier 1L' of FIG. 13b is similar to the amplifier depicted in FIG. 4b. The amplifier 1L' illustrated in FIG. 13b includes a first, second and third Optical Power Supply module 10, a first and second Amplification module 20, a first and second Monitoring and Access module 30, a first Optical Processing module 40, and a second Optical Processing module 42. Modules 20 and 30 are configured as described for FIG. 10a. The third Optical Power Supply module 10 contains an isolator 103 in the reverse orientation, and is optically connected between optical port 20b of the second Amplification module 20 and optical port 30d of the second Monitoring and Access module 30.

FIGS. 14a and 14b illustrate, schematically, two alternative embodiments of optical amplifier 1M, 1M'. These embodiments illustrate that an optical amplifier may further include at least one, sixth module 50. The sixth module 50 is referred to as the Telemetry Add/drop module and includes at least one optical circuit 50'. The Telemetry Add/drop module 50 comprises: (i) at least three optical ports 50a–50f, (ii) at least two positions for bidirectional light combiner/separators 102, either one or both of which may contain the bidirectional light combiner/separators 102. The bidirectional light combiner/separators 102 may be, for example, wavelength division multiplexers WDMs.

In comparison the optical amplifier of FIG. 4a, optical amplifier 1M of FIG. 14a includes one Telemetry Add/drop module 50, optically connected between the two Optical Power Supply modules 12 and the Optical Processing module 41 via optical port connections 113 connecting ports 50a to 40a, 50c to 11a, 50d to 10a, and 50f to 42b. The module 50 provides the same telemetry access provided by the Monitoring and Access modules 30 of FIG. 4a. Consequently, the first and second Monitoring and Access modules 30 of FIG. 14a do not contain WDM 102, as illustrated by the transparent outlines in that figure.

Likewise, in comparison to FIG. 4b, amplifier 1M' of FIG. 14b includes one Telemetry Add/drop module 50, optically connected between the first Optical Processing module 40 and the second Optical Processing module 42 via optical connections 113 connecting optical ports 50a to 42a, 50c to 40b, 50d to 10a, and 50f to 42b. Modules 20 and 30 are configured as described for FIG. 10a.

Module Configuration

As described above, the amplifier modules may be configured in a variety of ways. Such configurations are shown, for example, in FIGS. 15a–17q. All of the modules are configured to interact and/or communicate optically and/or electronically with at least one other module. All of the modules have optical, electronic, electrical and/or mechanical ports that are configured to connect or interact with the corresponding port of at least one other module. As stated above, the modules are upgradable because additional optical components may be added to their optical circuit(s). Each of the modules is made so as to be detachable from the other modules, so that another, upgraded module can be substituted in its place. Thus, the amplifiers are upgradable because additional optical components may be added to their optical circuit(s) by way of module upgrade.

The modules contain various optical and electrical components that may be coupled to one another, for example, through fiber splices, fused connections, mechanical fiber connections or through other mechanical couplers, or via free space optical communication.

Figure 15B:
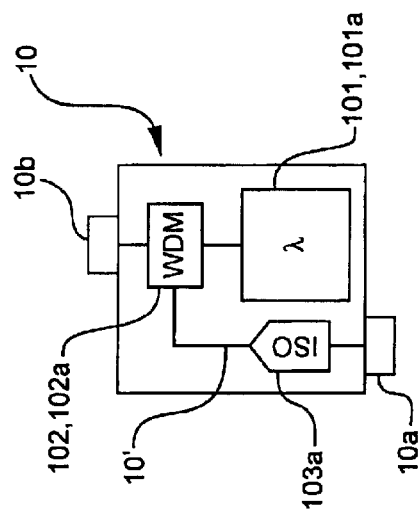
FIGS. 15a–15r illustrate, schematically, examples of several configurations of optical circuits 10' and 11' within three embodiments of the Optical Power Supply modules shown in FIGS. 1a–1c.
Figure 15A:
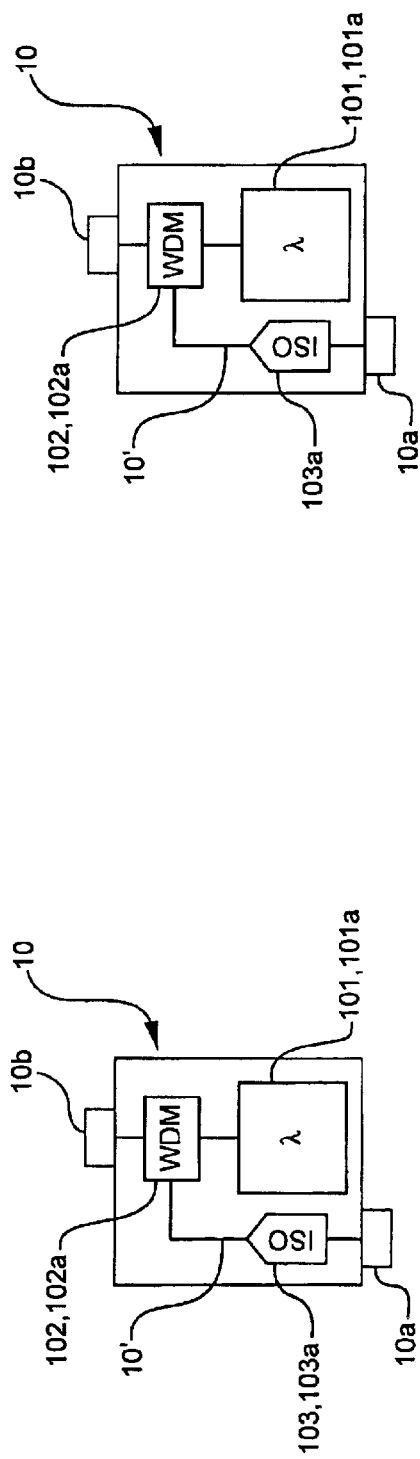
Figure 15C:
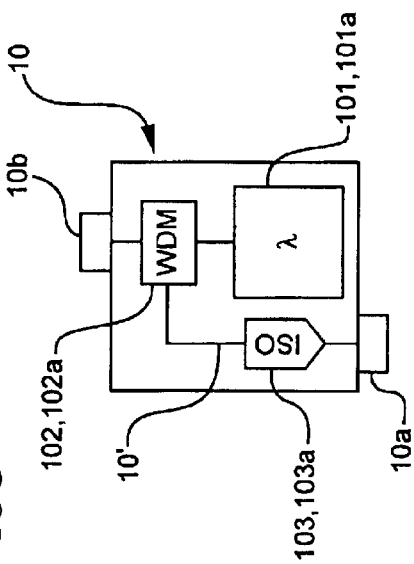
Figure 15E:
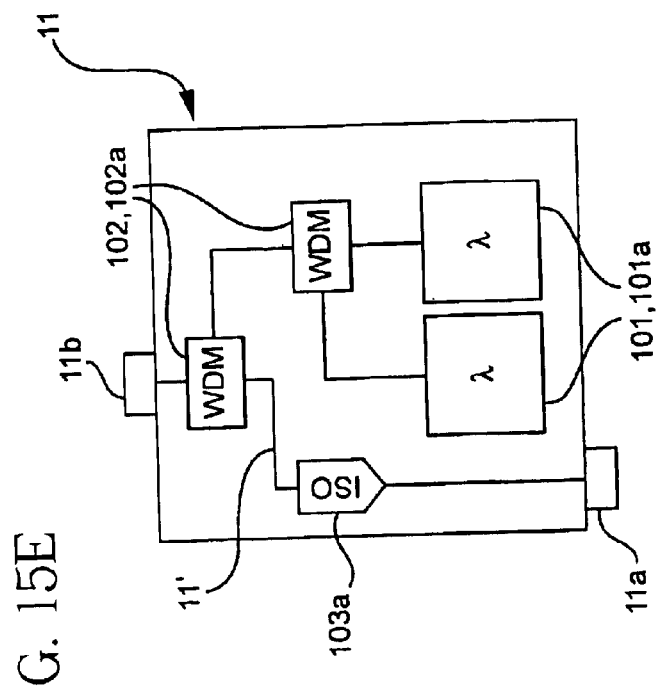
Figure 15D:
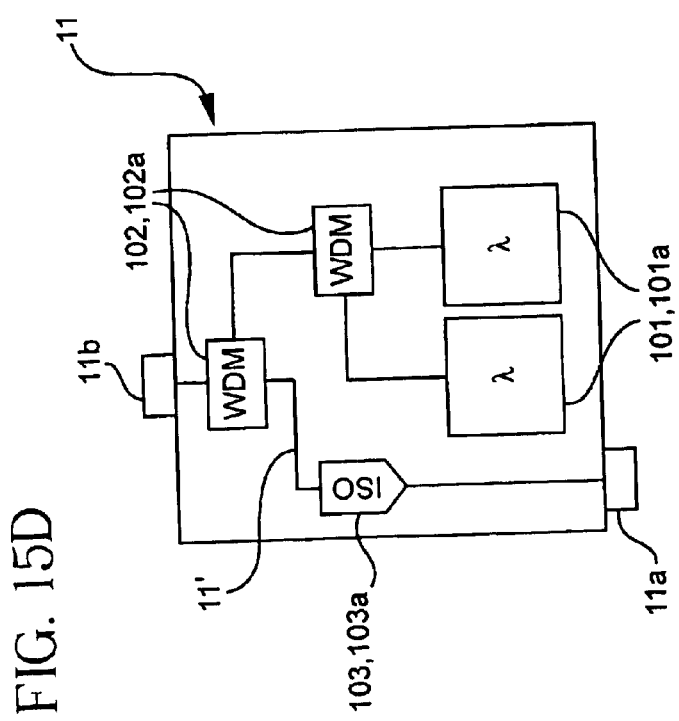
Figure 15G:
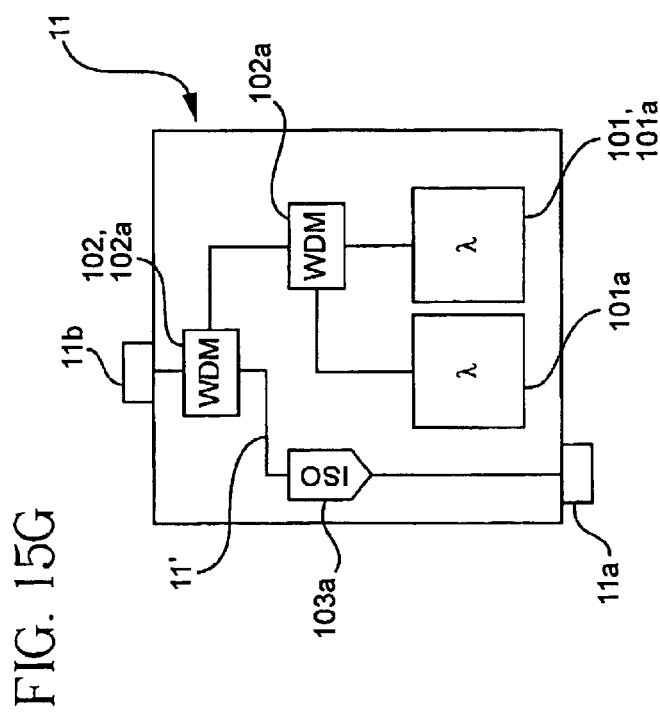
Figure 15F:
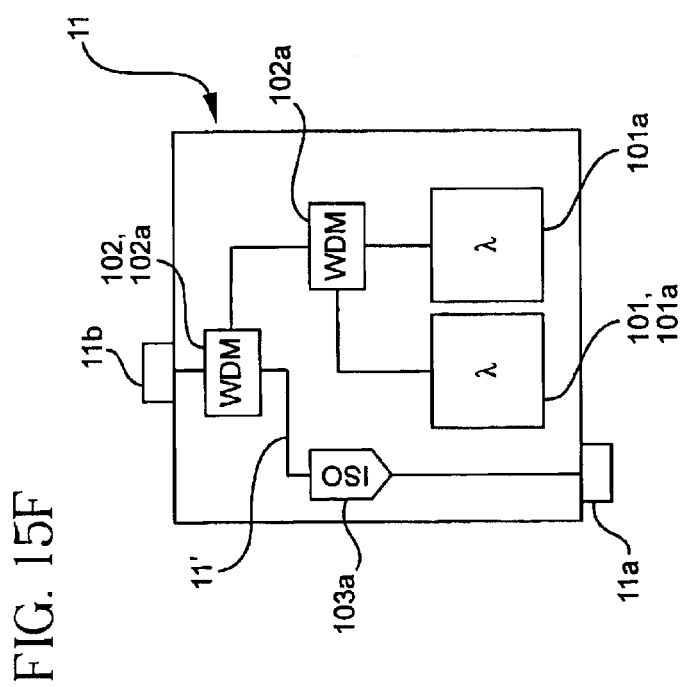
Figure 15I:
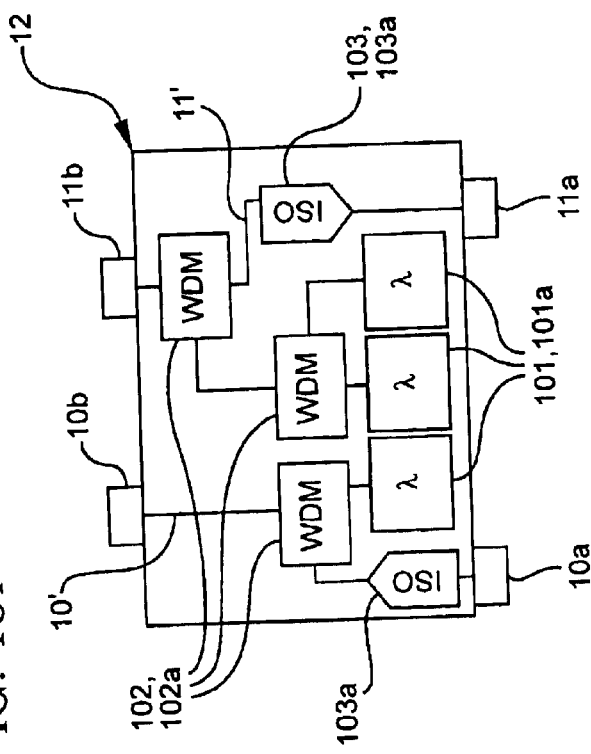
Figure 15H:
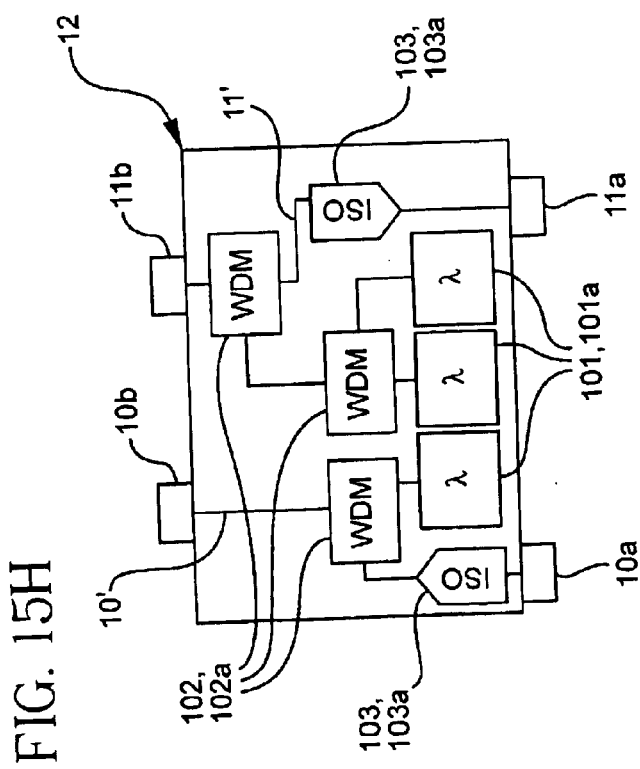
Figure 15K:
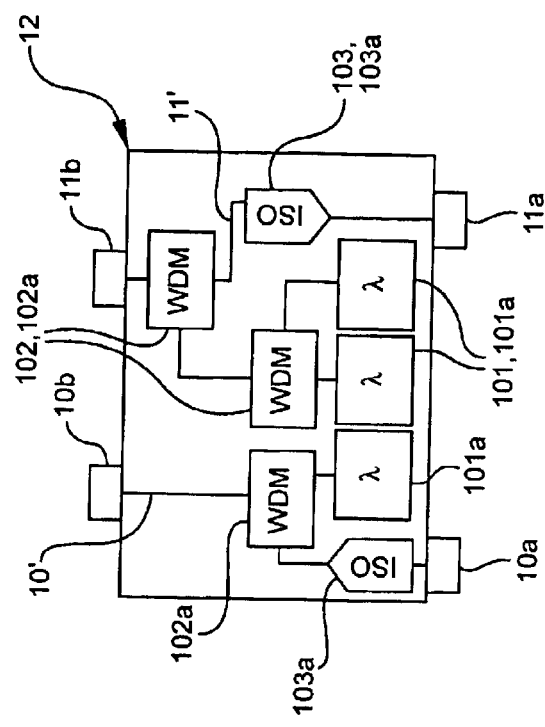
Figure 15J:
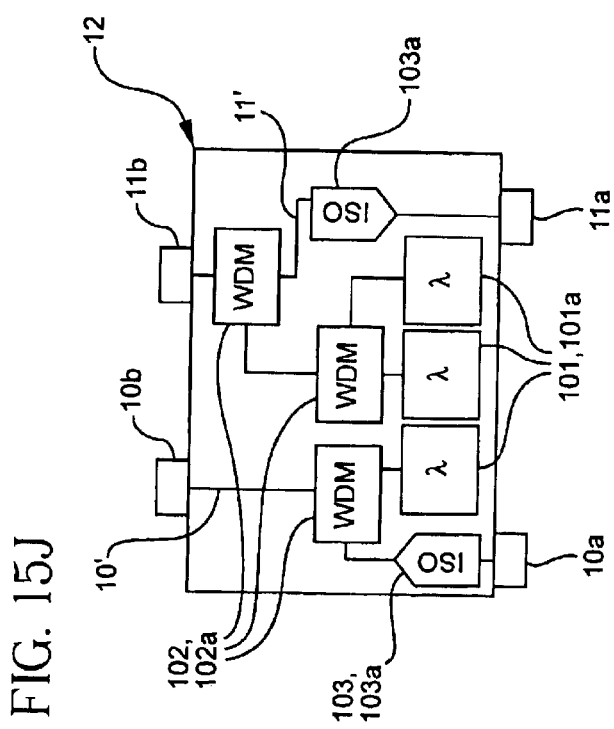
Figures 15L, 15M:
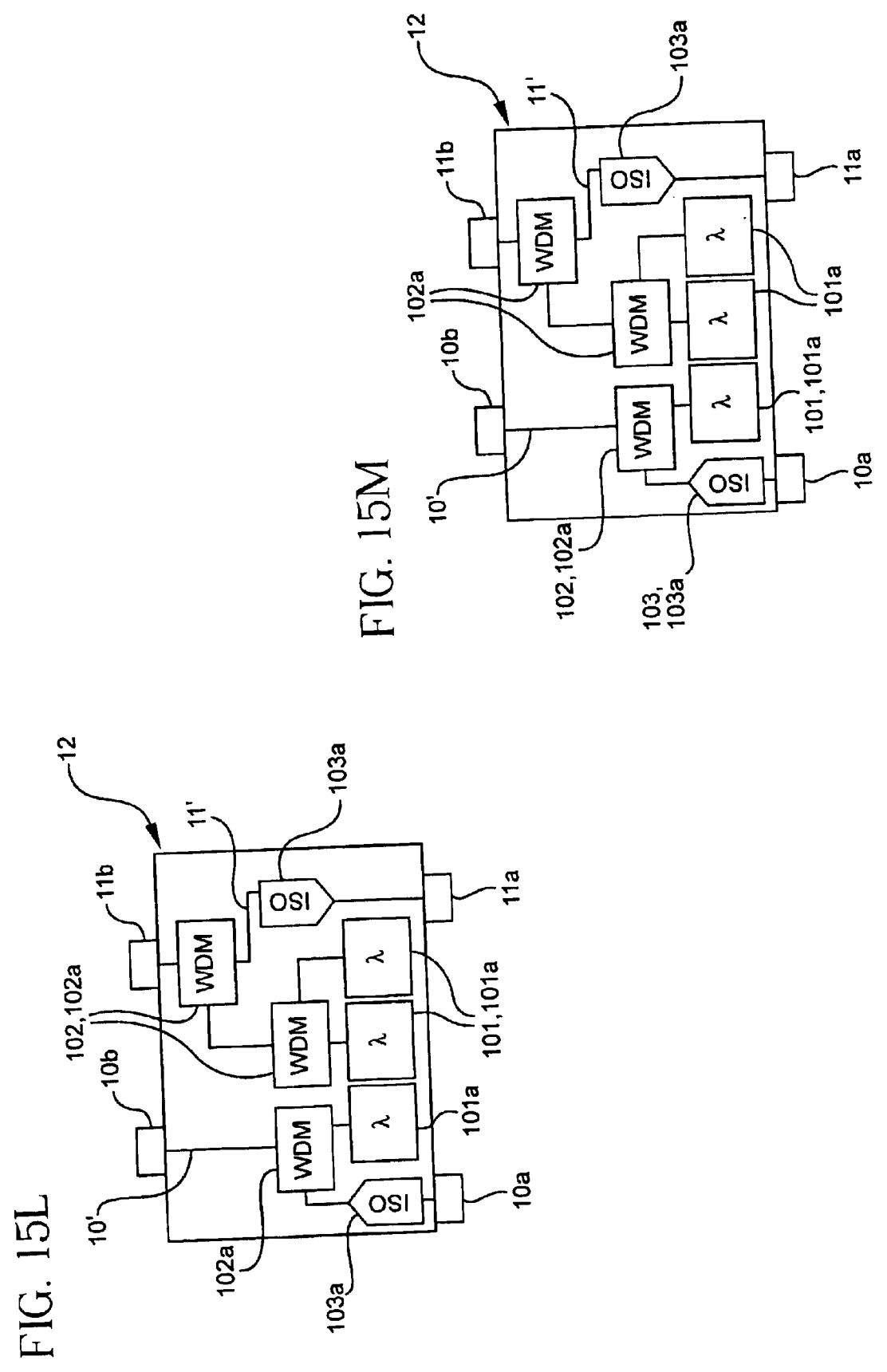
Figure 15O:
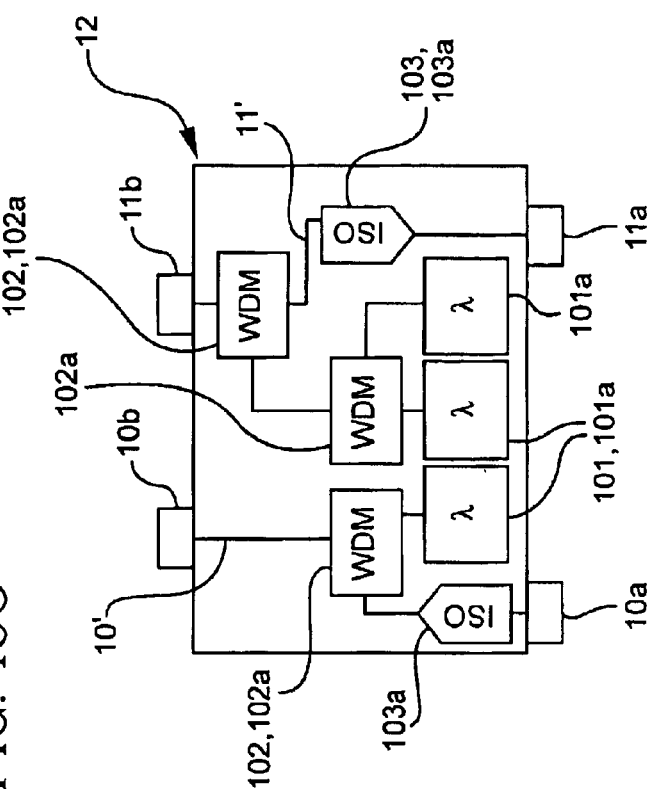
Figure 15N:
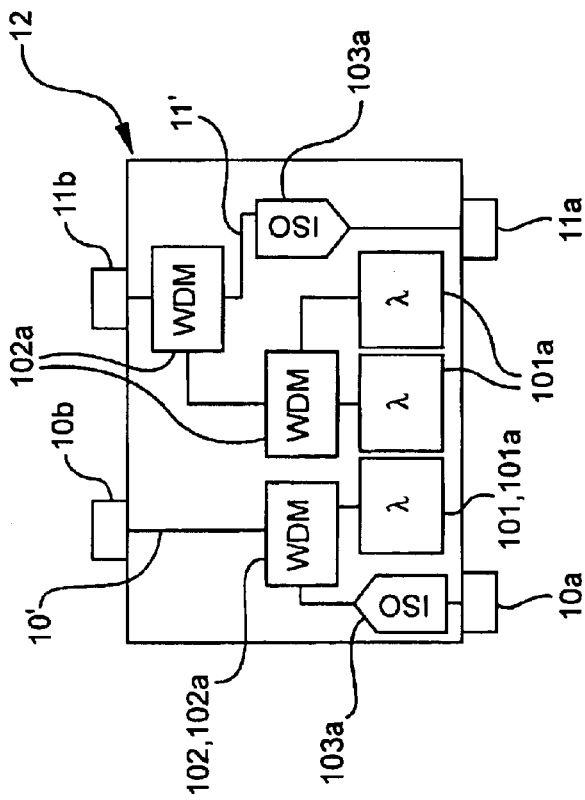
Figure 15Q:
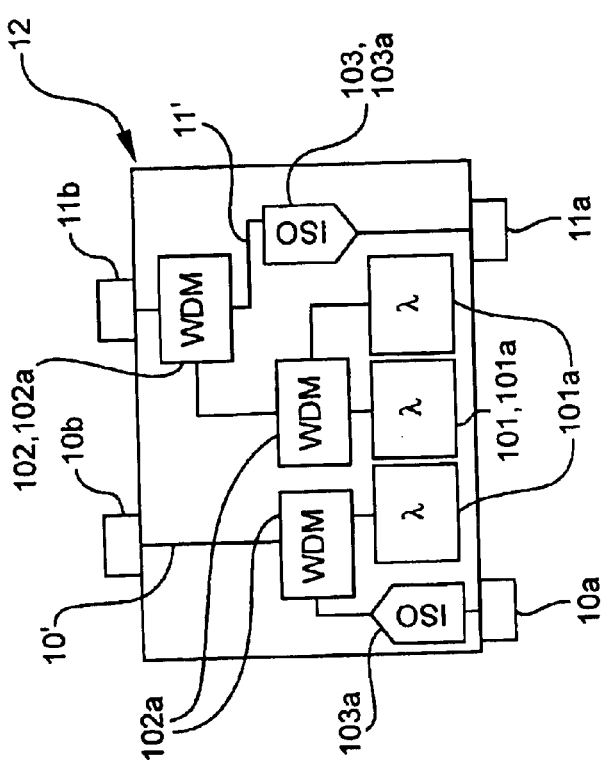
Figure 15P:
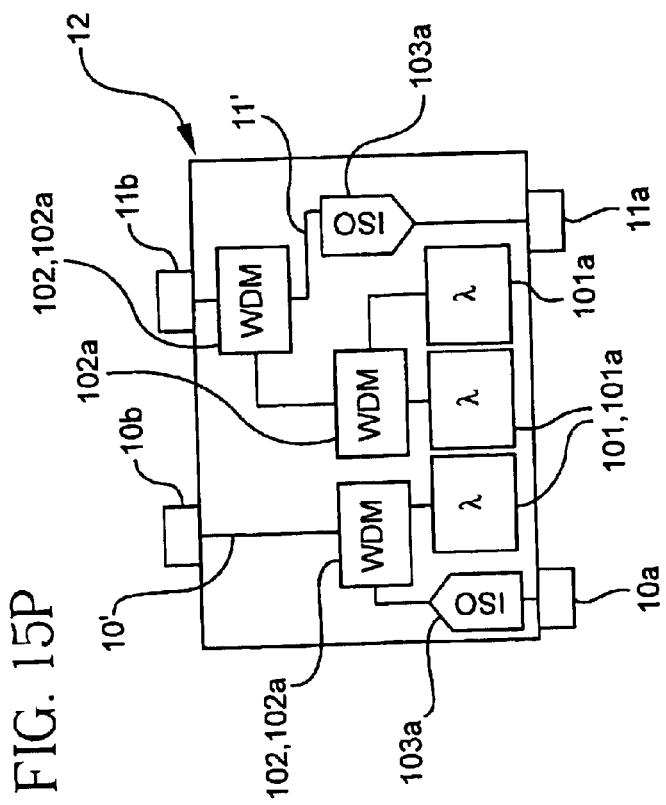
Figure 15R:
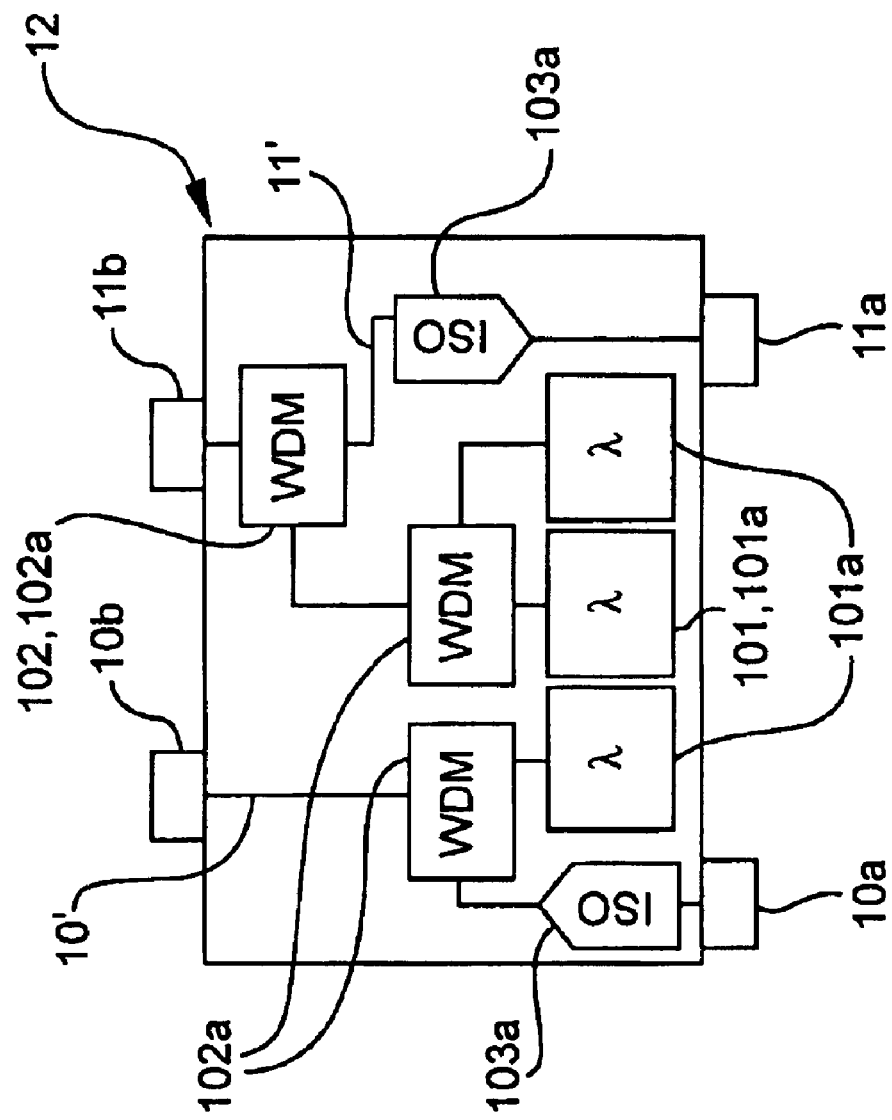

FIGS. 15a through 15c illustrate the configurable nature of the optical circuit 10' of the embodiment of the Optical Power Supply module 10 described above and illustrated in FIG. 1a.

As a specific example, an Optical Power Supply module 10 as shown in FIG. 15a, contains a laser source 101, a wavelength division multiplexer (WDM) 102, and an optical isolator 103. The optical isolator 103 is in the optical circuit 10' between the optical port 10a and the wavelength division multiplexer 102. That is, the output of isolator 103 and laser source 101 are multiplexed by WDM 102 and provided to the output port 10*b*. Module 10 of FIG. 15*a* is configurable during manufacture. For example, in FIG. 15*b*, the same module is constructed without the isolator 103, with the optical circuit 10' bypassing the vacant isolator position 103*a*. The laser source output (i.e., the output from the laser source 101 is provided to the wavelength division multiplexer 102 which is directly connected to the optical port 10*b*. Likewise, the Optical Power Supply module illustrated in FIG. 15*c* contains the same laser source 101, wavelength division multiplexer 102, and optical isolator 103, as FIG. 15*a*, with the optical isolator 103 present in the same location 103*a*, but in a reverse orientation. Thus, the Optical Power Supply module 10, can be configured, as needed, for example in three different ways, but can be manufactured efficiently using the same production line. The optical circuit 10' functions with isolator 103 absent or present, and if present, with isolator 103 in two different orientations. Thus, the Optical Power Supply module 10 is upgradable because its optical circuit contains position(s) and/or connection(s) to a at least one optional optical component such as, for ISO 103, WDM 102 and/or laser source(s) 101.

More specifically, as shown in FIG. 15*a*, if the construction of the Optical Power Supply module 10 uses conventional, pigtailed components, the optical circuit 10' would include a pigtailed isolator 103 spliced on the input end to an optical port connector 10*a*, and on the output end to one of the WDM 102 pigtail inputs. A pigtailed laser source 101 is spliced to the other optical port of the pigtailed WDM 102. The WDM output pigtail is spliced to the optical port connector 10*b*. In order to accomplish the configuration illustrated in FIG. 15*b*, the location 103*a* for isolator 103 is left vacant, and the WDM 102 input is spliced to the optical port connector 10*a*. To accomplish the configuration of FIG. 15*c*, the pigtailed isolator 103 is installed into the designated location 103*a*, with the input end spliced to the WDM 102 and the output end spliced to the input port 10*a*.

Alternatively, if the construction of the Optical Power Supply module 10 in FIG. 15*a* uses micro-optic components, the optical circuit would include an micro-optic isolator 103 in the path between the optical port connector 10*a* and one of the optical ports on a micro-optic WDM 102. A laser source diode 101 provides a laser source power that is coupled into the path through the other optical port of the micro-optic WDM 102. The micro-optic WDM 102 output is directed to the optical port connector 10*b*. In order to accomplish the configuration illustrated in FIG. 15*b*, the isolator 103 is absent from its position 103*a*, and the WDM 102 input is coupled to the optical port connector 10*a*. As described above, to accomplish the configuration in FIG. 15*c*, the isolator 103 is installed into the designated location 103*a*, but in a reverse orientation.

Alternatively, if the construction of the Optical Power Supply module 10 in FIG. 15*a* uses planar waveguides, certain optical components providing specific functions could be optionally produced in the optical path at predetermined locations by the application of electrical, optical, electromagnetic or thermal energy. For example, a grating could be optionally written into an optical fiber that forms a part of the optical circuit of the module.

FIGS. 15*d* through 15*g* illustrate the configurable nature of the optical circuit 11' of the embodiment of the Optical Power Supply module 11 illustrated in FIG. 1*b*. Similarly, FIGS. 15*h* through 15*r* illustrate the configurable nature of the optical circuits 10', 11' of the embodiment of the Optical Power Supply module 12 described above and illustrated in FIG. 1*c*. As shown in these figures, the Optical Power Supply Module 11 may utilize a plurality of laser sources 101. These laser sources may be of approximately the same, or alternatively, of different wavelengths.

FIGS. 16*a* through 16*i* illustrate the configurable nature of the optical circuit 30' of the embodiment of the Monitoring and Access module 30 illustrated in FIG. 1*e*. FIGS. 16*j* through 16*r* illustrate the configurable nature of the optical circuit 31' of the embodiment of the Monitoring and Access module 31 illustrated in FIG. 1*f*.

Figure 16B:
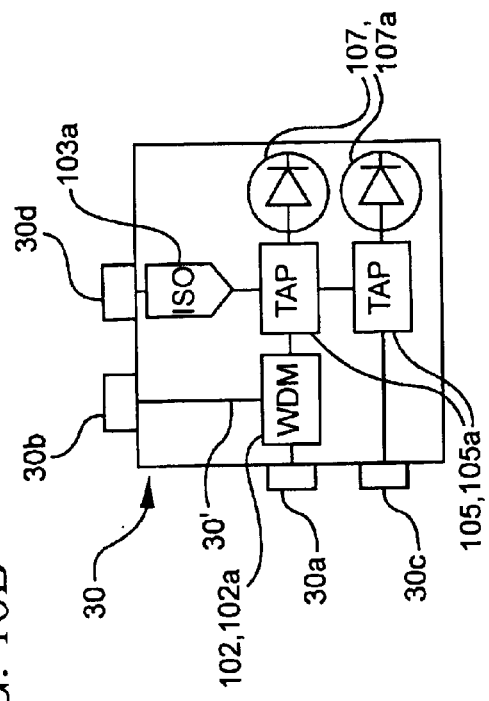
FIGS. 16a–16r illustrate, schematically, some examples of several configurations of the optical circuits 30' and 31' within the two embodiments of the Monitoring and Access modules illustrated in FIGS. 1e and 1f.
Figure 16C:
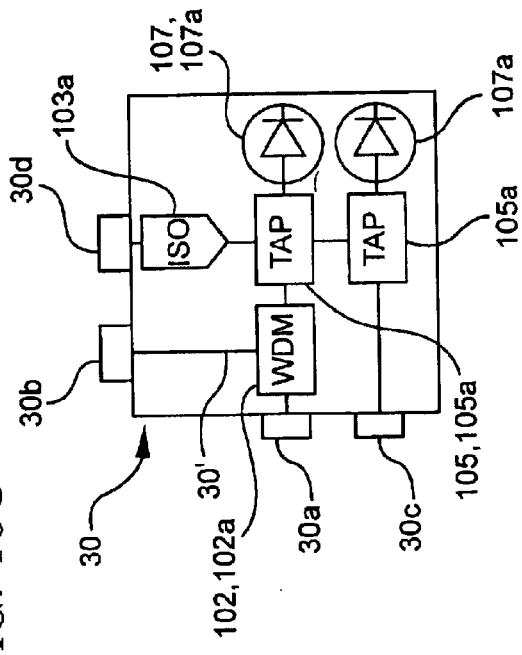
Figure 16A:
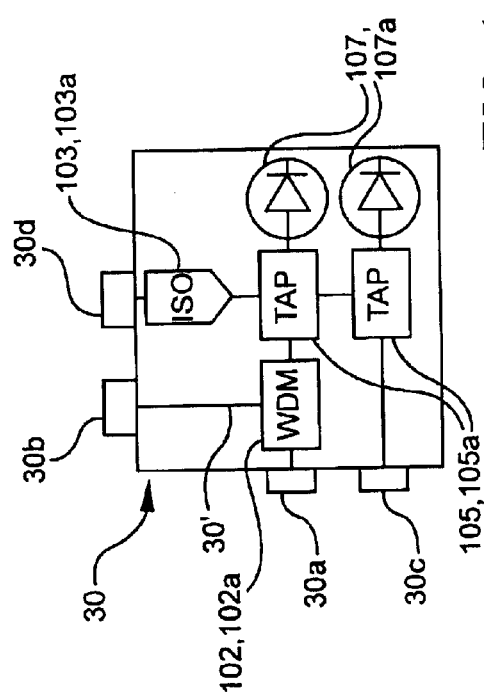

As a specific example, an Monitoring and Access module 30 as shown in FIG. 16*a*, contains a wavelength division multiplexer (WDM) 102 (located in a position 102*a*), a first optical tap 105 (in a first position 105*a*) and connected to the WDM 102. The first optical tap 105 is further connected to an optical isolator 103 (located in a position 103*a*), to a second optical tap 105 (located in a second position 105*a*), and to a first photodiode 107 (located in a first position 107*a*). The second optical tap 105 is connected to the optical port 30*c* and the second photodiode 107 located in the second position 107*a*.

Module 30 of FIG. 16*a* is configurable during manufacture. For example, in FIG. 16*b*, the same module is constructed without the isolator 103, with the optical circuit 30' bypassing the vacant isolator position 103*a*. Likewise, the Monitoring and Access module illustrated in FIG. 16*c* contains the same wavelength division multiplexer 102, and optical tap 105 with associated photodiode 107, as the module of FIG. 16*a*. However, it does not contain the second optical tap 105, and associated second photodiode 107.

Figure 16E:
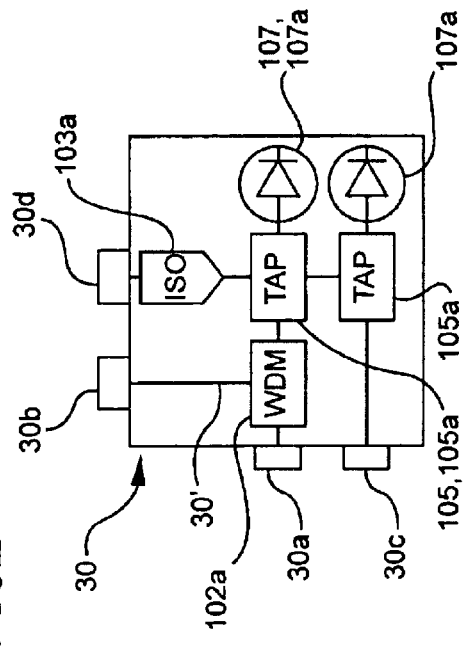
Figure 16F:
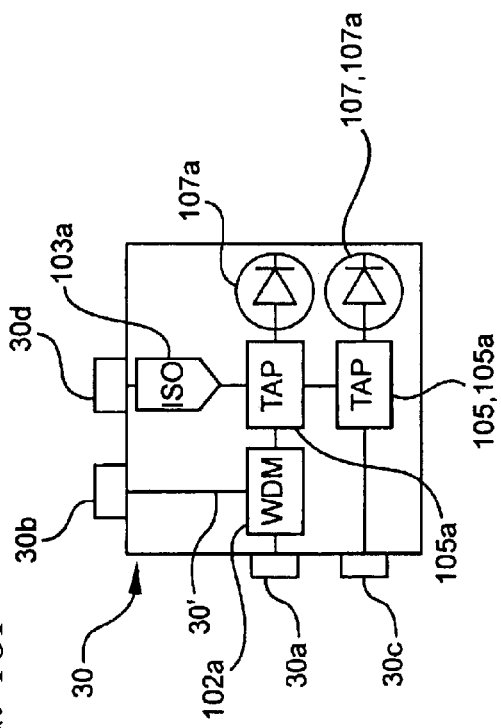
Figure 16D:
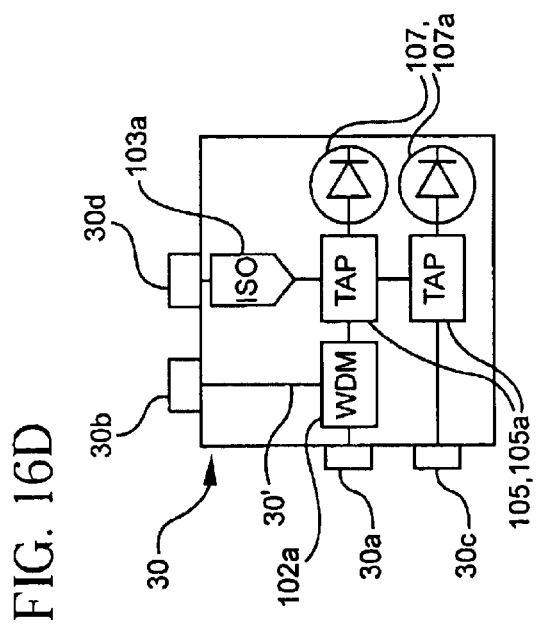

FIGS. 16*d*–16*f* illustrate other configurations of the Monitoring and Access modules 30. These embodiments of the module 30 do not contain the WDM 102 present in the modules illustrated in FIGS. 16*a*–16*c*. Therefore, the modules illustrated in FIGS. 16*d*–16*f* do not contain an open optical port 30*b*. Optical port 30*b* may be plugged to prevent contaminants from entering the module. Other, non-utilized ports, are also shown as a transparent outline.

Furthermore, the Monitoring and Access modules 30 of FIG. 16*f* utilizes only a second optical tap 105 and its associated photodiode 107, leaving the locations of the isolator 103*a*, first optical tap 105*a* and its associated first photodiode 107*a* vacant.

Figure 16H:
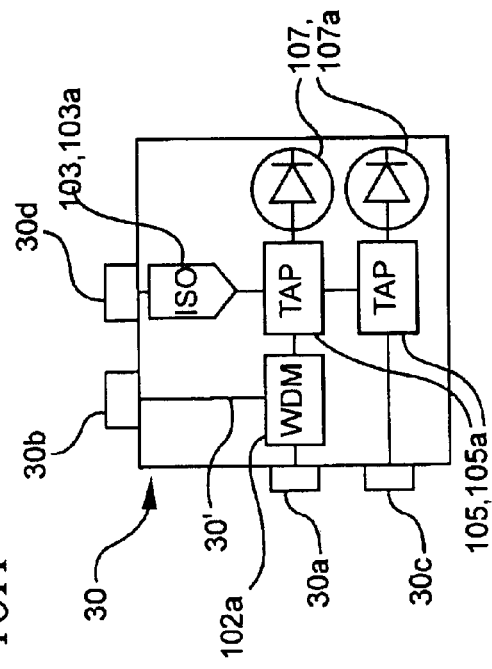
Figure 16I:
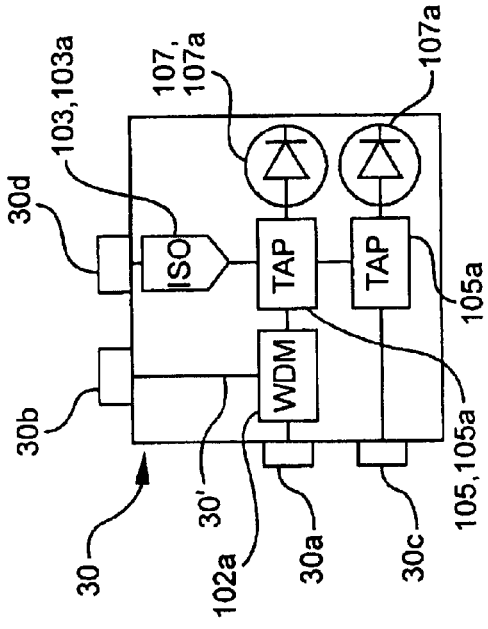
Figure 16G:
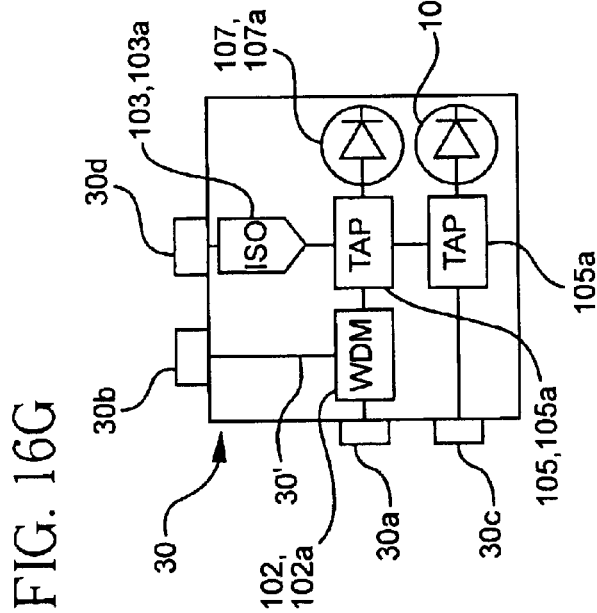
Figure 16J:
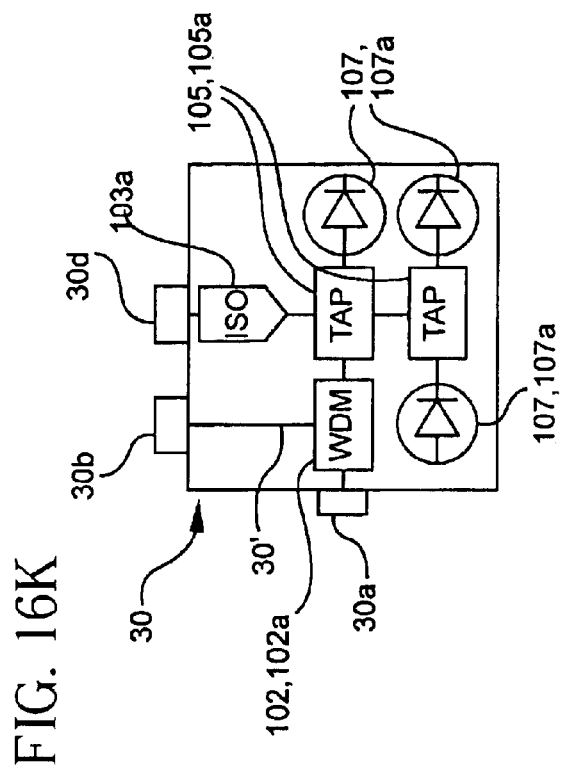
Figure 16K:
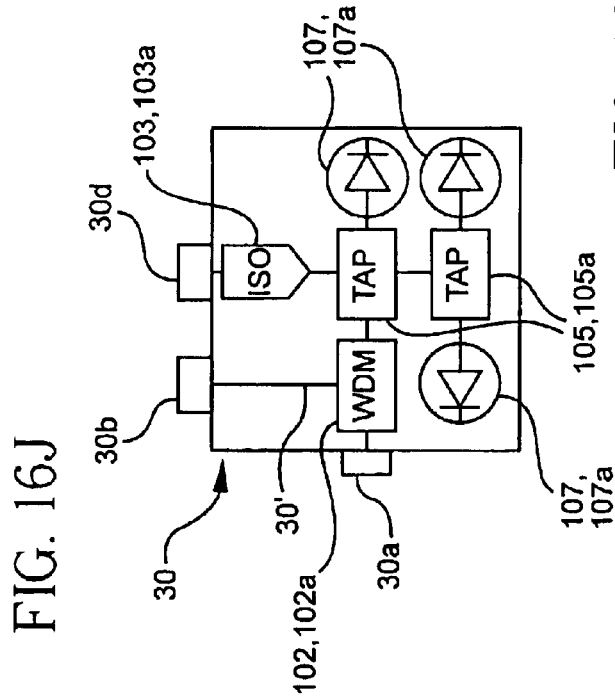
Figure 16L:
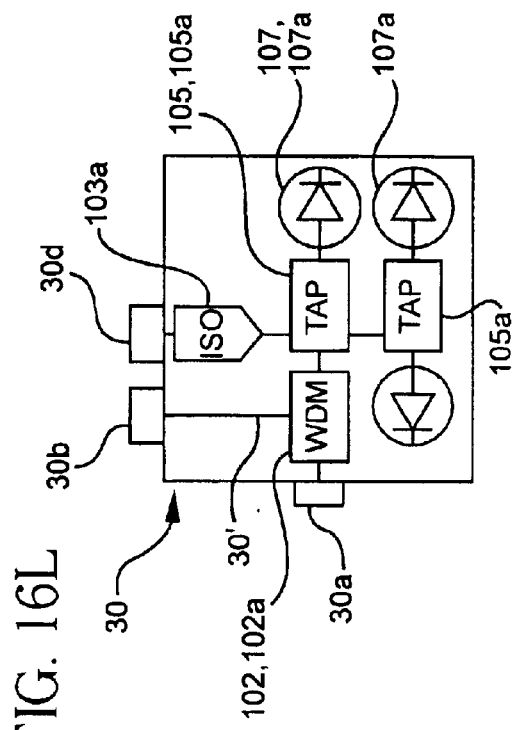
Figure 16Q:
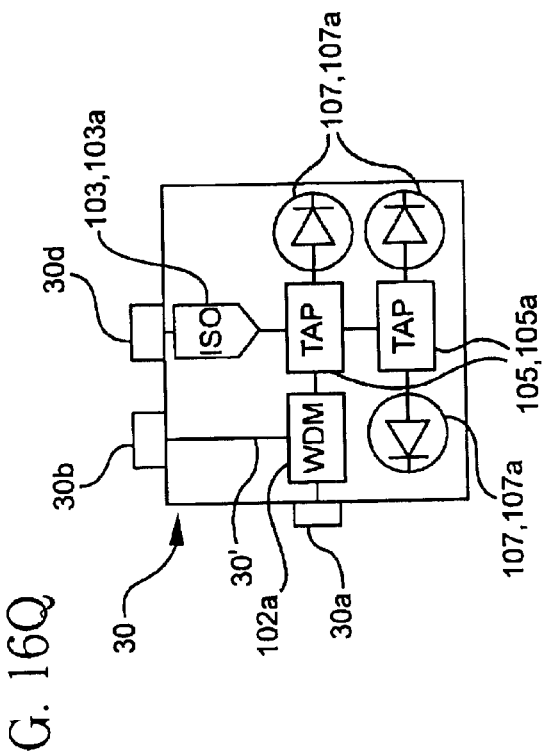
Figure 16R:
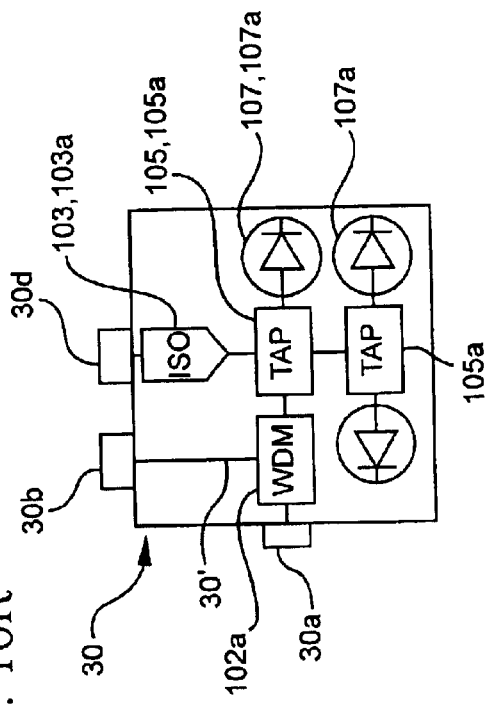
Figure 16P:
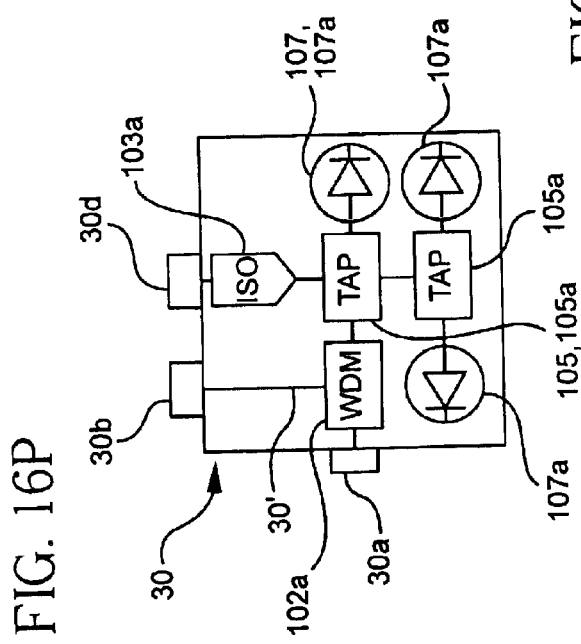

Thus, the Monitoring and Access module 30, can be configured, as needed, but can be manufactured efficiently using the same production line. The optical circuit 30' functions with the optional components absent or present, and if present, with isolator 103 in two different orientations. The Monitoring and Access modules shown in FIGS. 16*g*–16*i* are similar to the previously described modules 30, but include isolator 103 in its associated position 103*a*.

The Monitoring and Access modules shown in FIGS. 16*j*–16*r* are similar to the previously described modules 30, but include a position 107*a* for a third photodiode 107 associated with the second tap 105. In some of these figures, the module includes a third photodiode 107 situated in that position. Thus, as described above, Monitoring and Access modules can be upgraded to include additional, optional components.

The construction of the Monitoring and Access module may utilize conventional, pigtailed components, or micro-optic components, or planar waveguide components. Above.

Figure 17B:
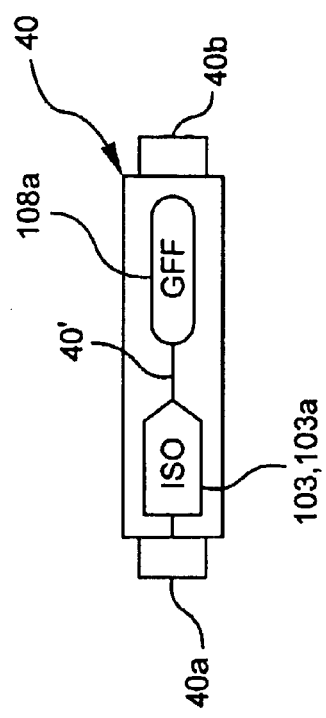
FIGS. 17a–17q illustrate, schematically, some examples of configurations of the optical circuits 40' and 41' within the three embodiments of the Optical Processing modules illustrated in FIGS. 1g, 1h, and 1i.
Figure 17A:
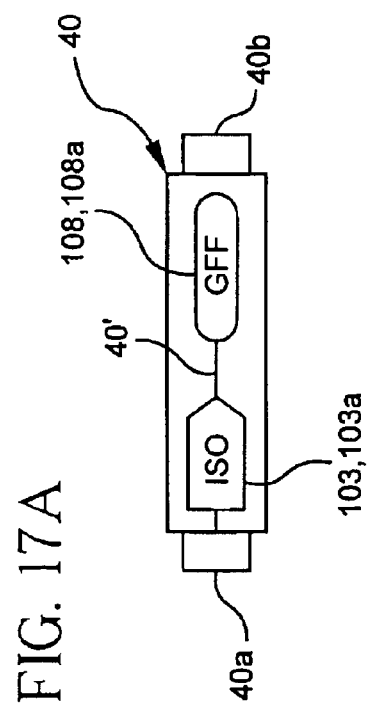
Figure 17C:
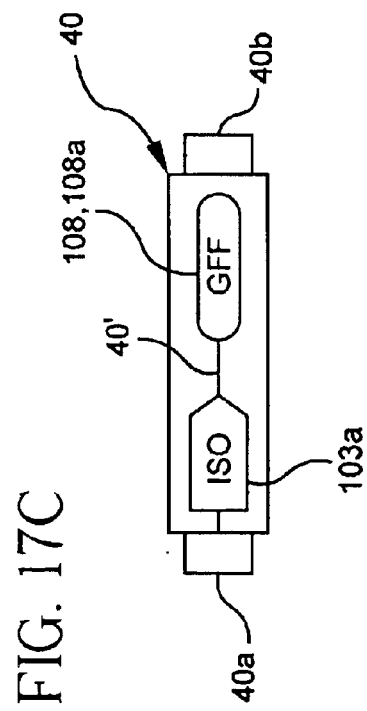
Figure 17E:
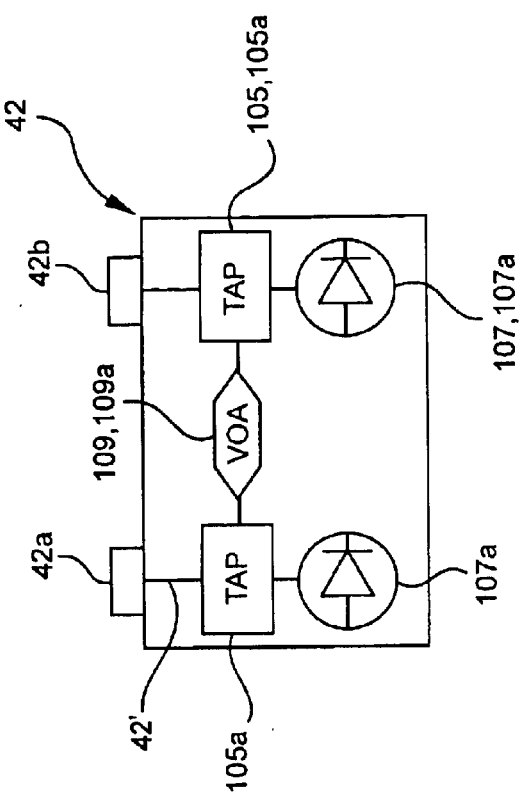
Figure 17D:
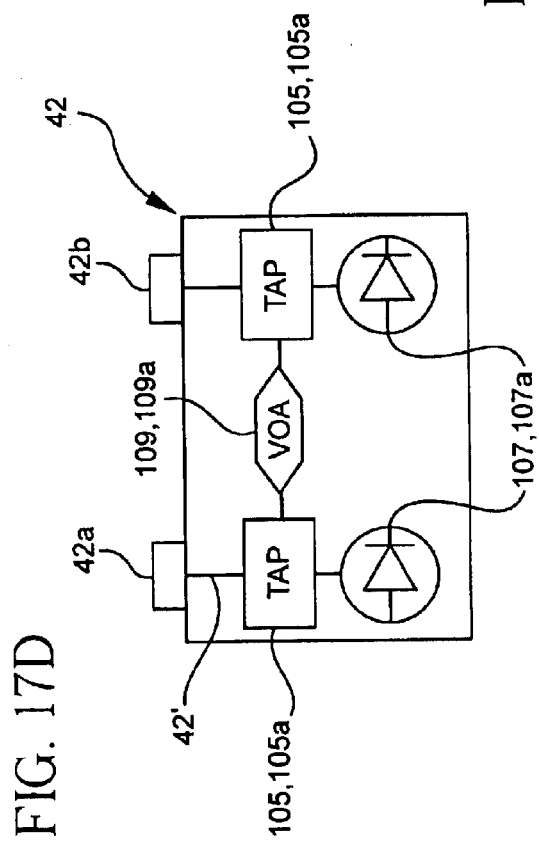
Figure 17G:
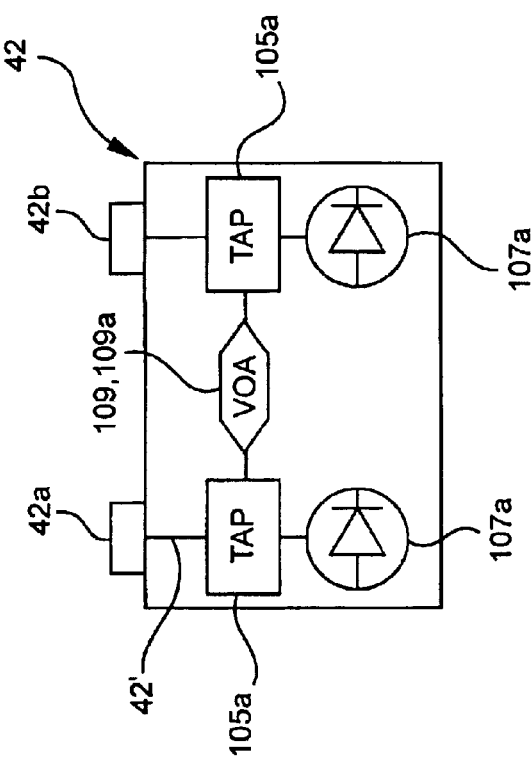
Figure 17F:
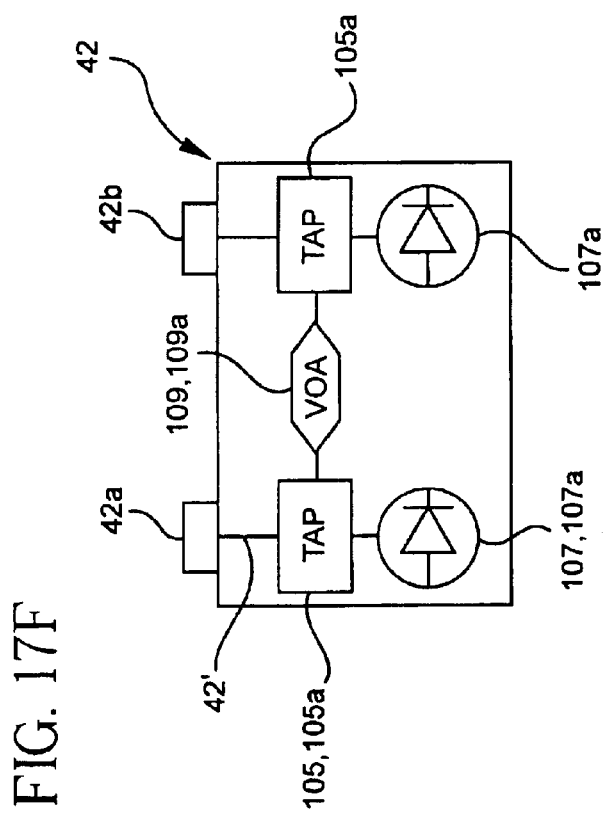
Figure 17I:
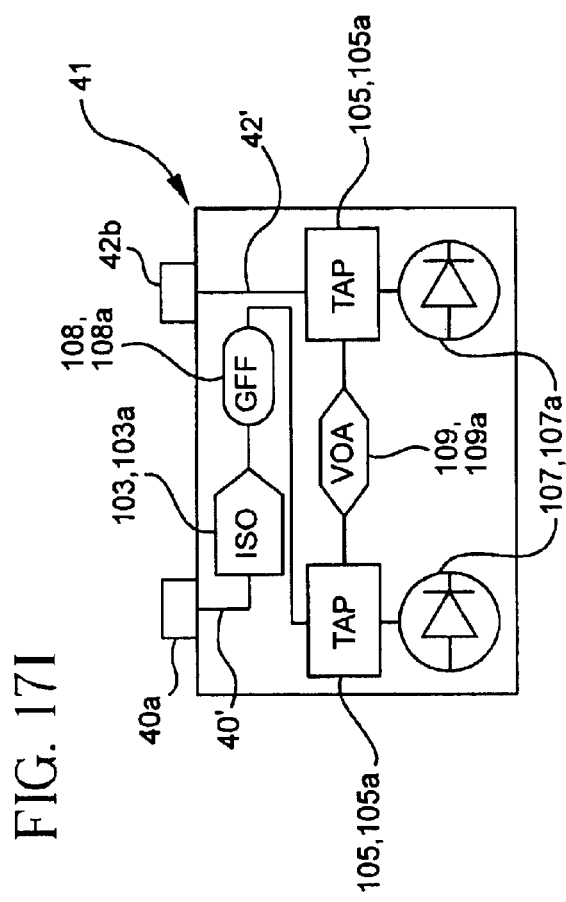
Figure 17H:
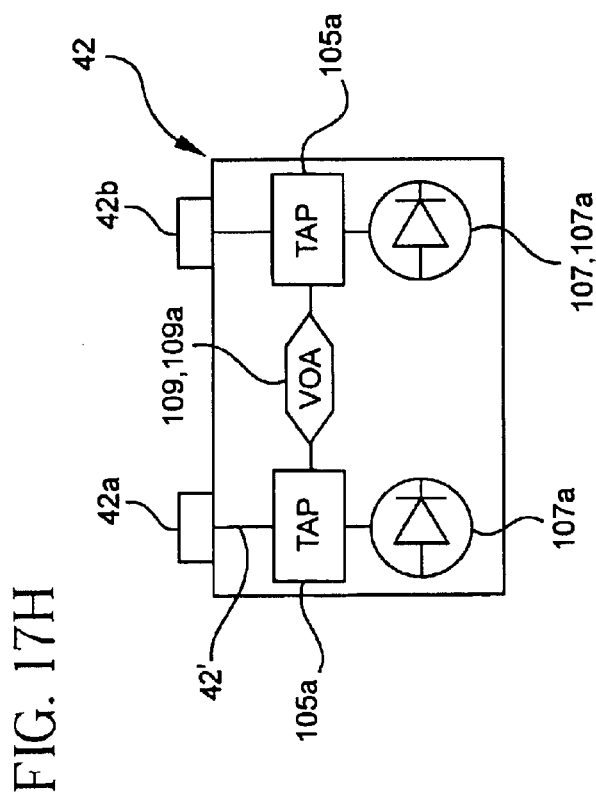
Figure 17K:
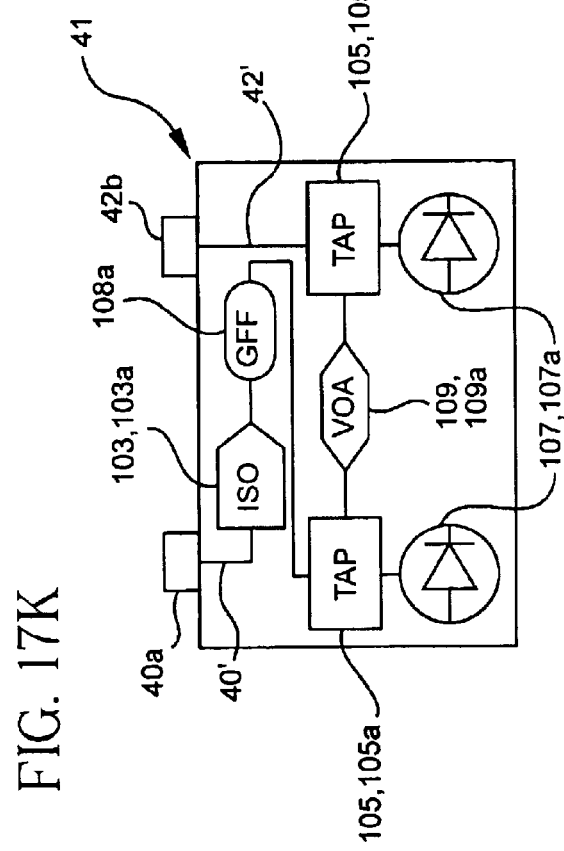
Figure 17J:
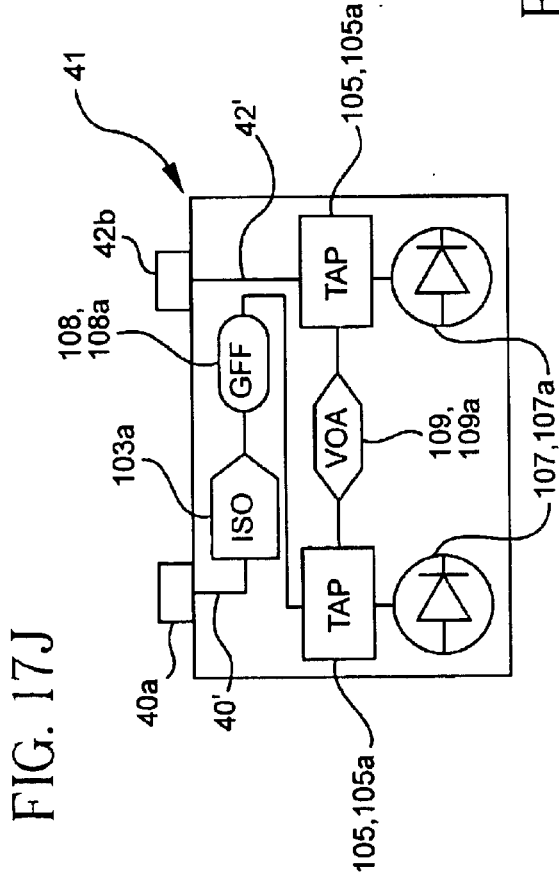
Figure 17L:
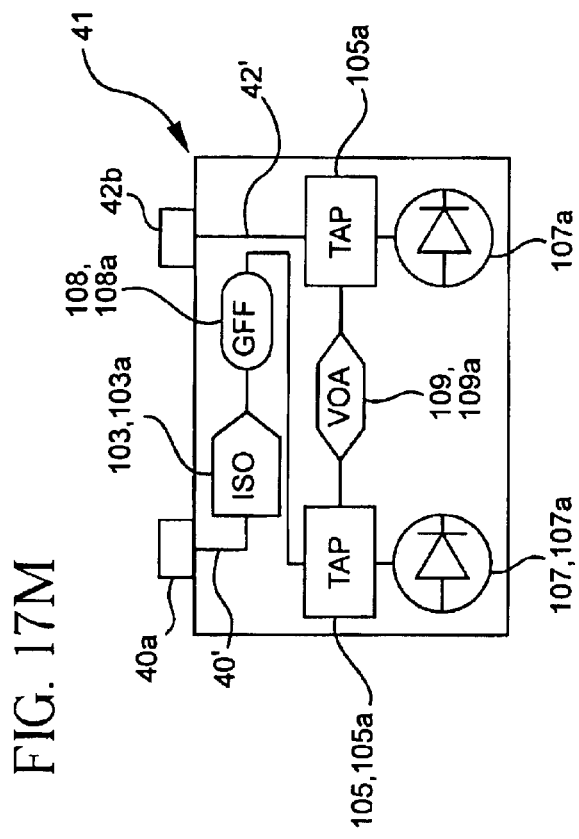
Figure 17M:
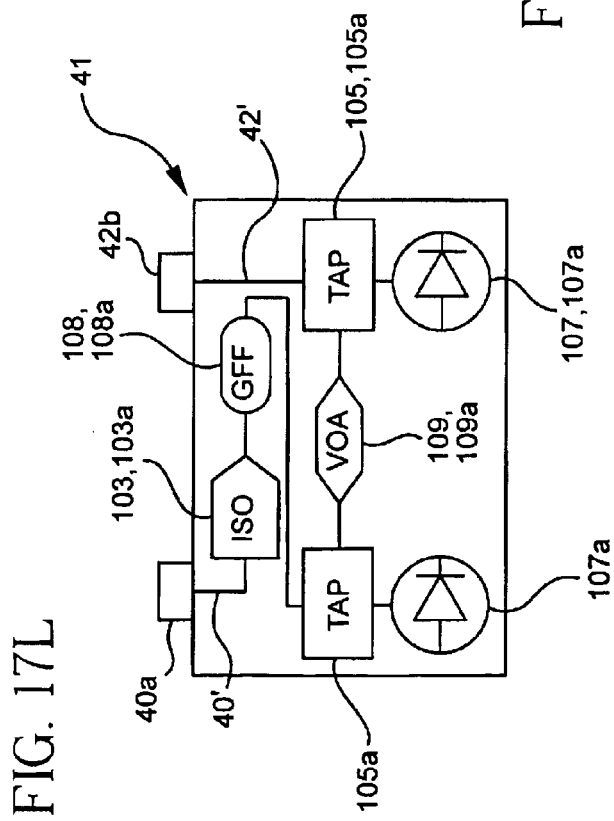
Figure 17O:
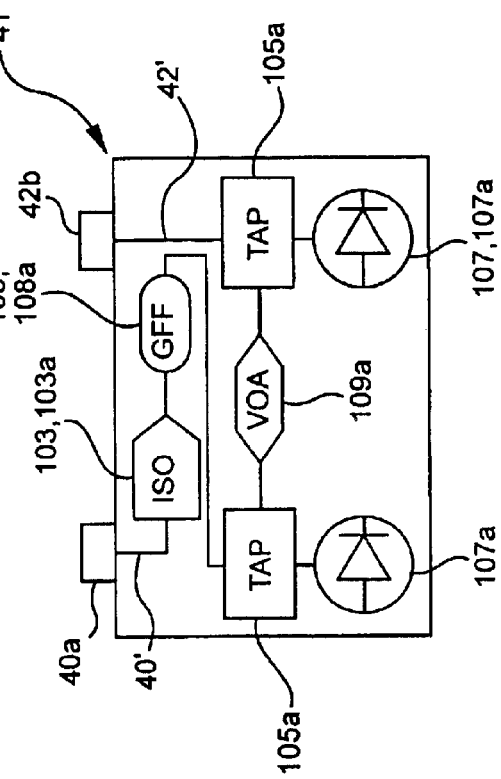
Figure 17N:
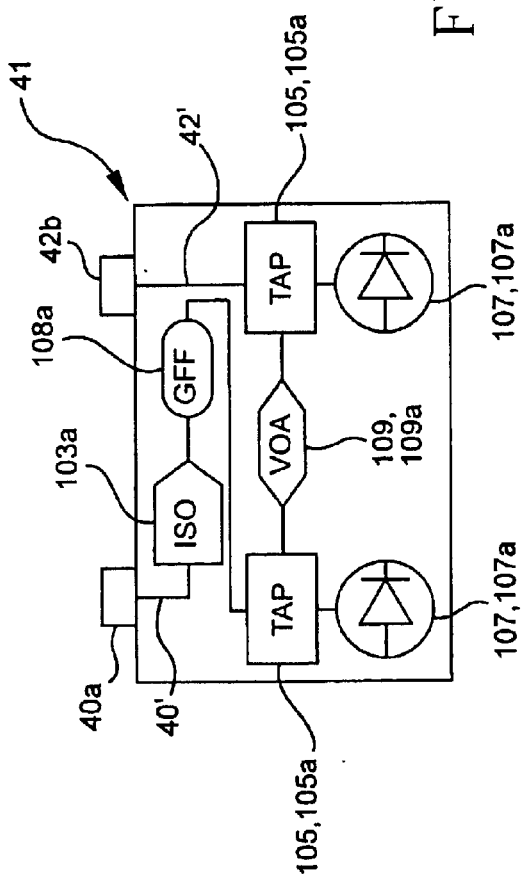
Figure 17P:
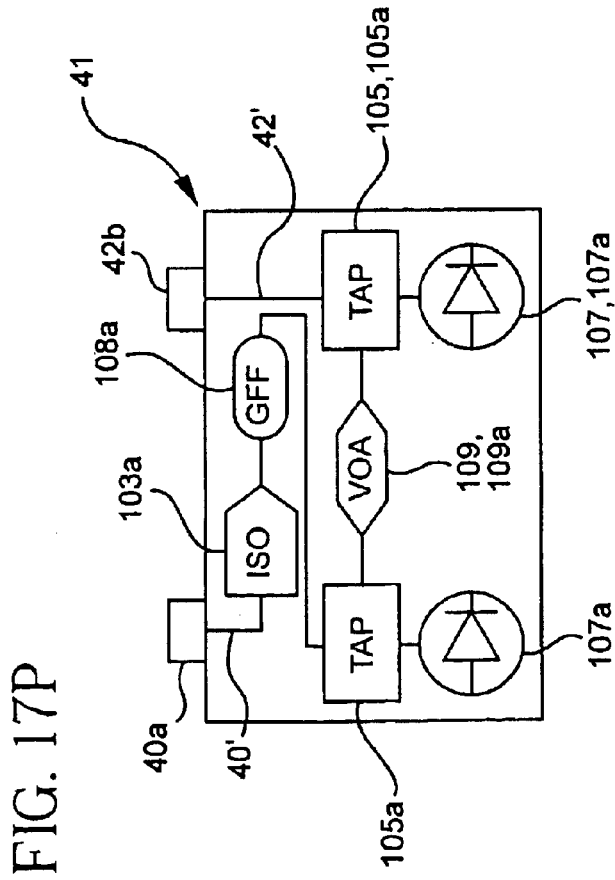
Figure 17Q:
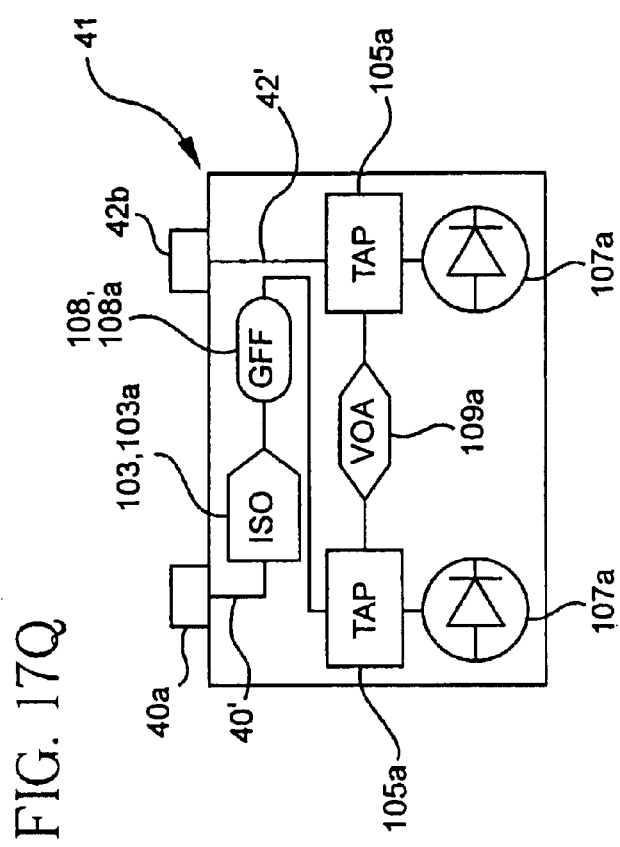

FIGS. 17*a* through 17*c* illustrate the configurable nature of the optical circuit 40' of the Optical Processing module 40 illustrated in FIG. 1*g*. This module includes positions 103*a* and 108*a* for and isolator 103 and GFF 108, respectively, that may be located between the ports 40*a* and 40*b*. As shown in FIGS. 17a–17c, either one, or both, of these positions many be occupied by the associated optical component.

FIGS. 17d through 17h illustrate the configurable nature of the optical circuit 42' of the Optical Processing module 42 illustrated in FIG. 1i. This module includes first and second positions 105a and 107a for first and second optical taps 105 and associated photodiodes 107, and a VOA 109 located between the first and second optical tap positions 105a. As shown in FIGS. 17d–17h, either one or both of the optical taps 107 and associated photodiodes 107, with the VOA 109, may be present in the module between ports 40a and 40b.

FIGS. 17i through 17q illustrate the configurable nature of the Optical Processing module 41, comprised of optical circuit 41' and 42', illustrated in FIG. 1h. More specifically, FIGS. 17i–17q illustrate that one or more of the optical or electro-optical components may be absent from its designated position(s). However, as shown above. Optical Processing modules can be upgraded to include these additional optional components.

In another example a Mach-Zehnder interferometer could be optionally written into the optical path within the Optical Processing module where, by thermal tuning for example, control could be exerted over the attenuation of the optical signal. This would provide filtering function similar to that provided by the VOA, while resulting in smaller optical losses and a more compact design.

Figure 18:
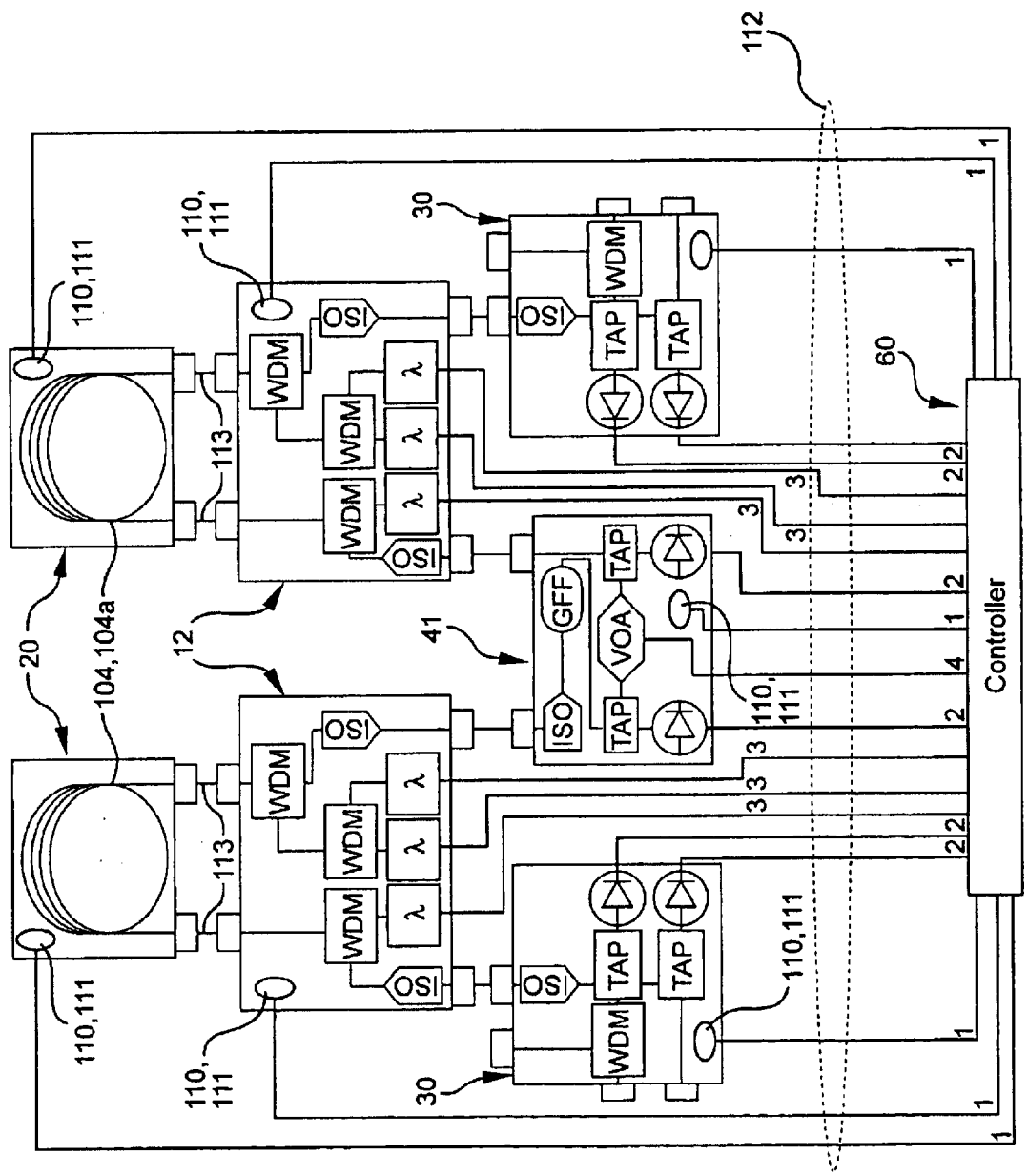
FIG. 18 illustrates, schematically, yet another embodiment of an optical amplifier of the present invention.

FIG. 18 illustrates, schematically, a further embodiment of the present invention includes at least one Controller module 60. The controller module 60 electrically communicates with the electrical and opto-electronic devices contained within the configuration of modules comprising the amplifier, so as to provide necessary power, command, control, alarming, and communication within the amplifier and within the network system. The Controller module 60 may include analog electronic components, digital electronic components, or a combination of both types of components. The Controller module 60 may also implement one or more different control algorithms. Although such algorithms are not described herein they are known to those skilled in the art. The control electronics and other components may be provided as a single module within an amplifier, or as a separate module, or several modules, in a distributed control network system. The controller module 60 is configured to interact with other modules and has input and output ports that correspond to output and input ports of other modules.

Furthermore, FIG. 18 illustrates an optical amplifier 10 comprised of the described modules, wherein at least one selected module includes at least one temperature sensor 110. An example of such a temperature sensor is a thermistor, for example, from OMEGA Engineering, INC., of Stamford, Conn.

A further embodiment of the present invention includes an optical amplifier further comprised of the described modules, wherein at least one selected module includes at least one (vi) passive or electrically driven heat transfer device 111. An example of such an electrically driven heat transfer device is a thermoelectric cooler (TEC) with heat convection fins (either heat dissipation or heat application fins). Such heat transfer device is available, for example, from Melcor Thermal Solutions of Trenton, N.J. A resistive heating element such as a thin flexible resistance heating circuit made of Dupont Kapton®, is available for example, from OMEGA Engineering, INC., Stamford, Conn. Alternatively, a heat transfer device may include convection cooling fins augmented by heat pipes, available for example, from Thermacore Inc. of Lancaster, Pa. Finally, any amplifier modules that include electrical or opto-electronic components are provided, as needed, with appropriate (vii) electrical connections 112 to communicate electrically with power sources and controllers. The heat transfer device may also be a heat sink that routes excess thermal energy away from the amplifier assembly. Such a heat sink is available, for example, from Aavid Inc. of One Kool Path, Laconia, N.H.

According to an embodiment of the present invention, where a plurality of amplifiers are to be co-located within a network system installation, the amplifier modules utilized in the individual amplifiers may be grouped according to module type. Amplifier modules are mounted to each other or to a common support structure, while being optically and electrically connected to the other modules within the amplifier's optical circuit.

As shown, for example in FIGS. 19a–19l, according to an embodiment of the present invention, the optical connections 113 between amplifier modules are comprised of at least one of the following types of connections: optical fiber connections, free-space optic connections, or direct contact of optical elements such as planar waveguide devices, lenses, or optical waveguides.

Figure 19A:
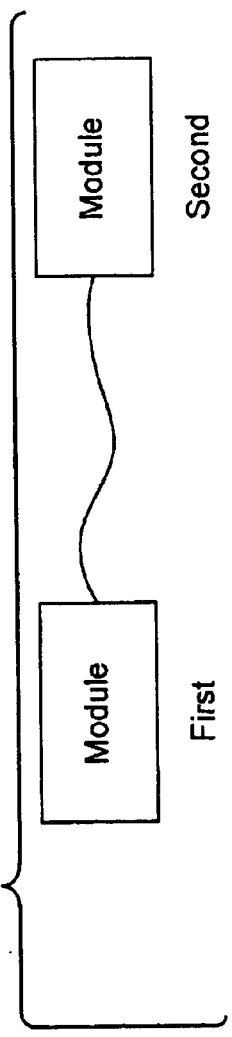
FIGS. 19a–l illustrate, schematically, nine embodiments of optical connections between modules.
Figure 19B:
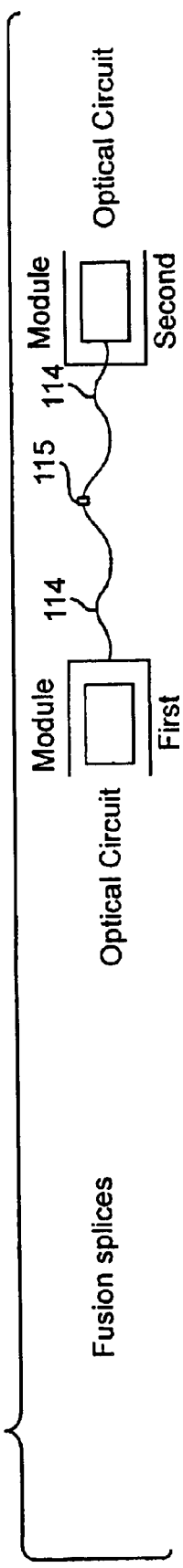
Figure 19C:
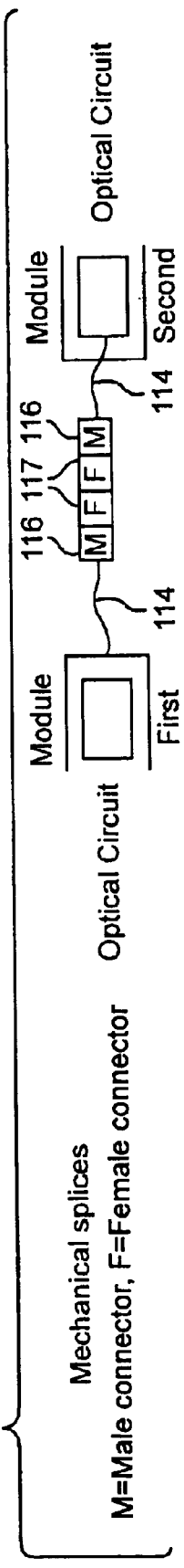
Figure 19D:
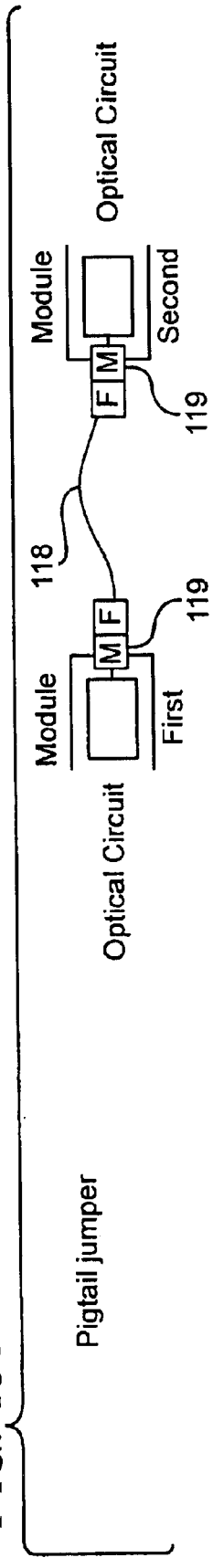

FIGS. 19a–19d illustrate, schematically, examples of alternative embodiments of optical fiber connections that may be used to optically connect amplifier modules 10, 11, 12, 20, 30, 31, 40, 41, 42 and 50. FIG. 19a generally illustrates an optically connected first and second module. Specifically, FIG. 19b illustrates, schematically, one fiber pigtail 114 from each of any two first and second amplifier modules 10, 11, 12, 20, 30, 31, 40, 41, 42, 50 that are optically connected with a fusion splice 115. FIG. 19c illustrates, schematically, that one fiber pigtail 114 from each of any two amplifier modules 10, 11, 12, 20, 30, 31, 40, 41, 42, 50 is terminated with a mechanical connector 116. Such mechanical connectors 116 may be male connectors, available, for example, from Diamond USA Inc., of Chelmsford, Mass. The two pigtails are optically connected via a second mechanical mating adapter 117. Such second mechanical mating adapter 117 may be a female-female mating adapter, available from, for example, Diamond USA Inc. of Chelmsford, Mass. FIG. 19d illustrates, schematically, two amplifier modules 10, 11, 12, 20, 30, 31, 40, 41, 42, 50 optically connected via a fiber optic jumper 118, between fiber optic bulkhead fittings 119 on each of the two modules. Such bulkhead fittings may be in the form of male connectors attached to the modules. Fiber optic jumper 118 are available, for example, from Corning Cable Systems LLC of Hickory, N.C., while fiber optic bulkhead fittings 119 are available from, for example, from Diamond USA Inc., Chelmsford, Mass.

Figure 19E:
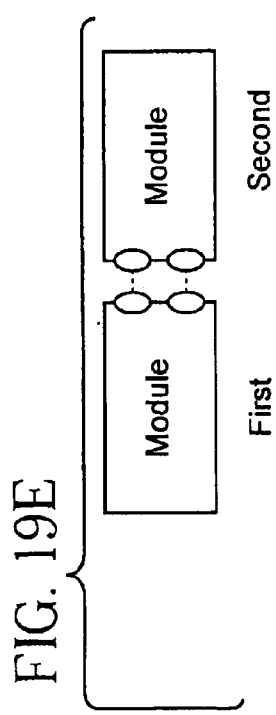
Figure 19F:
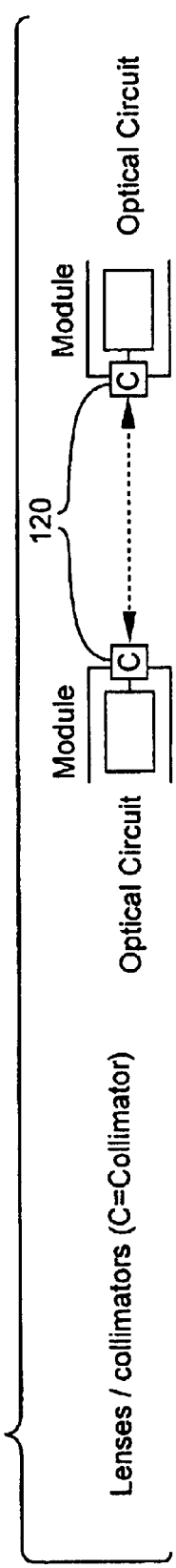
Figure 19G:
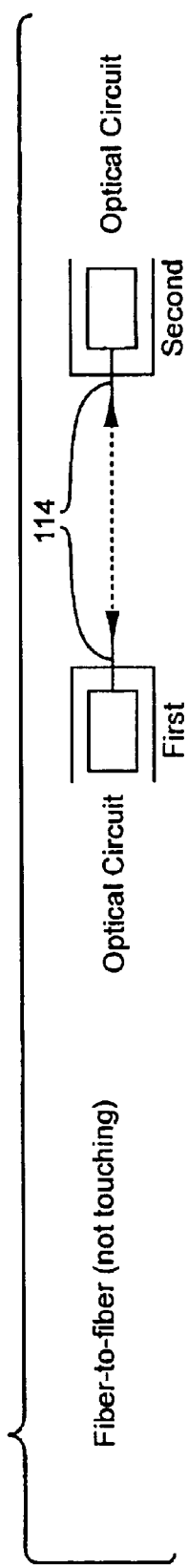
Figure 19H:
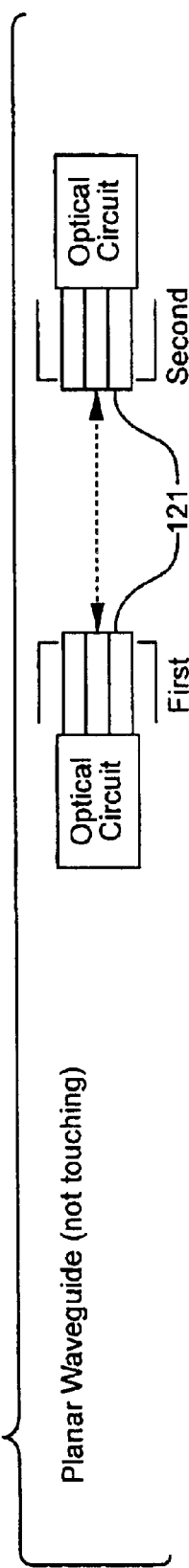

Alternatively, FIGS. 19e–19h illustrate, schematically, examples of free-space optical connections that may be used to optically connect amplifier modules 10, 11, 12, 20, 30, 31, 40, 41, 42 and 50. FIG. 19e generally illustrates an optically connected first and second module using free-space optics. Specifically, FIG. 19f illustrates, schematically, one focusing/alignment element 120 from each of any two first and second amplifier modules 10, 11, 12, 20, 30, 31, 40, 41, 42, 50 that optically communicate with each other without physical contact. Such a focusing/alignment element may include lenses, collimators, or mirrors. FIG. 19g illustrates, schematically, one fiber pigtail 114 from each of any two amplifier modules 10, 11, 12, 20, 30, 31, 40, 41, 42, 50 that are mechanically located so as to optically communicate with each other without physical contact. More specifically, the two facing ports 114 of the two adjacent modules, are located no more than 1 mm apart, and preferably, in order to minimize optical power loss, 0.1 mm apart or less. This may be facilitated, for example, by thermally expanding the core of each fiber to expand the waveguide mode field diameter and thereby reduce the numerical aperture of each fiber to an extent that enables the distance between the fibers to be substantially increased without incurring a significant communication loss penalty between the two fibers when they are spaced by more than 1 mm. Such approaches are disclosed, for example, in U.S. Pat. No. 6,275,627, incorporated by reference herein. FIG. 19h illustrates, schematically, two amplifier modules 10, 11, 12, 20, 30, 31, 40, 41, 42, 50 optically connected via planar waveguide ports 121 (available from Corning Cable Systems GmbH & Co., of Munich, Germany), that optically communicate with each other without physical contact.

Figure 19I:
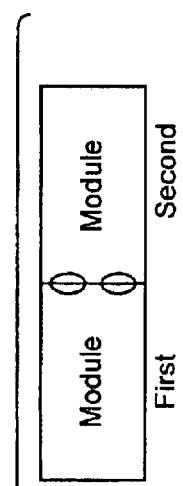
Figure 19J:
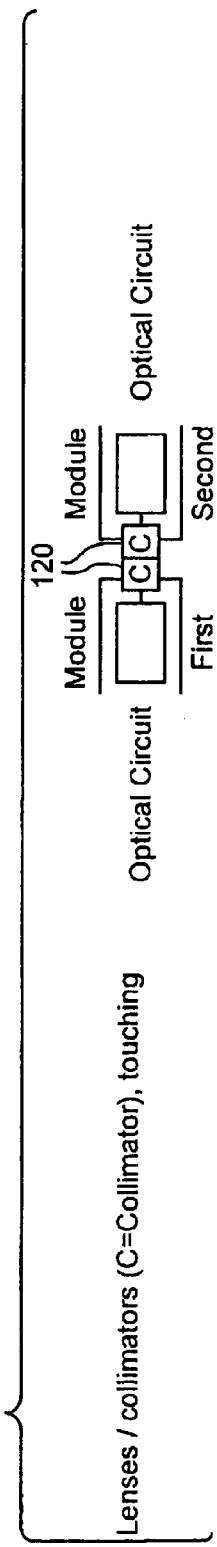
Figure 19K:
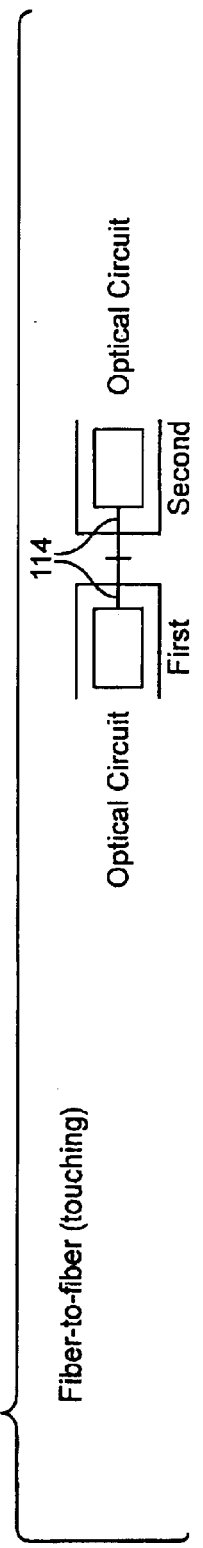
Figure 19L:
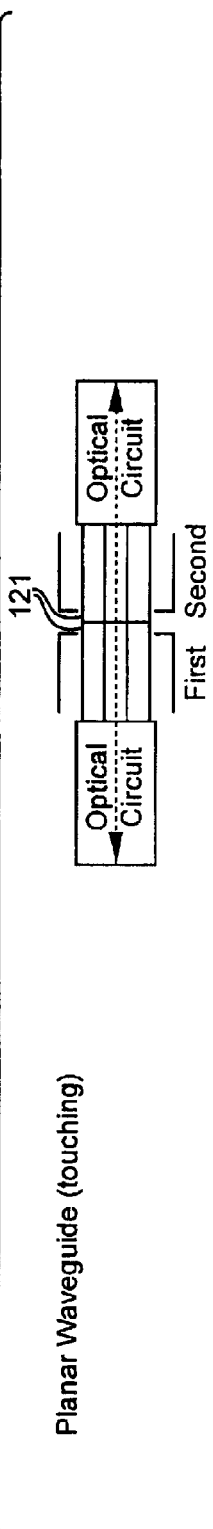

Alternatively, FIGS. 19i–19l illustrate, schematically, examples of alternative embodiments of direct mechanical optical connections that may be used to optically connect amplifier modules 10, 11, 12, 20, 30, 31, 40, 41, 42 and 50. FIG. 19i generally illustrates an optically connected first and second module using free-space optics. Specifically, FIG. 19j illustrates, schematically, one focusing/alignment element 120 from each of any two amplifier modules 10, 11, 12, 20, 30, 31, 40, 41, 42, 50 that optically communicate with each other while in intimate physical contact. Such a focusing/alignment element may include lenses, collimators, or mirrors. FIG. 19k illustrates, schematically, one fiber pigtail 114 from each of any two amplifier modules 10, 11, 12, 20, 30, 31, 40, 41, 42, 50 that are mechanically located so as to optically communicate with each other with intimate physical contact. This can be achieved, for example, by aligning and attaching the two fibers with a mechanical fiber splice. FIG. 19l illustrates, schematically, two amplifier modules 10, 11, 12, 20, 30, 31, 40, 41, 42, 50 optically connected via a planar waveguide ports 121 that optically communicate with each other with intimate physical contact. This can be achieved, for example, by aligning two planar waveguides, abutting them together, and mechanically fixing them in their relative positions with respect to one another.

Although mechanical connections between fibers may be somewhat more expensive than fusion spliced fiber connections, mechanical connectors are preferable for use between some of the modules in some applications. Mechanical connectors allow for easy detaching and connection of modules, when upgrades (preferably in-service upgrades) of the modules are required. For example, if a different, upgraded optical power supply module is required, the original optical power supply module is detached and an upgraded optical power supply module is re-connected in its place. Other modules may also be upgraded as needed or desired by the end user. The upgrades would usually consist of replacing only those modules or components necessary to upgrade capability, not the replacement of the entire amplifier.

According to further embodiments of the present invention, the optical circuits according to module type may be replicated within a selected module to further reduce manufacturing cost. Using a "ganged" method, similar circuits are replicated as individual circuits with individual optical paths, and grouped, or "ganged", within a common module, as shown, for example, in FIGS. 20a–20j. Alternatively, a "parallel" method may be used, where like circuits are replicated as individual circuits with individual optical paths within a common module, but with portions of the optical path shared within common optical elements, as shown, for example, in FIGS. 21a–21i. The "ganged" and "parallel" module types may be configurable, as shown in the examples in FIGS. 22a–22d.

Figure 20B:
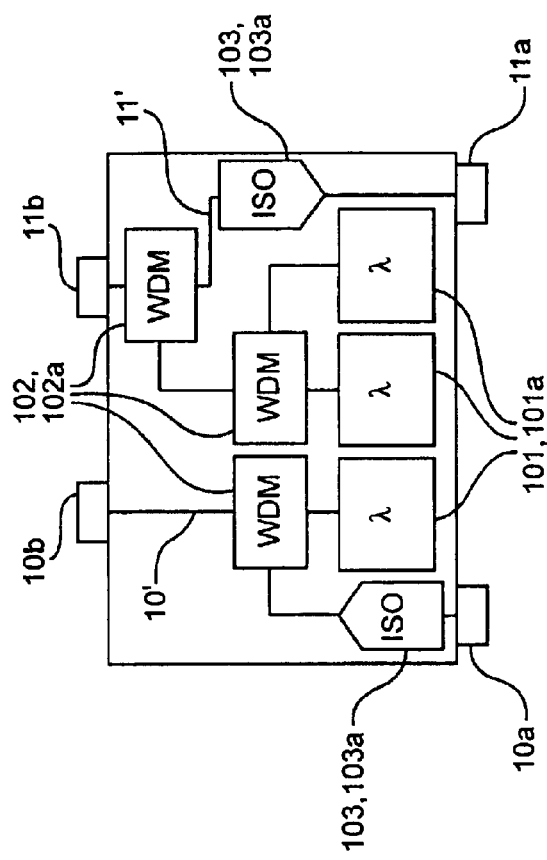
FIGS. 20a–20i illustrate, schematically, nine embodiments of multiple optical circuits provided within various amplifier modules, each optical circuit comprising it's own independent optical ports and optical components.
Figure 20A:
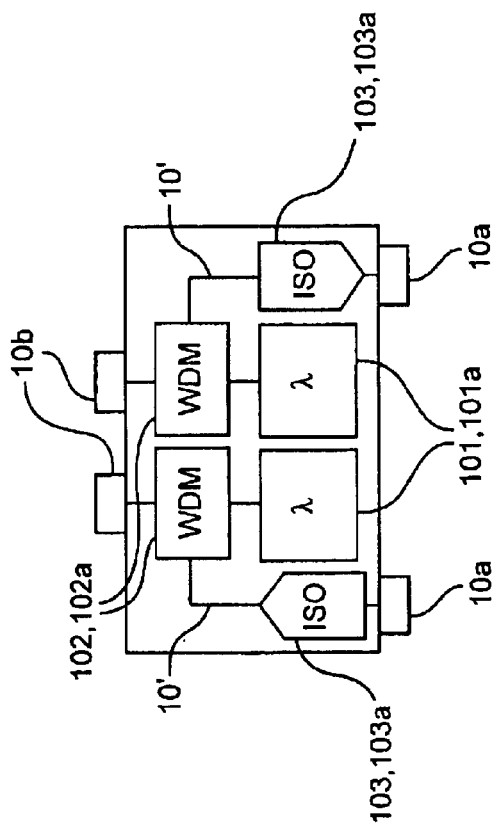

The "ganged" approach is illustrated schematically in FIGS. 20a–20i where, for example, in FIG. 20a, two optical circuits 10' from FIG. 1a, are provided in the same optical power supply module. FIG. 20b illustrates that the optical circuit 10' from FIG. 1a and the optical circuit 11' of FIG. 1b are provided in the same optical power supply module.

Figure 20D:
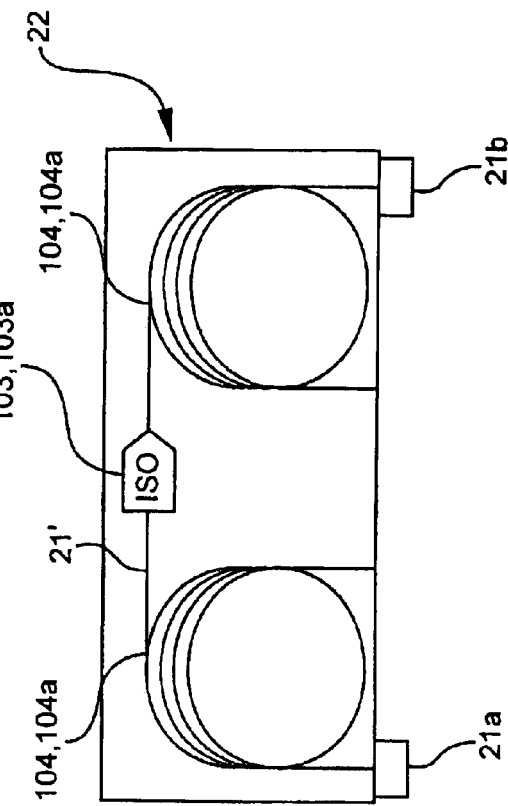
Figure 20C:
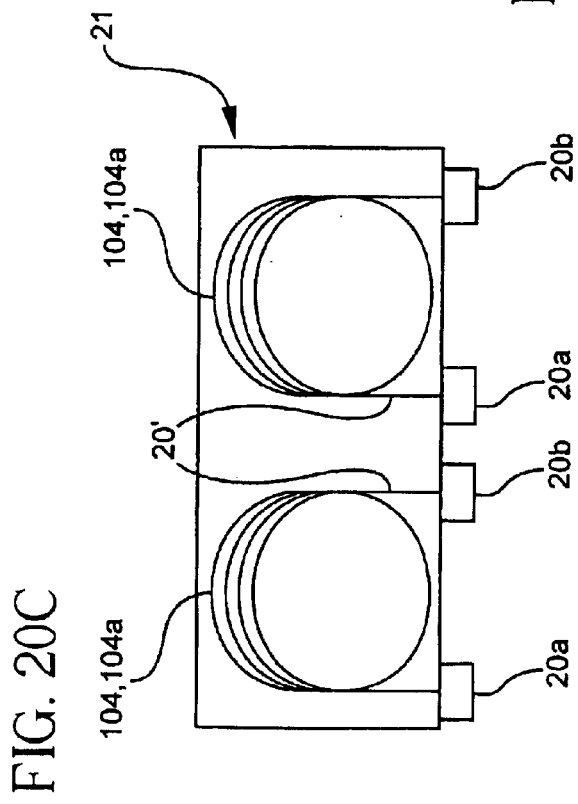

FIG. 20c illustrates, schematically, ganged amplification module 21. More specifically, this figure illustrates two optical circuits 20' of FIG. 1d, contained in the single amplification module 21. FIG. 20d illustrates a further embodiment of Amplification module. This module includes two optical circuits 20', co-joined to an optical isolator 103 (forming a single circuit 21'). The optical circuit 21' is connected to optical ports 21a and 21b. This configuration provides optical isolation between the two amplification media and prevents leakage of back-propagating light. The Amplification module of FIG. 20d eliminates the need for additional optical ports 20b and 20a, (located between the two amplification medium coils) shown in FIG. 20c and eliminates optical losses associated with these ports.

Figure 20E:
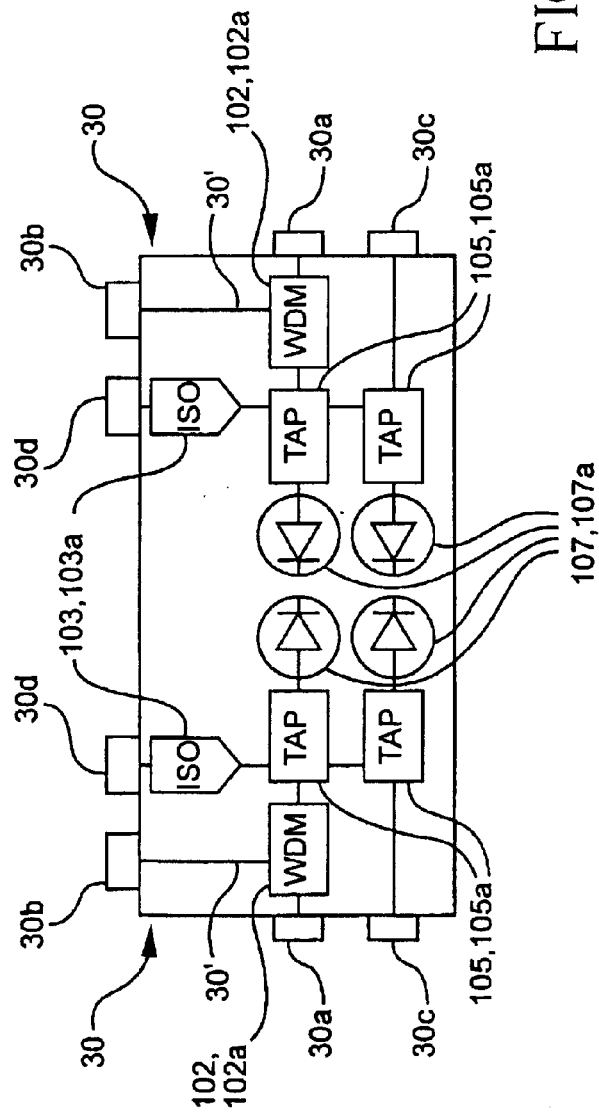

FIG. 20e illustrates, schematically, two identical optical circuits 30' from FIG. 1e, provided in the same Monitoring and Access module. Although the Monitoring and Access module of FIG. 20e contains all optical and electro-optical components in their designated positions, depending on particular application, not all of the component positions need to be occupied.

Figure 20F:
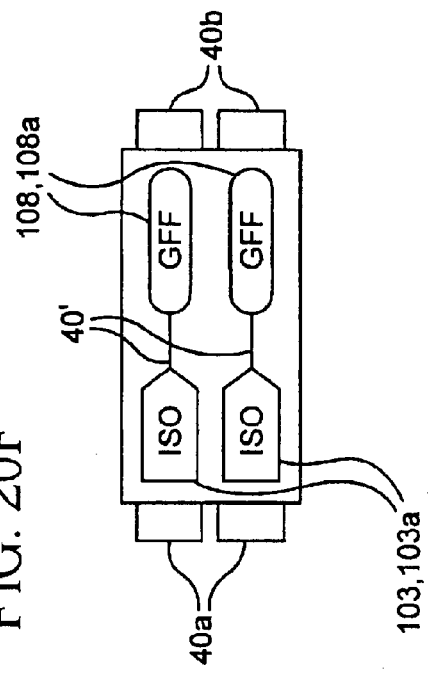
Figure 20H:
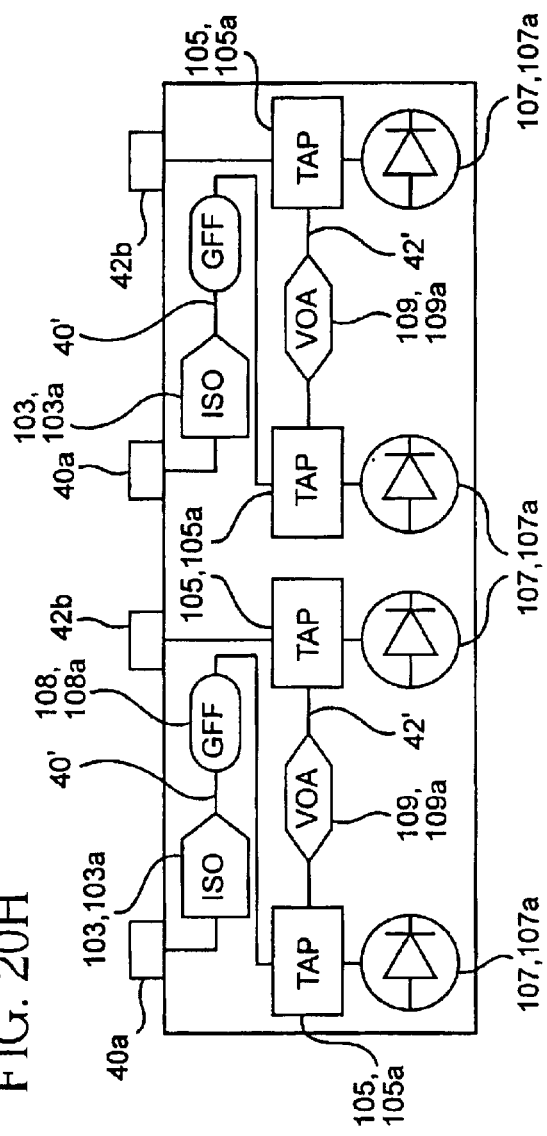
Figure 20G:
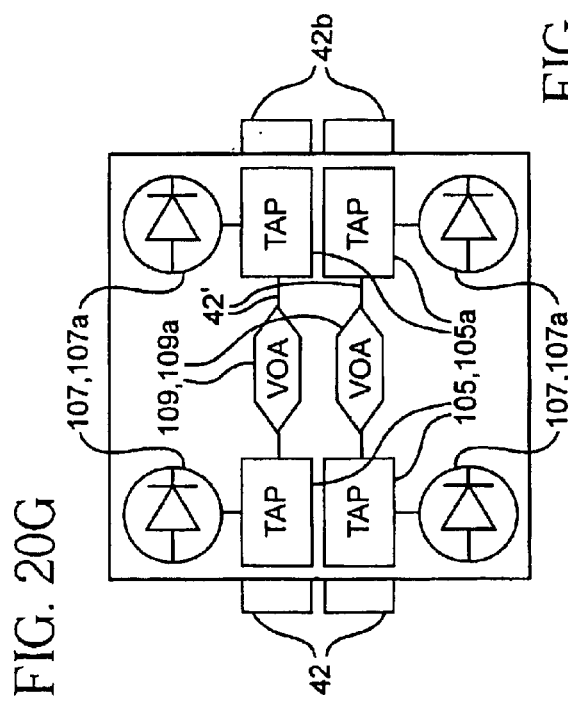

FIGS. 20f and 20g illustrate two ganged examples of the Optical Processing modules. More specifically, FIG. 20f illustrates, schematically, a single Optical Processing module containing two optical circuits 40' of FIG. 1g. FIG. 20g illustrates, schematically, a single Optical Processing module containing two optical circuits 42' of FIG. 1i.

FIG. 20h illustrates a single Optical Processing module containing two optical circuits 41' of FIG. 1h.

Figure 20I:
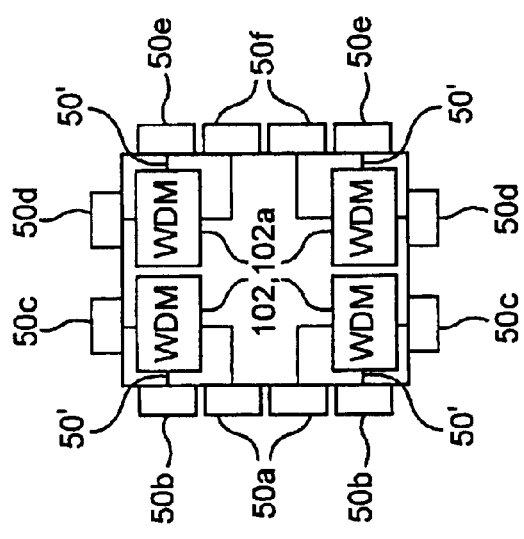

FIG. 20i illustrates, schematically, a Telemetry Add/drop module containing two optical circuits 50' of FIG. 1j.

Figure 21A:
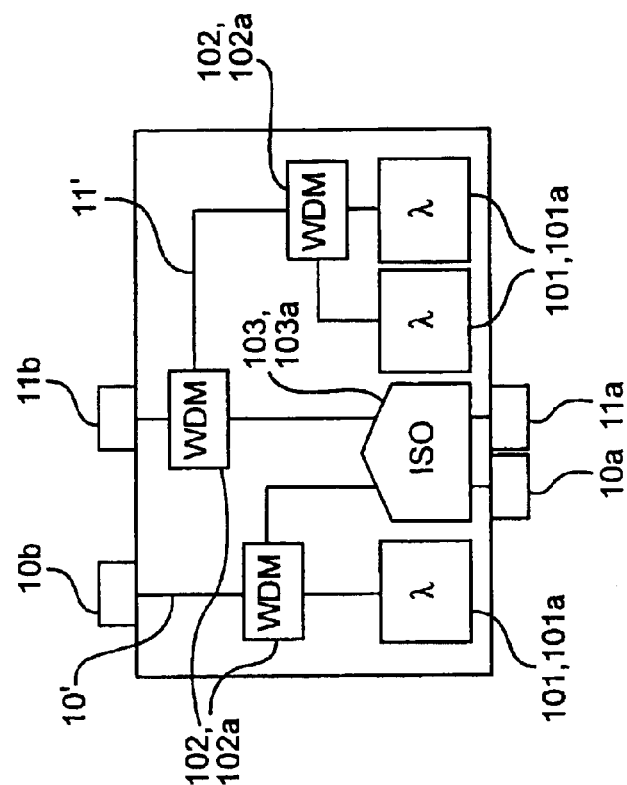
FIGS. 21a–21i illustrate, schematically, eight embodiments of multiple optical circuits provided within various amplifier modules, each optical circuit possessing it's own independent optical ports, but sharing at least one optical component.

The "parallel" approach is illustrated schematically in FIGS. 21a–21i. FIG. 21a, illustrates, schematically, an Optical Power Supply module that includes two optical circuits 10', 11' of FIGS. 1a, 1b, but with the optical isolator 103 element shared by both optical circuits 10', 11'. Therefore, this Optical Power Supply module eliminated the need for an additional isolator, present for example, in the Optical Power Supply module of FIG. 20b.

Figure 21C:
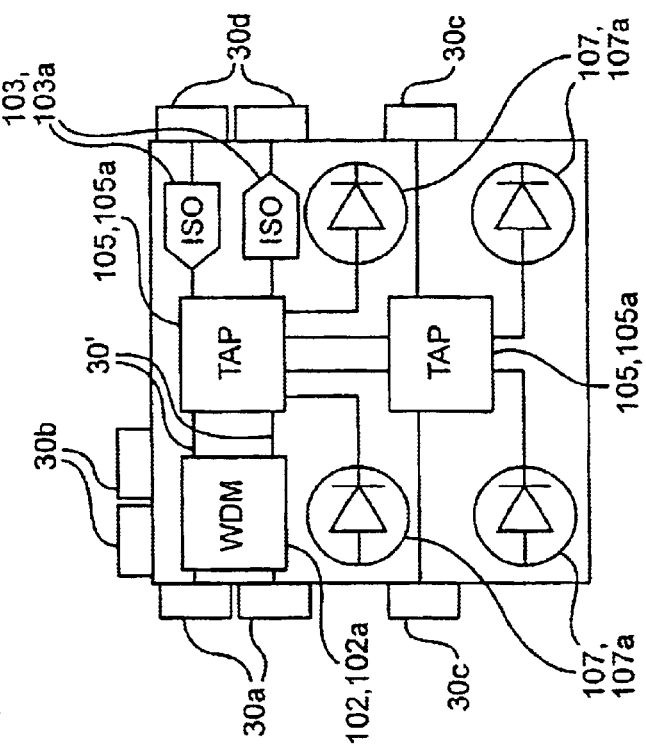
Figure 21B:
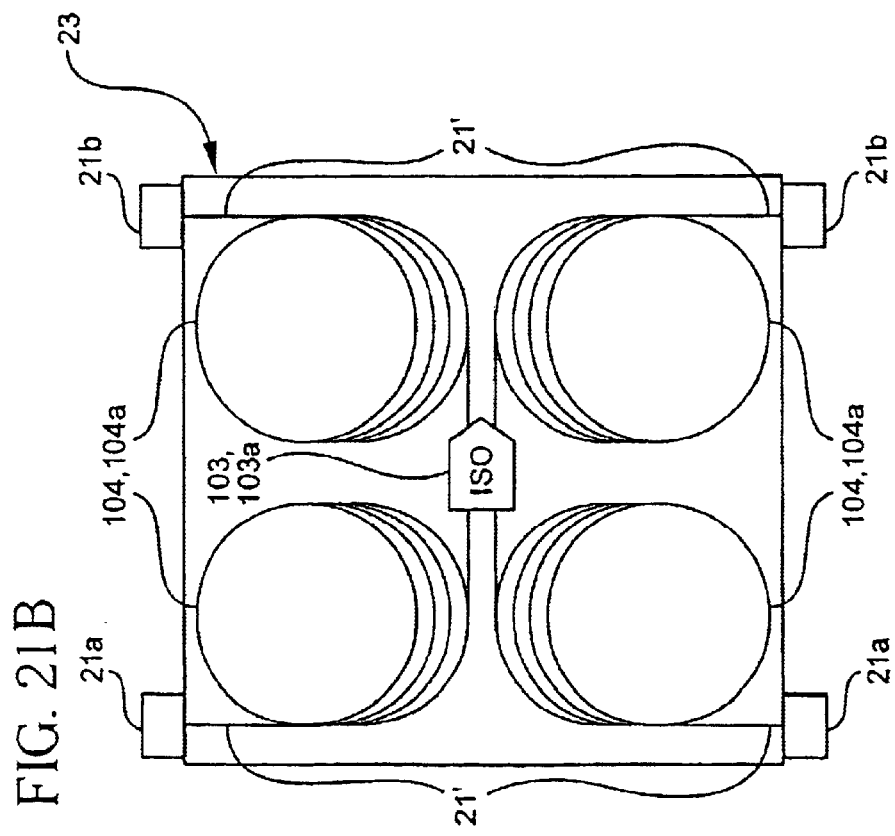

FIG. 21b illustrates, schematically, an exemplary Amplification Module that utilizes two optical circuits 21', similar to the optical circuits illustrated in FIG. 20d, but with the optical isolator 103 element shared by both circuits 21'. This configuration eliminates the need for an extra isolator and is very compact.

FIG. 21c illustrates, schematically, an exemplary Monitoring and Access Module that utilizes two optical circuits 30', similar to the optical circuits illustrated in FIG. 1e, but with the optical tap elements 105 and wavelength division multiplexer element 102 shared by two optical paths within the circuits. This Monitoring and Access module may be used for bidirectional optical signal monitoring. This Monitoring and Access module may also be simultaneously utilized by more than one optical amplifier. More specifically, the Monitoring and Access Module in FIG. 21c includes two isolators 103 that are coupled to, and share, a single optical tap 105. This tap is connected to two photodiodes 107 and to another tap 105. The second tap 105 is also connected to two photodiodes 107.

Figure 21E:
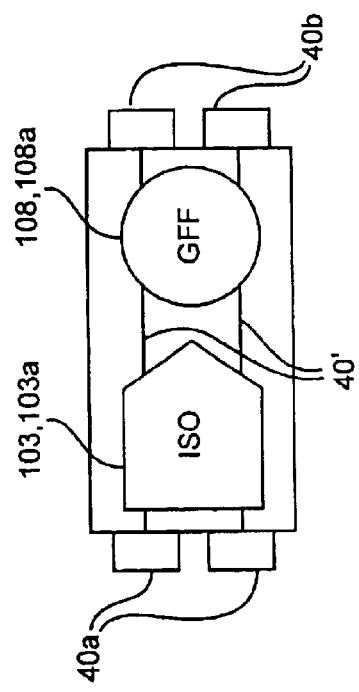
Figure 21D:
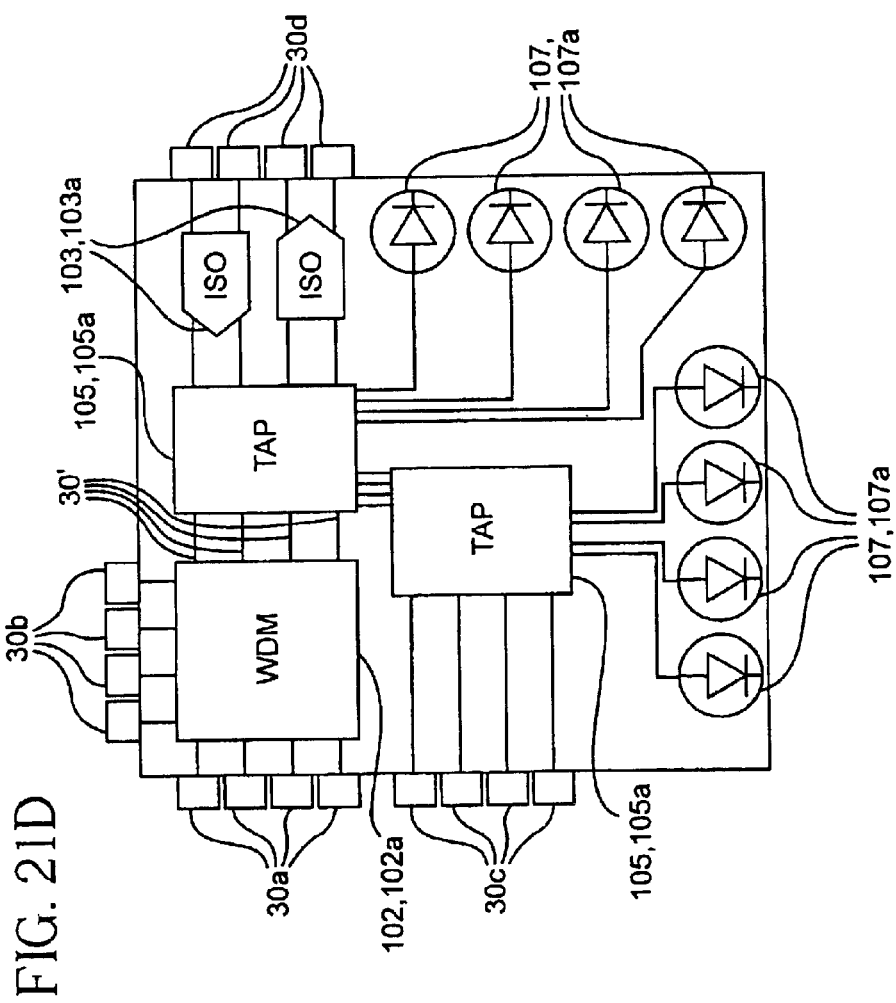

FIG. 21d illustrates another Monitoring and Access module similar the one illustrated in FIG. 21c, but is again doubled, with four optical circuits 30'. The optical tap elements 105 and wavelength division multiplexer element 102 of FIG. 21d are shared by four optical paths within the circuits. Each of the isolators 103 is shared by two optical circuits.

FIGS. 21e–21h illustrate, schematically, several embodiments of Optical Processing modules. The module of FIG. 21e includes two optical circuits 40', similar to those shown in FIG. 1g, but with the optical isolator 103 and gain flattening filter 108 shared by two optical circuits within the module.

Figure 21G:
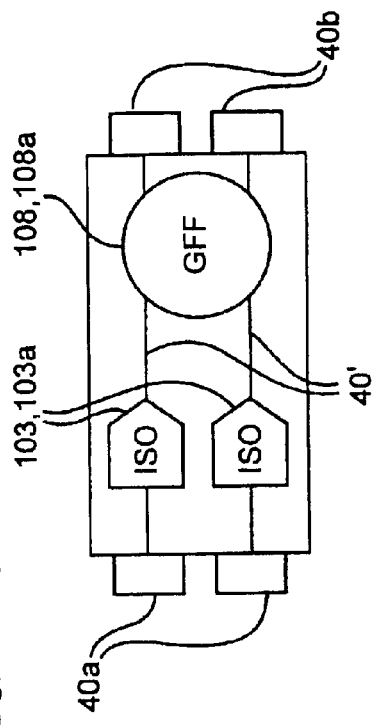
Figure 21F:
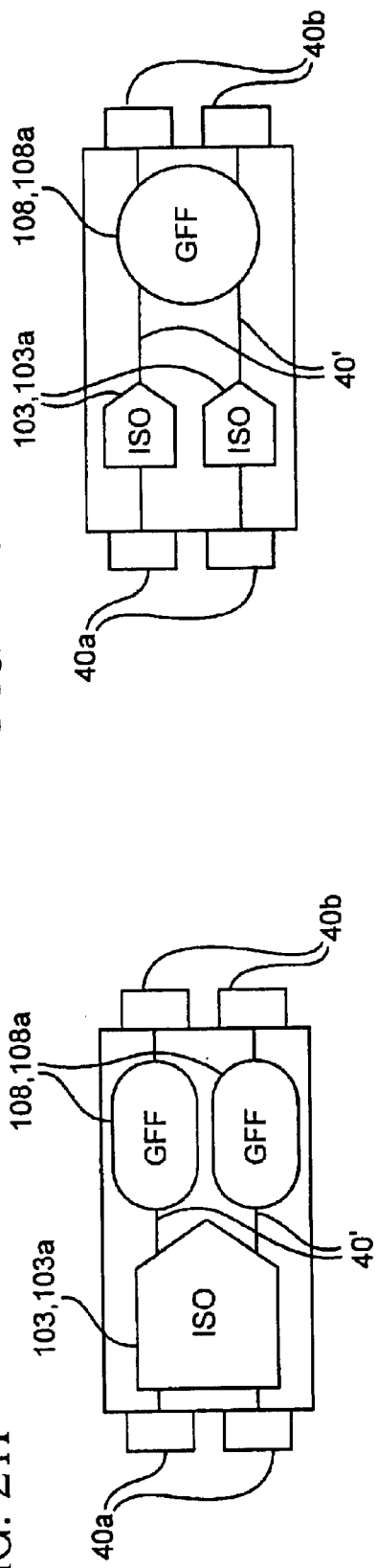

FIG. 21f is similar to that of FIG. 21e, except only the optical isolator 103 is shared by the two optical circuits 40'. FIG. 21g is similar to that of FIG. 21e, except only the gain flattening filter 108 is shared by the two optical circuits 40'.

Figure 21H:
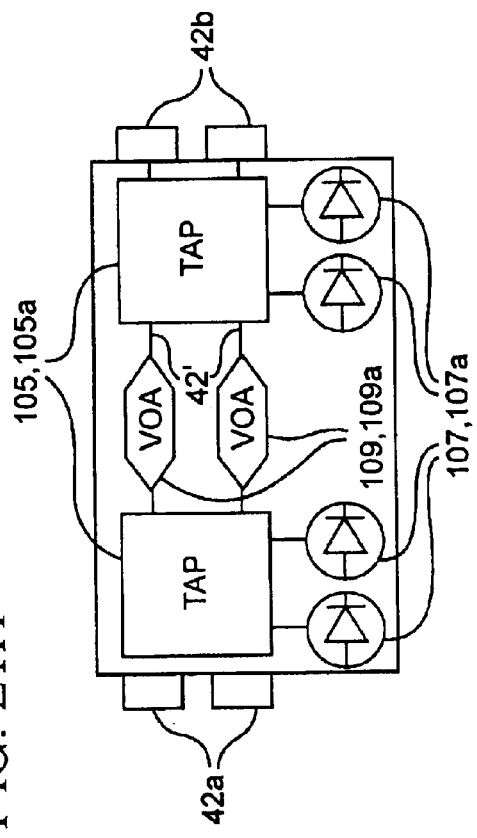

The Optical Processing module of FIG. 21h is similar to the module illustrated in FIG. 1i, but with the optical tap elements 105 shared by two optical circuits 42'.

Figure 21I:
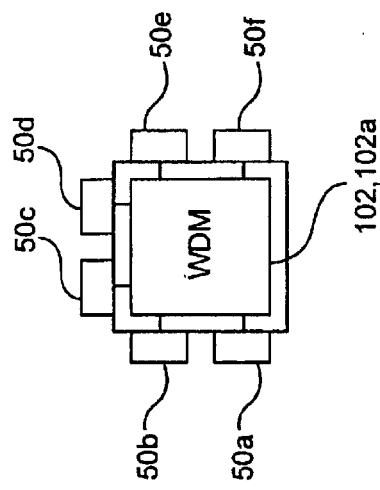

The Telemetry Add/Drop module of FIG. 21i is similar to that of FIG. 1j, except two optical circuits 50' share a single wavelength division multiplexer element 102.

"Ganged" and "Parallel" Configurations

FIGS. 22a–22d illustrate, schematically, further examples of "ganged" and "parallel" modules described in FIGS. 20a through 21i.

Figure 22A:
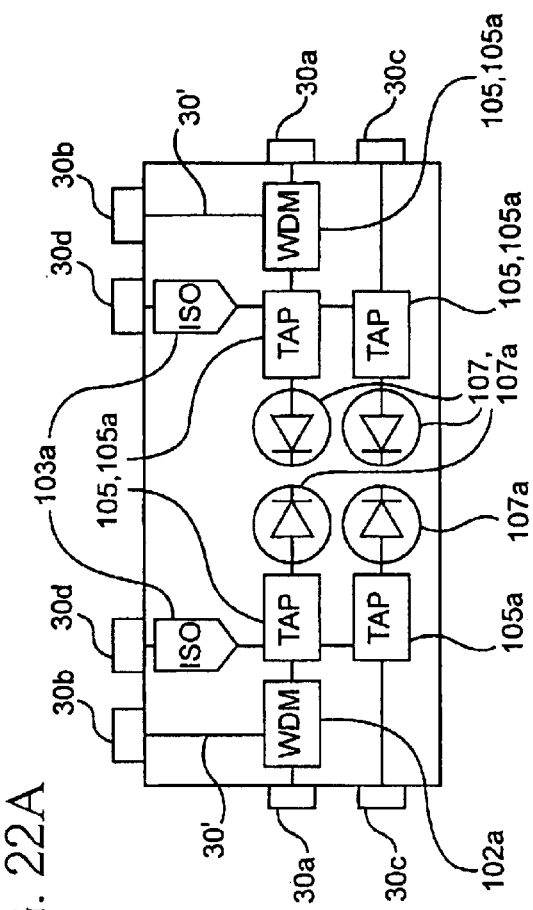
FIGS. 22a–22d illustrates, schematically, examples of the configurations of selected modules shown in FIGS. 20a–20i and 21a–21i.

For example, FIG. 22a illustrates, schematically, the "ganged" Monitoring and Access module 30 from FIG. 20e, including a first optical circuit 30' configured to include only the four port optical tap 105 and the associated photodiode 107, and a second optical circuit 30' configured to include all circuit components except for the isolator 103.

Figure 22C:
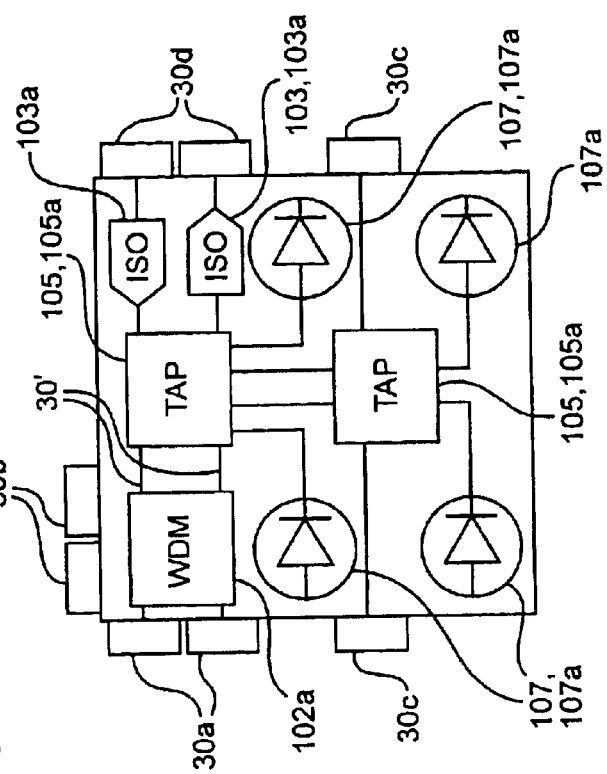
Figure 22B:
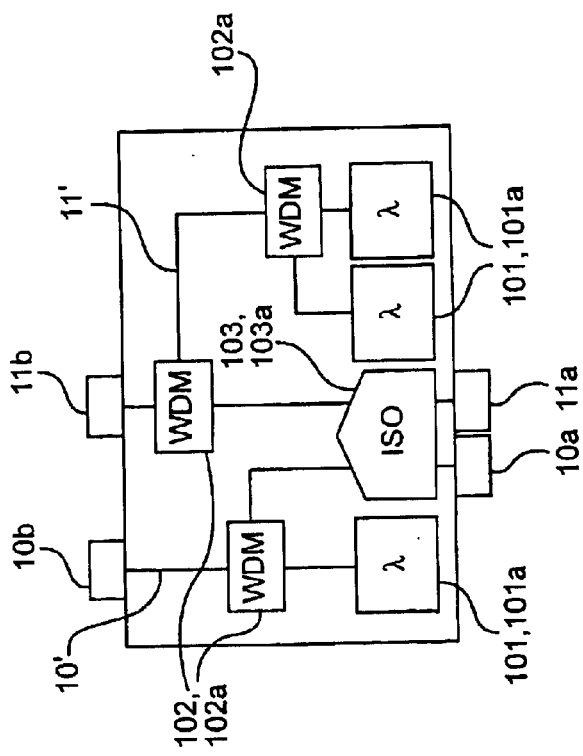

FIG. 22b illustrates, schematically, an Optical Power Supply module similar to the one illustrated in FIG. 21a. The Optical Power Supply module of FIG. 22b is configured to include all circuit components except for the second laser source 101 and third WDM 102.

FIG. 22c illustrates, schematically, a Monitoring and Access module similar to the one illustrated in FIG. 21c, but configured to include all circuit components except for the shared WDM 102, one isolator 103, and one photodiode 107.

Figure 22D:
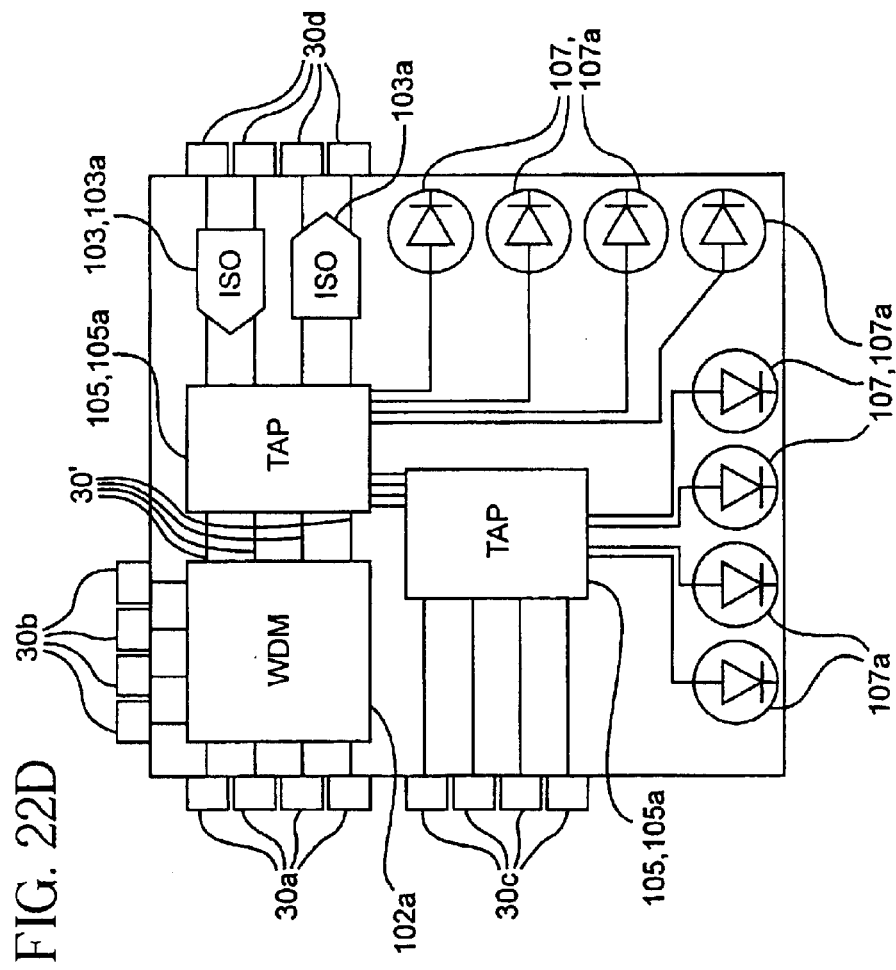

FIG. 22d illustrates, schematically, a Monitoring and Access module similar to the one illustrated in FIG. 21d, but configured without the shared WDM 102, one isolator 103, and two photodiodes 107.

Amplifier modules may, preferably, be reduced in size and cost through integration of the internal components that make up the optical circuits. Integration of optical components includes combining optical and opto-electronic materials within the same component packages to provide more than one function. This allows a reduction in packaging costs compared to individually packaged components. Additionally, the optical connections between the materials may be substantially reduced in size, for example, by replacing the conventional spliced optical fiber connections with precise placement and/or direct abutment of the materials. Optical losses associated with the fiber interconnections may therefore be minimized. This allows for the overall reduction in size of the modules. Finally, integration of components to eliminate fiber interconnections would enable automation of the manufacturing processes. Therefore, a fully integrated component is a single component that provides several optical or opto-electronic functions. Such a component may be a monolithic component.

Figure 23A:
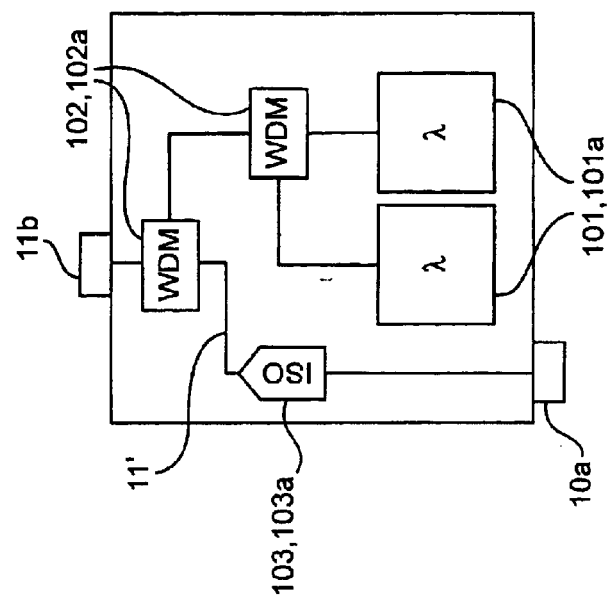
FIGS. 23a–23c illustrates, schematically, examples of the novel integration of the Optical Power Supply module.

FIGS. 23a–23c and FIGS. 24a–24c illustrate, schematically, examples of the novel integration of the Optical Power Supply module 11 and the Monitoring and Access module 30, respectively. More specifically, FIG. 23a illustrates, schematically, an embodiment of an Optical Power Supply module 11, similar to the configuration variant of the Optical Power Supply illustrated in FIG. 15d. This Optical Power Supply optical module 11 includes two light sources 101' that provide optical pump power (for example, laser sources 101), a first and second bidirectional light combiner/separator 102' (for example two WDMs 102) optically connected to the light source 101', and a directional optical attenuator 103' (for example, an isolator 103), optically connected to one of the bidirectional light combiner/separators.

Figure 23C:
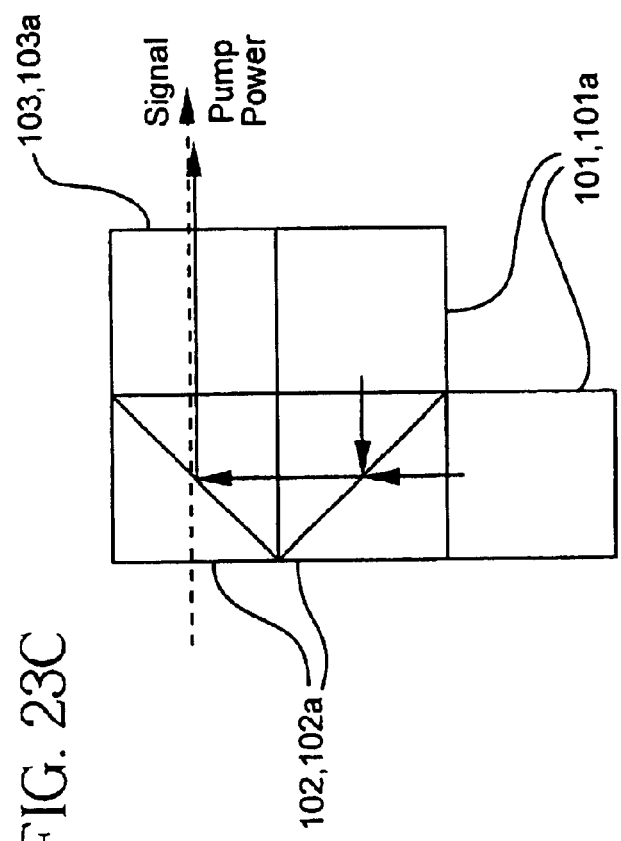
Figure 23B:
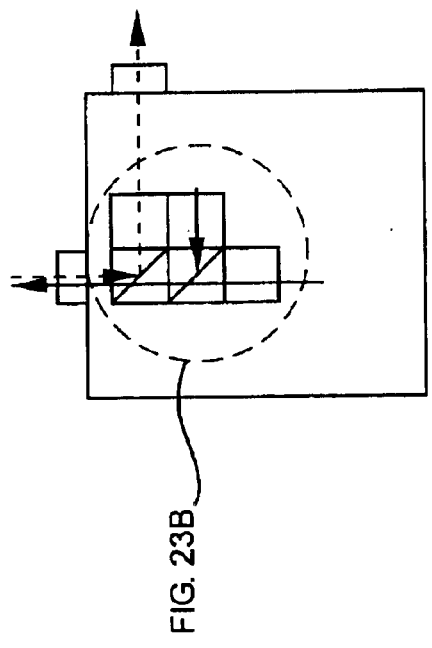

FIG. 23b illustrates another embodiment of the Optical Power Supply module 11. This embodiment of the Optical Power Supply module provides a similar function to the Optical Power Supply module 11 shown in FIG. 23a, but includes a novel, single, component that provides the component functions of the WDM 102, isolator 103, and laser sources 101. The highly integrated, novel, single component of this module is shown in more detail in FIG. 23c. This single component includes at least one light source 101', (for example, in the form of a pump chip 101), at least one bidirectional light combiner/separator 102', and a directional optical attenuator 103. This results in a very compact Optical Power Supply module. The optical alignment tolerance requirements to allow for efficient optical coupling between the pump chip(s), the WDM(s), and isolator are known to those skilled in the art of opto-mechanical engineering. Tolerances can be achieved in manufacturing using a combination of passive alignment, active alignment, or a combination of both passive and active alignment. Examples of passive alignment manufacturing processes include the use of, for example, passive solder bump technology, computer aided vision technology with associated fiduciary marks, mechanical passive alignment stops or mechanical v-grooves etched into a substrate material onto which the optical components are assembled by, for example, an automated pick and place assembly machine. The typical alignment tolerances associated with passive alignment machines range from a precision of +/−10 microns to less than +/−0.3 microns, depending on the complexity of the alignment machine.

Higher levels of alignment precision can be attained with "active" alignment, i.e., with automated assembly machines that seek out the optimal alignment using a power peaking or hill climbing algorithm during the alignment process. This, "active" alignment technique, results in more optimal alignment and better optical coupling between adjacent components and reduced optical losses.

Figure 24B:
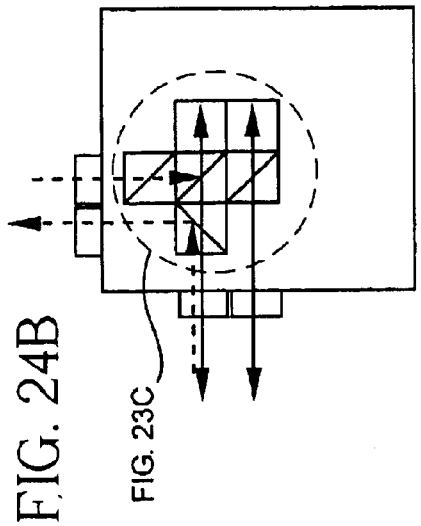
FIGS. 24a–24c illustrates, schematically, examples of the novel integration of the Monitoring and Access module.
Figure 24C:
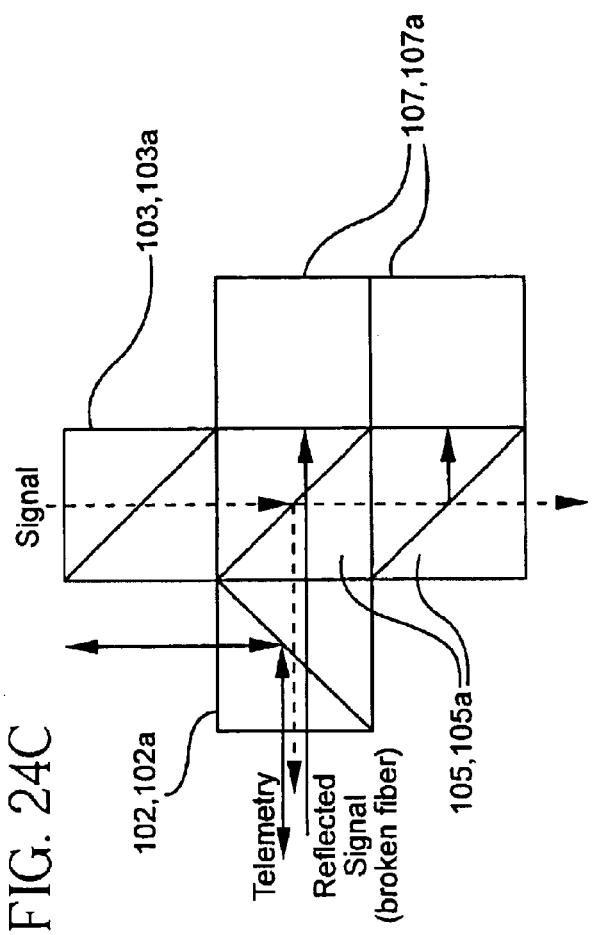
Figure 24A:
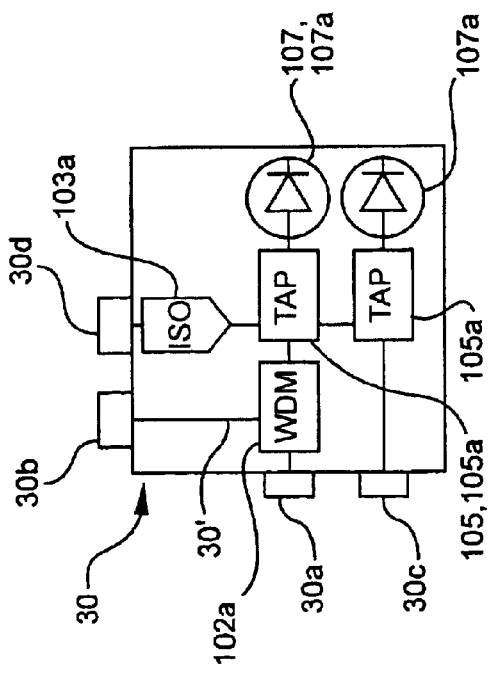

Similarly, FIGS. 24a–24c illustrates, schematically, an example of the novel integration of the Monitoring and Access module 30. More specifically, FIG. 24a illustrates, schematically, an embodiment of Monitoring and Access module 30. This Monitoring and Access module 30 includes two optical taps 105, a photodiode associated with each tap 107, a WDM 102 and an isolator 103.

FIG. 24b illustrates another embodiment of the Monitoring and Access module 30. This embodiment of the Monitoring and Access module provides a similar function to the Monitoring and Access module shown in FIG. 24a, but includes a novel, single, component that provides the component functions of the optical taps, photodiodes, WDM, and isolator. The highly integrated, novel, single component of this module is shown in more detail in FIG. 24c. This single component includes at least one optical tap 105, at least one associated detector chip 107, a WDM 102, and a directional optical attenuator 103. This results in a very compact Monitoring and Access module.

Amplification Module Variants

Figure 25B:
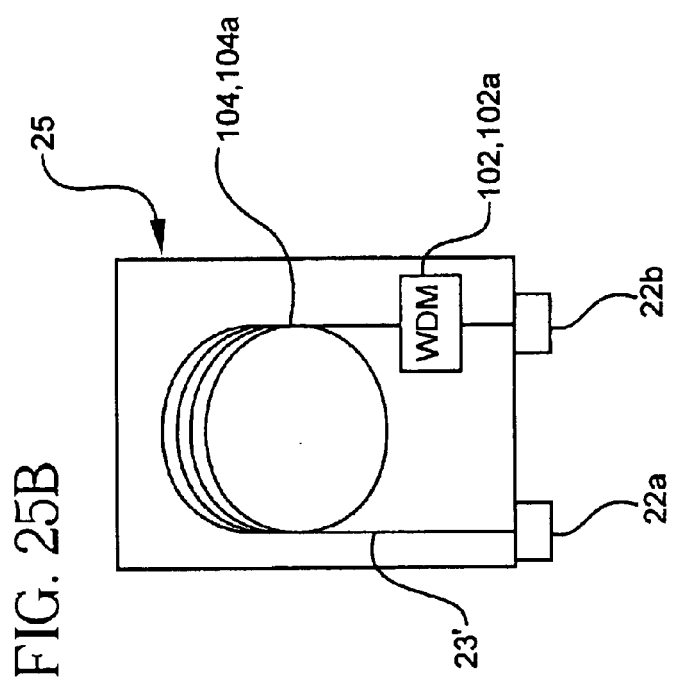
FIGS. 25a–25g illustrates, schematically, alternative embodiments of the Amplification modules.
Figure 25A:
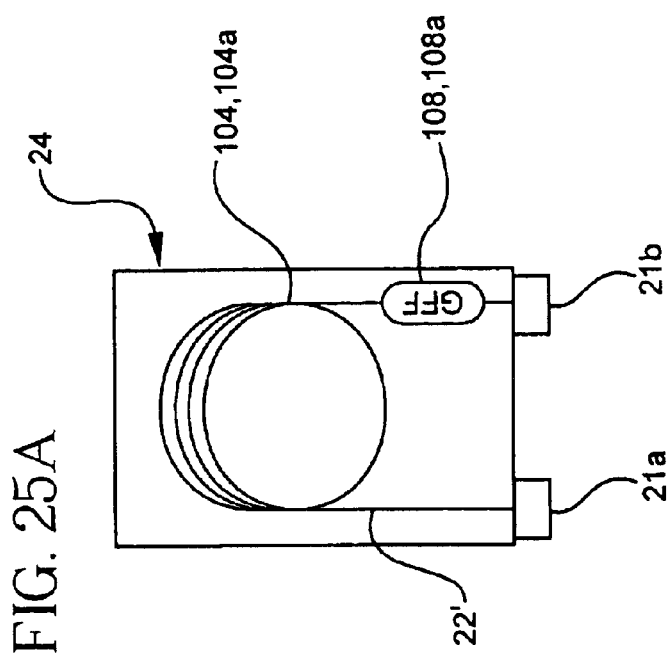
Figure 25D:
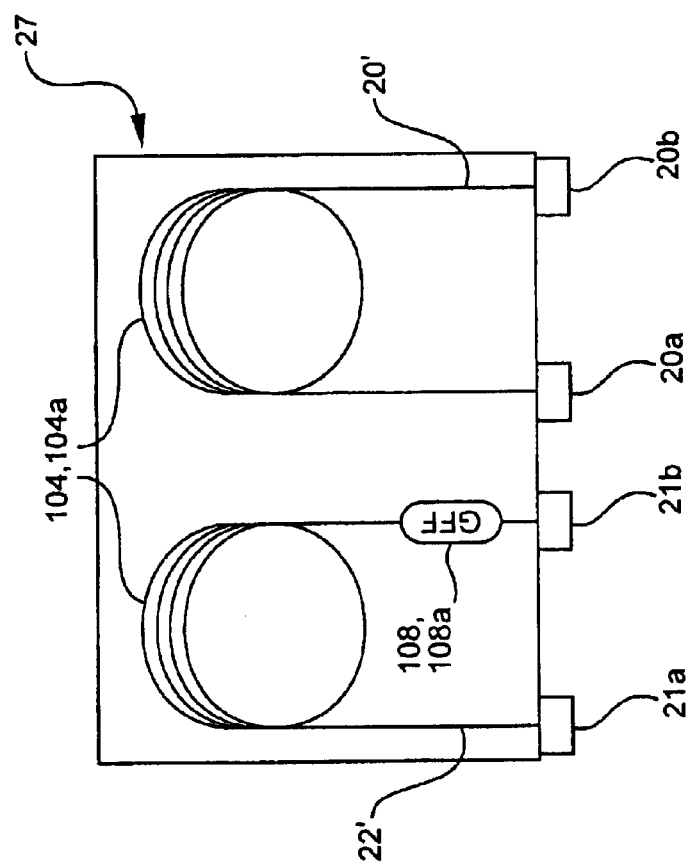
Figure 25C:
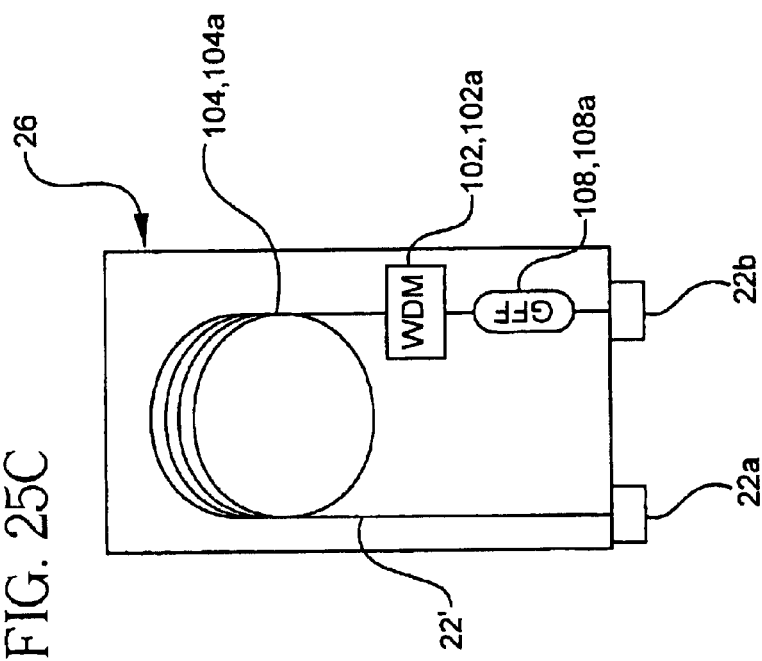
Figure 25F:
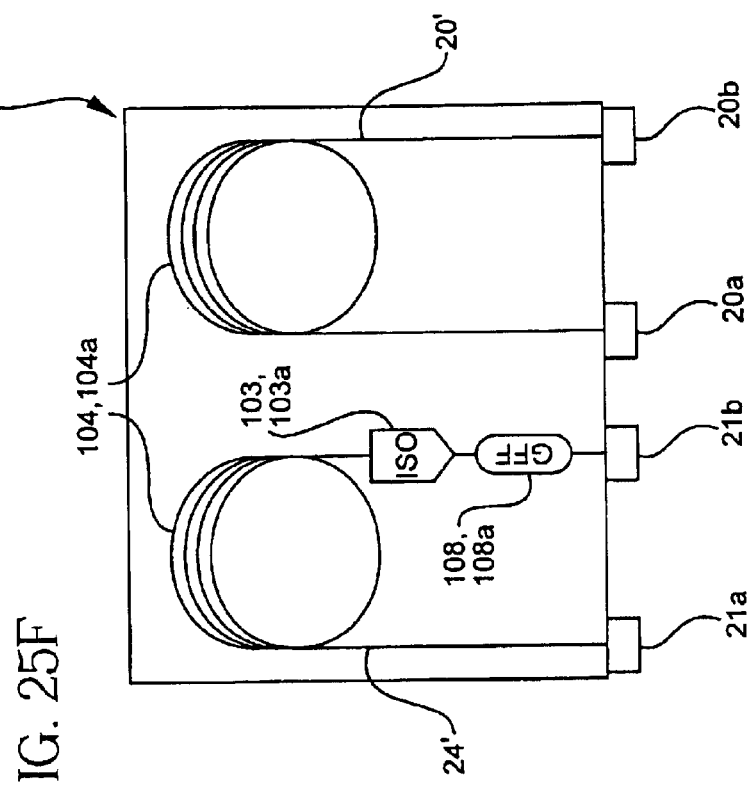

FIGS. 25a–25g illustrates, schematically, alternate embodiments of the Amplification Module. In FIGS. 25a–25c, the Amplification Modules 24, 25, 26 are comprised of optical circuits 22', 23', and 24', respectively, optically connected to the associated optical ports 21a, 21b, 22a, 22b, 23a, and 23b. Optical circuits 22', 23', and 24' differ from optical circuit 20', described previously, in that they include at least one additional optical component providing an additional optical function. For example, optical circuit 22' of Amplification Module 24, as illustrated schematically in FIG. 25a, includes amplification medium 104' and a light filter 108'. In this embodiment, the amplification medium is erbium doped optical fiber 104 and the light filter is a gain flattening filter 108. In another example, optical circuit 23' of Amplification Module 25, as illustrated schematically in FIG. 25b, includes amplification medium 104' and a bidirectional light combiner/separator 102'. In this embodiment, the amplification medium 104' is erbium doped optical fiber 104 and the bidirectional light combiner/separator 102' is a wavelength division multiplexer 102. The WDM 102 of circuit 23' is positioned to accept only one input, optical power and signal light from Er doped fiber 104. The WDM 102 separates excess pump power from the amplified signal power, and provides optical signal power to optical port 22b. The excess pump light is routed to an optical absorber located within the module where it is dissipated. Such an optical absorber may be, for example, part of the WDM component (as in a ball-terminated fiber) or as a separate component. The optical circuit 24' of Amplification Module 26, as illustrated schematically in FIG. 25c, includes amplification medium 104' and both a light filter 109' and bidirectional light combiner/separator 102'. In this embodiment, the amplification medium 104' is erbium doped optical fiber 104, the bidirectional light combiner/separator 102' is a wavelength division multiplexer 102, and the light filter 108' is a gain flattening filter 108. The WDM 102 functions similarly to the one described in conjunction with FIG. 25b. These embodiments provide the amplifier designer with added flexibility to form unique combinations of modules.

Figure 25E:
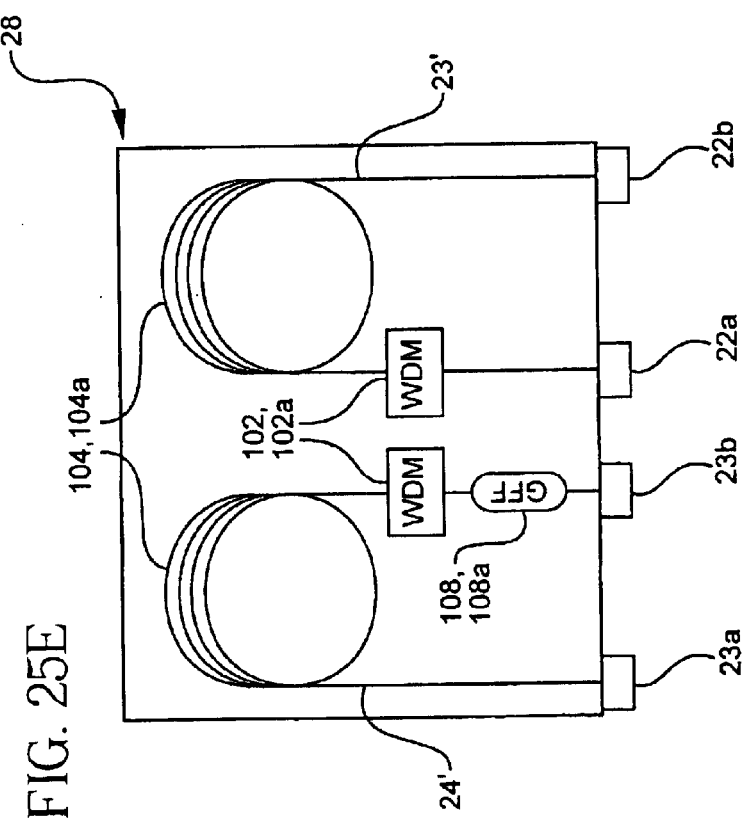
Figure 25G:
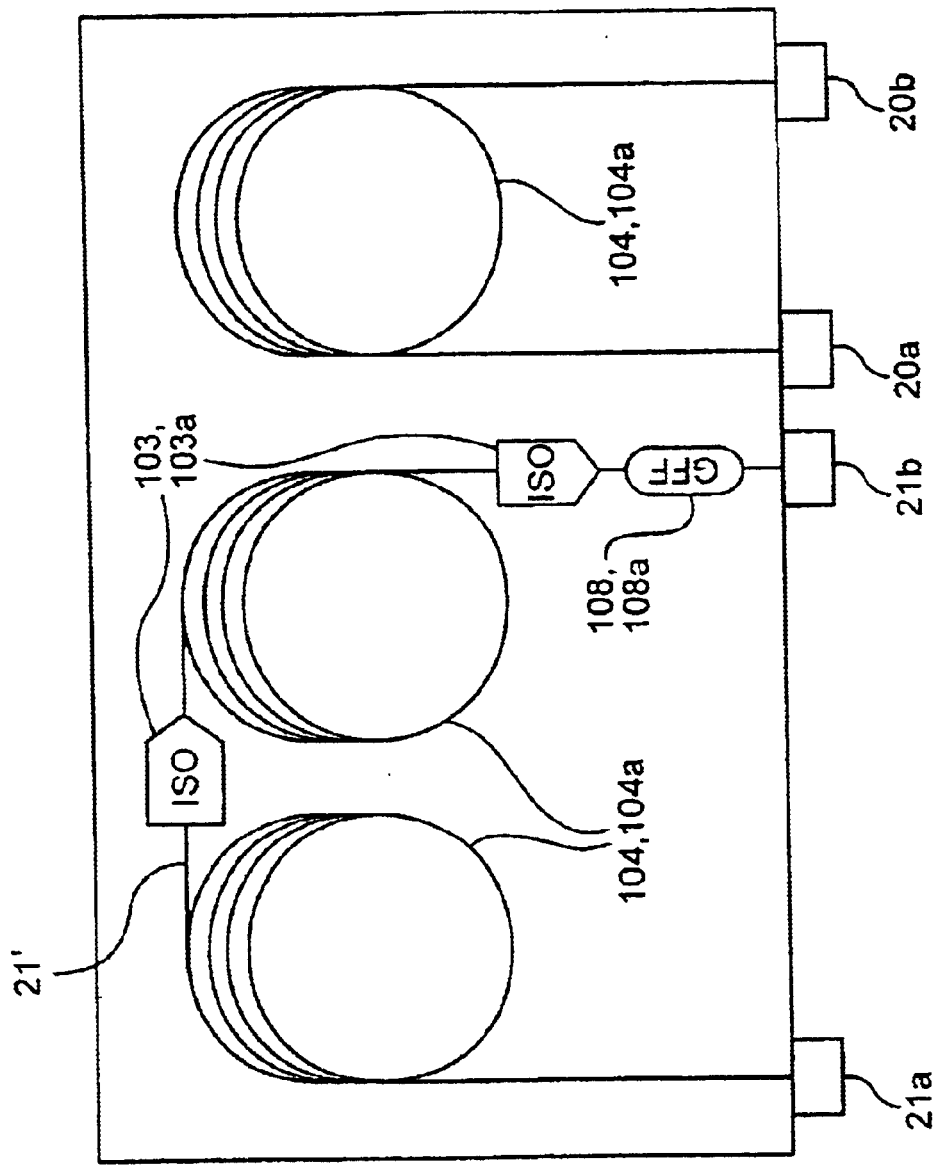

As discussed previously, optical circuits may be combined within larger modules using "ganged" or "parallel" approaches. FIGS. 25d and 25e illustrate two embodiments of a "ganged" approach to optical circuits 20', 22', 23', and 24'. Specifically, FIG. 25d illustrates, schematically, the Amplification module 27, comprised of optical circuits 20' and 22', optically connected to the associated optical ports 20a, 20b, 21a, and 21b, respectively. Likewise, FIG. 25e illustrates, schematically, the Amplification module 28. This Amplification module 28 is comprised of optical circuits 23' and 24', optically connected to the associated optical ports 22a, 22b, 23a, and 23b, respectively. In this embodiment, the wavelength division multiplexers 102 in each optical circuit 23' and 24', are optically connected. In this embodiment, the WDM 102 of circuit 24' separates pump power from the amplified signal power provided by the Er doped coil of circuit 24', and provides optical signal power to the gain flattening filter 108. The pump power is routed to a second WDM 104 within the module 28, for recombination with signal light (or signal and pump light) provided by the optical port 22a.

In an alternative embodiment, an isolator 103 may be provided between the gain flattening filter 108 and the associated Er doped fiber coil 104. This is shown, for example, in FIGS. 25f and 25g.

Certain optical functions could be optionally produced in the optical circuit of the Amplification Module at predetermined locations by the application of electrical, optical, electromagnetic or thermal energy. For example, a diffraction grating could be optionally written into an optical fiber or planar waveguide that forms a part of the optical circuit of an Amplification module. More specifically, a diffraction grating (fiber Bragg grating FBG) can be written into the gain medium to replace the function provided by the dielectric GFF. Alternatively, a GFF in the form of a Lattice filter or cascaded Mach-Zehnder interferometer may be written within the waveguide, as taught U.S. Pat. No. 5,295,205. This would result in smaller optical losses and a more compact design.

Figure 26A:
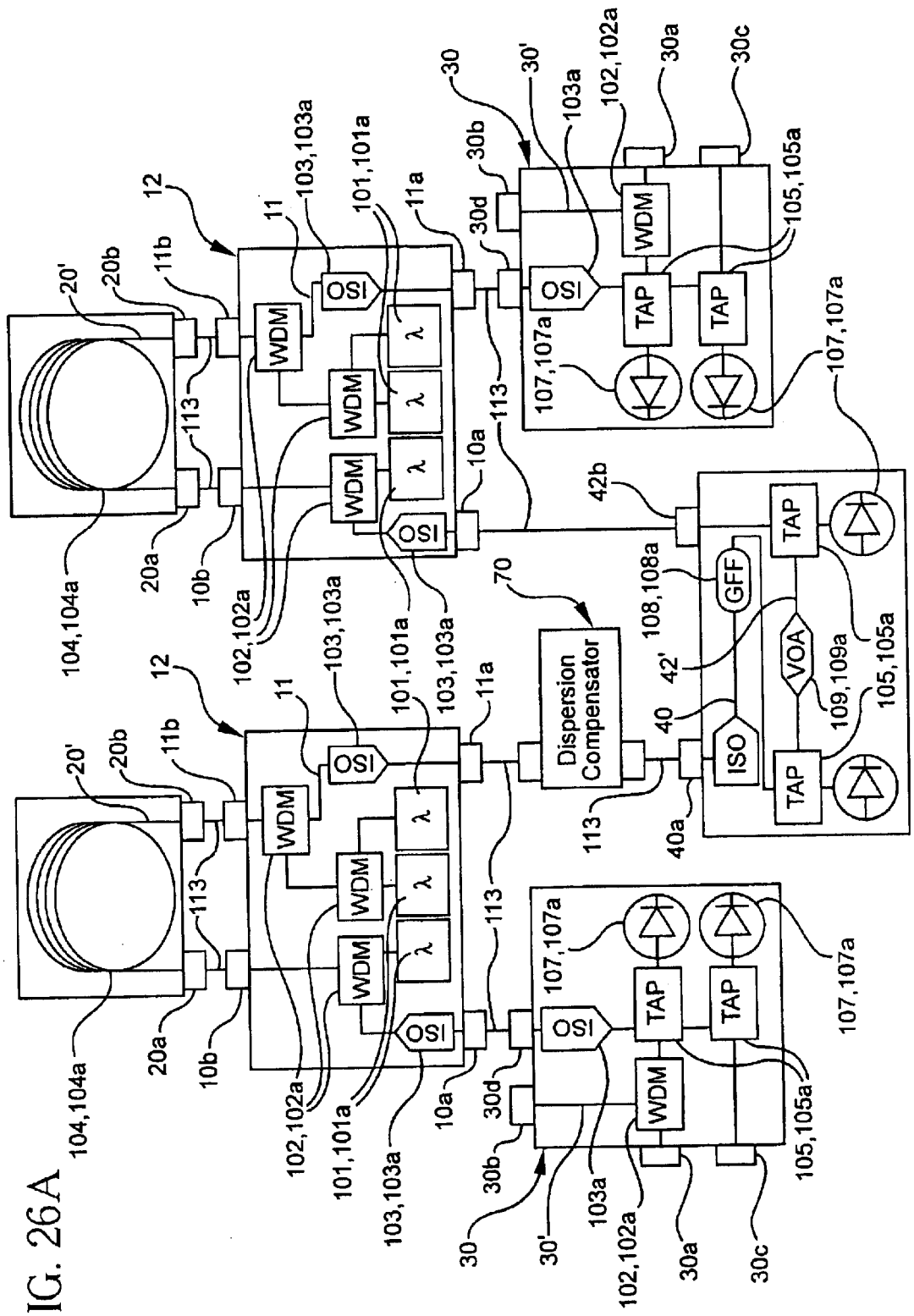
FIGS. 26a–26b illustrates, schematically, two embodiments of an optical amplifier that includes an optional dispersion compensation module.
Figure 26B:
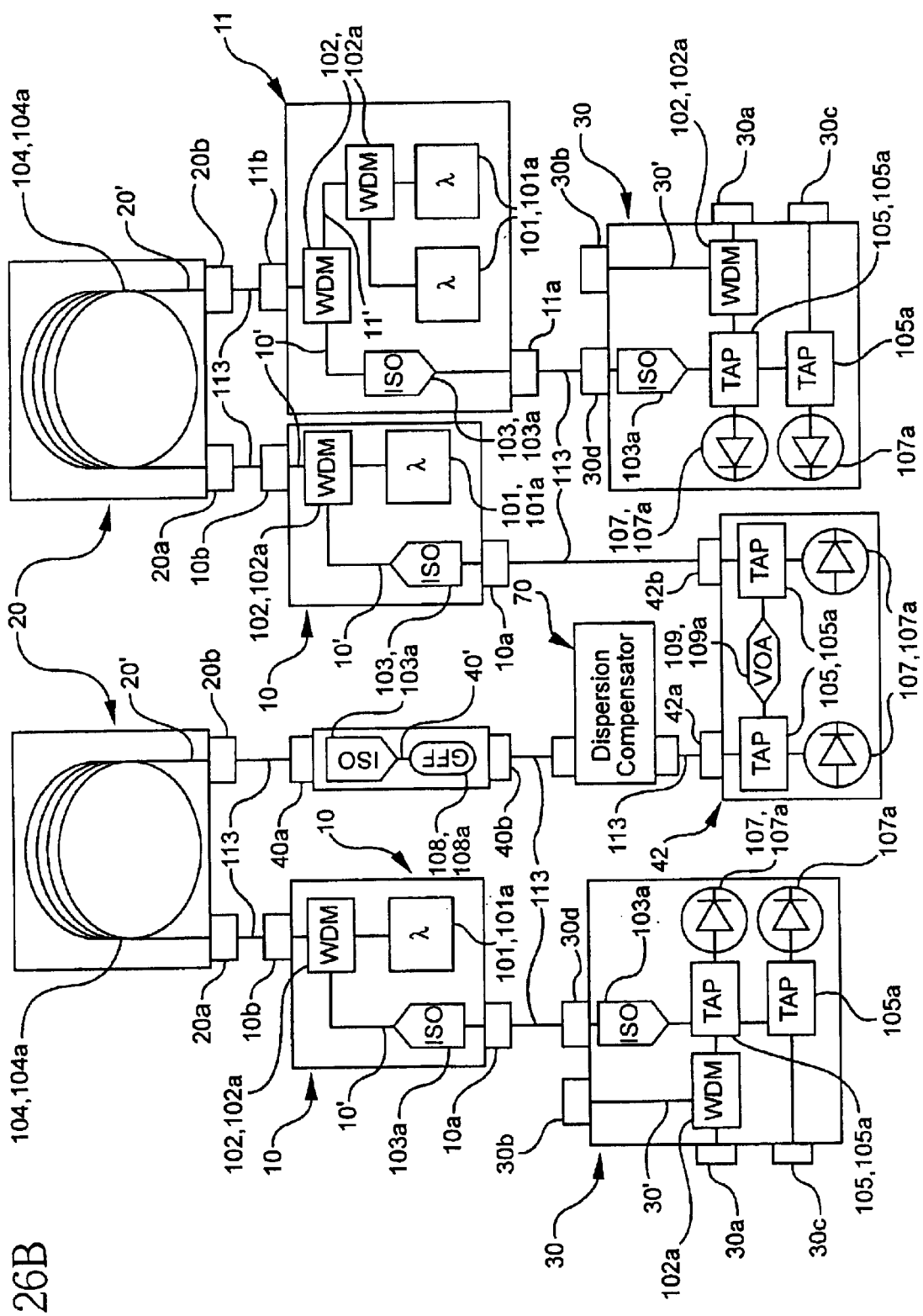

One advantage of a modular approach to optical amplifiers is that the architecture can accommodate expansion and change. Other modules, with features other than those described above, may be added to the optical amplifier to create new products. For example, FIGS. 26a and 26b illustrate, schematically, two amplifier embodiments similar to those of FIGS. 4a and 4b, which include an additional module that provides dispersion compensation. Such a module may include, for example, dispersion compensating fiber, diffraction gratings, or other dispersion compensating components.

Figure 27A:
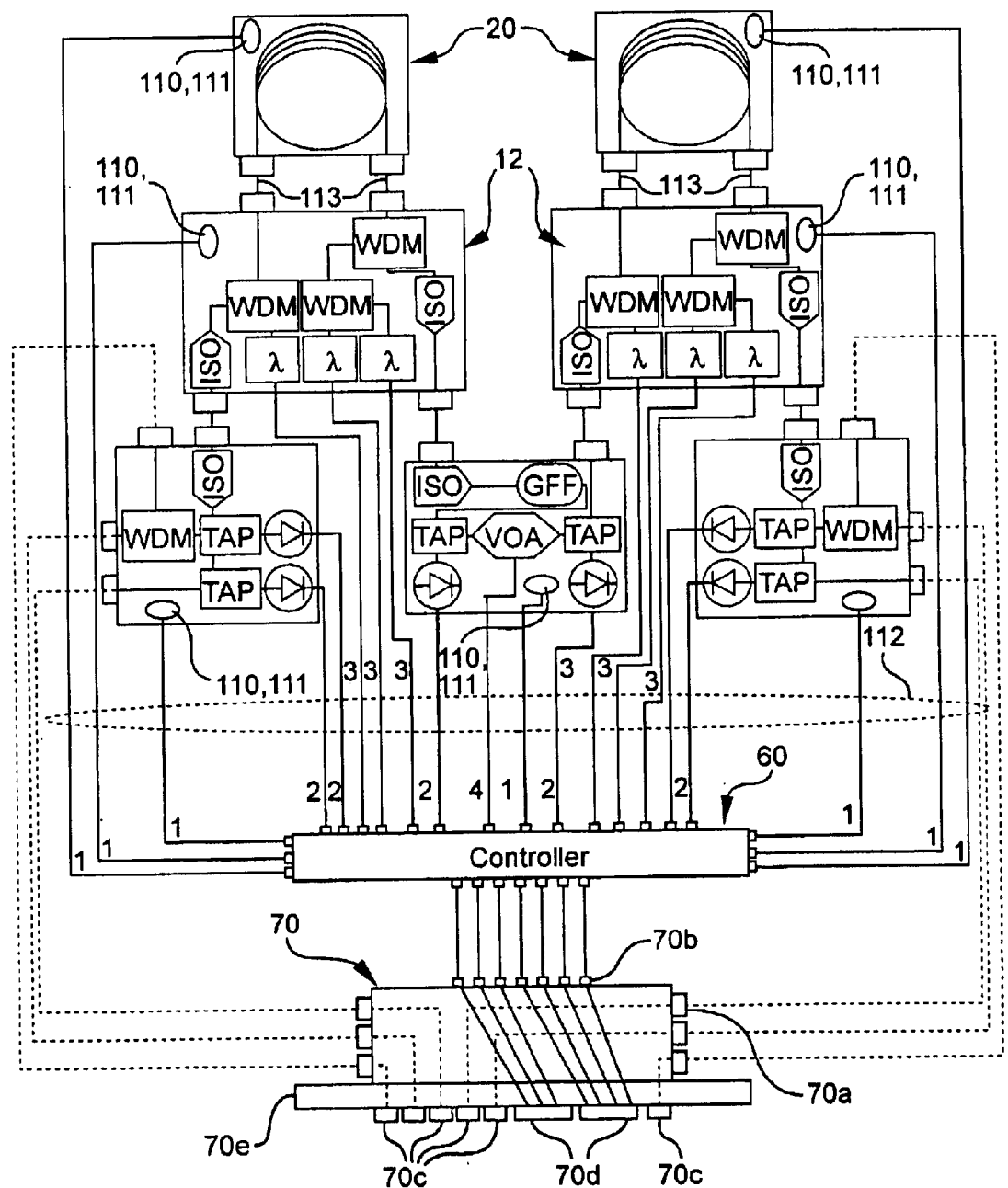
FIG. 27a illustrates, schematically, an embodiment of an optical amplifier that includes an optional interface module.
Figure 27B:
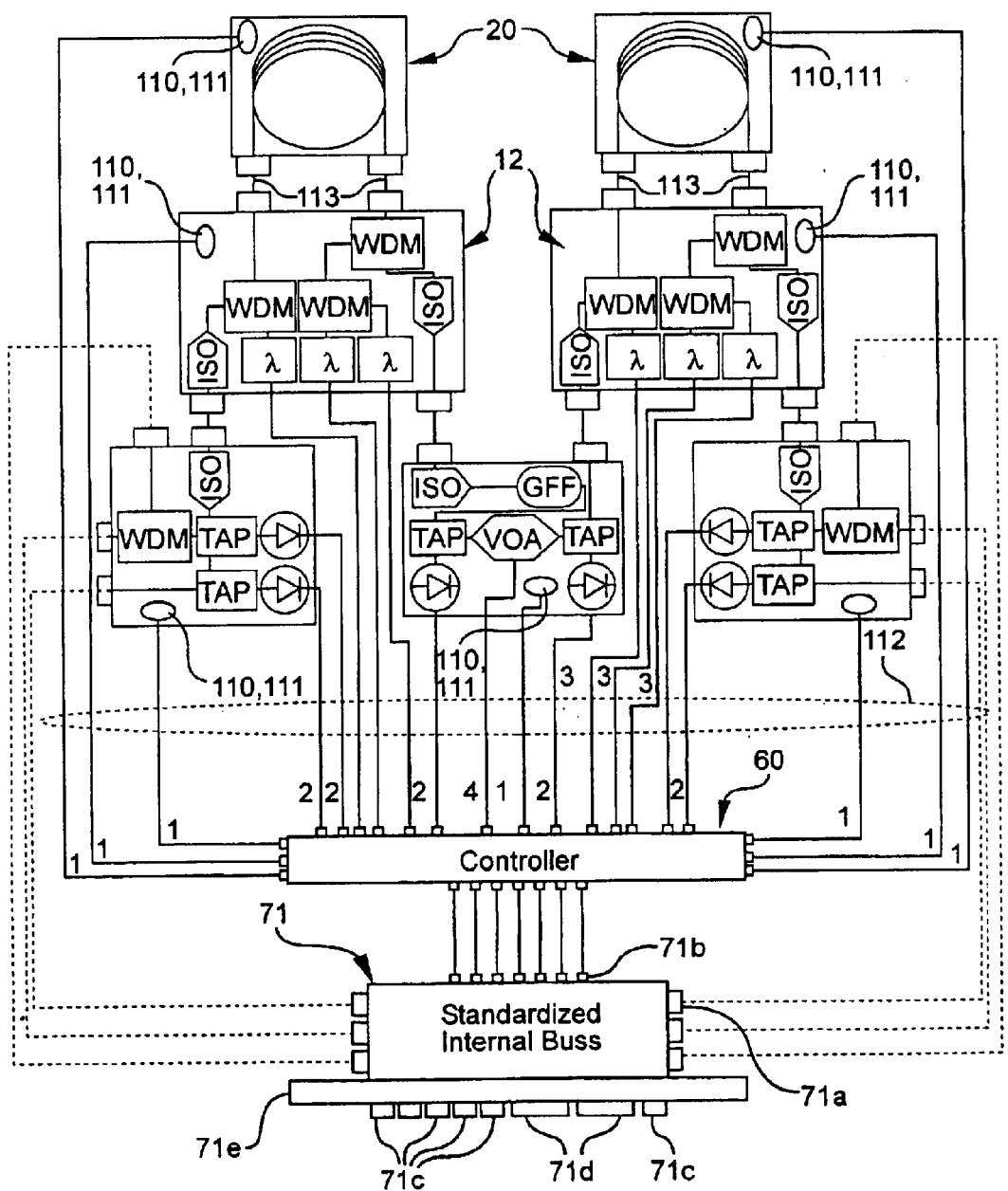
FIG. 27b illustrates, schematically, an embodiment of an optical amplifier that includes an optional interface module that is utilized as a support base for other modules.

Additionally, users of optical amplifiers need to have the optical amplifier interact with the other parts or devices of the network systems. This requires a customer and application specific interface between the optical amplifier and the devices associated with the network systems. This interface includes at least one of the following: optical ports, electrical ports, mechanical or thermal connections necessary to operate the amplifier. For example, the Customer Interface module may include a heat transfer device 111 connected to at least one of the other modules. This heat transfer device 111 may be a heat sink that routes excess thermal energy away from the amplifier assembly. Therefore, a modular Customer Interface module 70, 71 would include internal connection ports 70a, 70b, 71a, 71b to connect to other amplifier modules within the amplifier. Other internal connection ports may also be utilized. The internal ports 70a, 70b, 71a, 71b are preferably oriented so as to facilitate connection of the amplifier modules to the Customer Interface module 70, 71 during manufacturing. The internal connection ports 70a, 70b, 71a, 71b are routed within the Customer Interface module to the user-specified ports 70c, 70d, 71c, 71d or connections on the external customer interface. The inclusion of a highly configurable Customer Interface module 70, 71 in the design architecture of the optical amplifier aids in simplifying the complexity of the remainder of the optical amplifier modules. As an example, FIG. 27a illustrates a Customer Interface module 70 that would provide predetermined connections within the amplifier, yet have a custom, customer-specified, external electrical and optical interface 70e, 71e. In addition to providing the customer-specified, external electrical and optical interface 70e, 71e, the Customer Interface module (module 71) may also be utilized as a support structure, base, or motherboard for other modules. This is illustrated schematically in FIG. 27b. The connections illustrated may be accomplished using known methods and techniques.

Other modules, providing other optical functions, may also be developed and combined with the amplifier modules in a similar way.

In general, modules to be used for a plurality of optical amplifiers are defined based on their functionality using the following partitioning method steps:
  i identifying a plurality of common functions required in each one of the plurality of optical amplifier types;
  ii identifying which groups of optical components are capable of providing this plurality of functions;
  iii selecting components to be grouped together in discrete modules, each module having at least one optical circuit, each of the components being coupled to at least another one of the components in this optical circuit, wherein each module provides one of the plurality of functions.

Thus, when manufacturing such modules it is preferred to:
  i identify a plurality of common functions required in each one of the plurality of optical amplifier types;
  ii identify which optical components, as a group, are capable of providing the required function(s);
  iii group the components together, such that each group of components is capable of providing one of the plurality of functions;
  iv place these optical components into modules, such that each of the modules performs one the plurality of functions. The modules may be then assembled together into an optical amplifier assembly. It is noted that optical connection between various components (and modules) may be accomplished, for example, via splicing of optical fibers. In a fusion splice, the connection is accomplished by the application of localized heat sufficient to fuse or melt the ends of two optical fibers, forming a continuous single fiber. In a connector splice, two mating pieces of hardware, i.e. connectors, are mechanically coupled to ends of respective fibers to be spliced and the connectors are mated to one another to position the ends of the fibers in opposition to one another. The connector splicing offers more flexibility because the splices can be easily undone and redone. Other optical connections may also be utilized.

Thus, a method of assembling an optical amplifier comprises the steps of:
  i selecting a plurality of modules required in the optical amplifier; the plurality of modules being selected from at least types: Optical power supply module, Amplification module and at least one additional module; and
  ii assembling the modules into an amplifier assembly.

Thus, a method of assembling an optical amplifier would typically include the following steps:
  i selecting a plurality of modules required in the optical amplifier; the plurality of modules being selected from at least three of the following types: Optical power supply, Amplification, Monitoring and Access; Optical Processing, Customer Interface, or Telemetry Add/drop; and
  ii assembling the modules into an amplifier assembly.

Furthermore, a method of assembling an optical amplifier thus may includes the steps of:
  i identifying a plurality of functions required in the optical amplifier; the plurality of functions being selected from at least three of the following types: Optical power supply, Amplification, Monitoring and Access; Optical Processing, Customer Interface, or Telemetry Add/drop;
  ii identifying which optical components, separately or in combination with other components are capable of providing this plurality functions; and
  iii identifying which of the components are to be grouped together to provide each of a the plurality of functions; placing the groups of optical components into modules, such that each of the modules performs one of the plurality of functions; and assembling the modules into an amplifier assembly.

Module Self-Identification

Figure 28B:
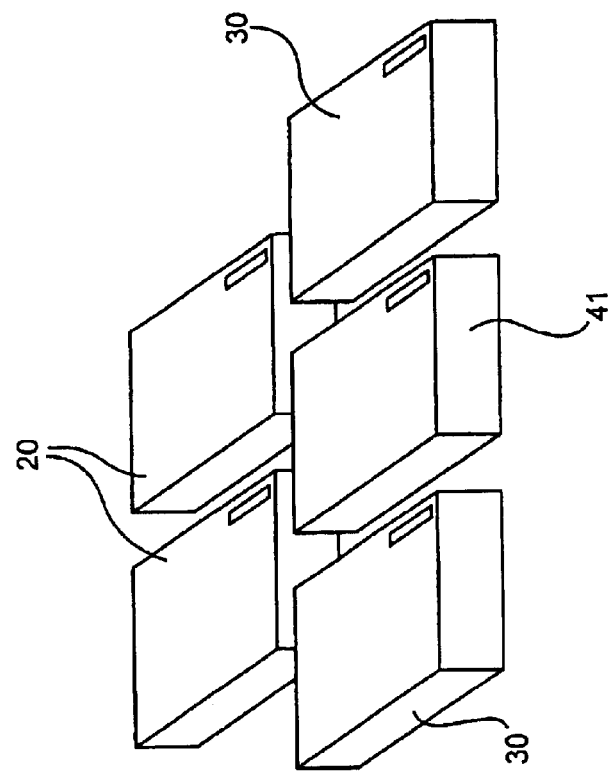
FIG. 28b illustrates, schematically, an embodiment of an optical amplifier that includes passive (readable) encoding of information regarding the manufactured modules to facilitate identification.
Figure 28A:
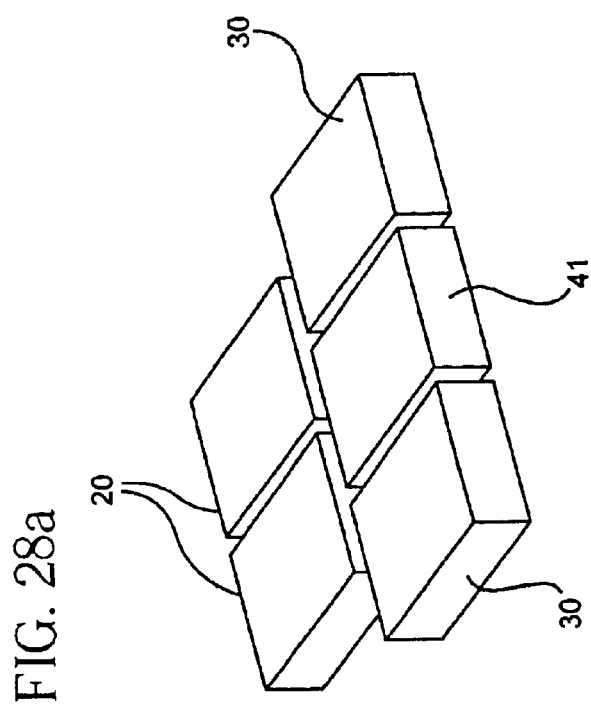
FIG. 28a illustrates, schematically, an embodiment of an optical amplifier that includes color coding of modules by module type to facilitate identification.
Figure 28C:
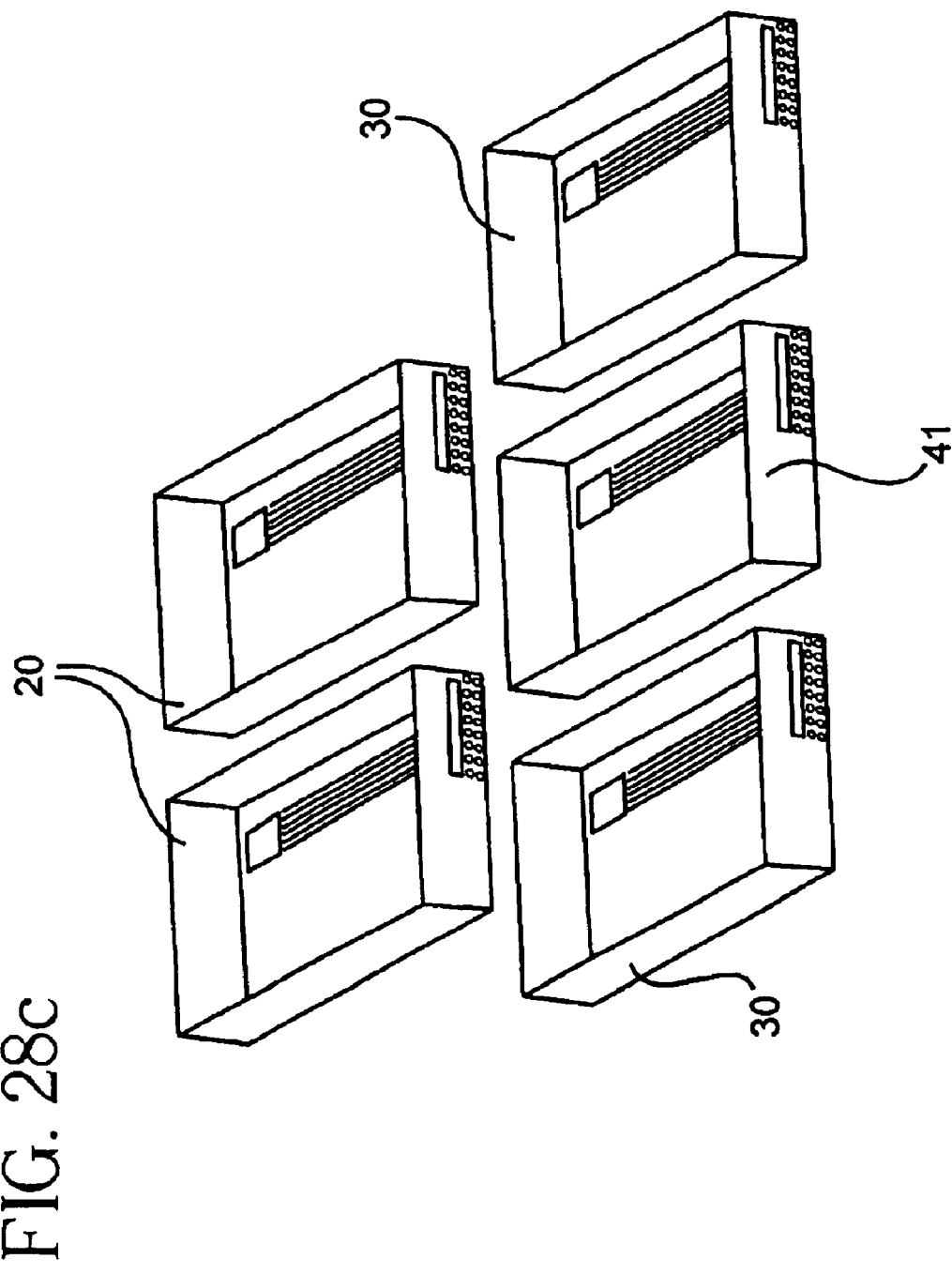
FIG. 28c illustrates, schematically, an embodiment of an optical amplifier that includes an active (read/writeable) encoding of information regarding the manufactured modules to facilitate identification.

In the manufacture of optical amplifiers from the configurable amplifier modules described above, it is advantageous to easily determine a module's type, module's configuration, to determine manufacturing history of the module and other results and parameters associated with the finished modules. Several methods to accomplish this are shown in FIGS. 28a–28c. For example, FIG. 28a illustrates a series of amplifier modules, color coded by module type to aide in visual identification. As an example, Amplification modules 20 are coded red, Monitoring and Access modules 30 are coded green, and an Optical Processing module 41 is coded blue. This aids in identification of the modules in the manufacturing facility.

For the needed detailed understanding of a module's background, a module may be passively or actively labeled. Passive labeling may include visual, tactile, magnetic, or other markings imposed on a module that may be interpreted by man or machine to determine information such as a reference model number and serial number, configuration information (how the module is configured), processing instructions, manufacturing data, testing protocols, or manufacturing results. Processing instructions, for example, may include whether or not a module is to be subjected to certain optional processing conditions, such as a burn-in step, or what software to load. Manufacturing data may include, for example, the date, time and location of manufacture. Testing protocols may include, for example, information regarding the type of testing required for each module. Manufacturing results may include, for example, data resulting from the specified testing protocol for the module, or performance data for the actual components used. The reference serial number may be utilized to retrieve manufacturing data from other sources or databases regarding the specific module. Examples of a passive label include a printed label, a bar code or, alternatively, a magnetic stripe. Passive labeling is illustrated schematically in FIG. 28b.

Active labeling includes electronically interactive markings that may be interpreted by, modified or added to, by a computer or similar device connected to the module. The active labeling may include information such as a reference model number and serial number, configuration information (how the module is configured) processing instructions, manufacturing data, testing protocols, manufacturing results, or field history. As described above, the reference serial number is used to retrieve manufacturing data from other sources regarding the specific module. However, the active labeling may electronically acquire information developed during the manufacturing process that will be used subsequently. For example, the exact component configuration, with component serial numbers and component data could be present within the active label. Such information could be used by a measurement device to compare the performance of the completely configured module, to that of the individual components, as an aid to troubleshooting. The active labeling may include processing and testing protocols specific to a module's configuration and customer that will be interpreted and used by downstream processing and testing equipment. Manufacturing dates, times, locations, test results, and calibration information may also be indicated by the active labeling. Field history information may include data useful for troubleshooting amplifier problems that occurred in the field. For example, this information may be pump drive current (for an Optical Power Supply module), or thermal or other environmental history information (for any module), maximum optical power to which the assembly was subjected (for any module). The primary advantage of this approach is that automated assembly and test equipment will be able to determine, without intervention, the processing and testing requirements as the modules and the finished amplifiers are manufactured. An example of an active label is an internal read/write memory chip, with external computer connections. Active labeling is illustrated schematically in FIG. 28c.

Figure 29A:
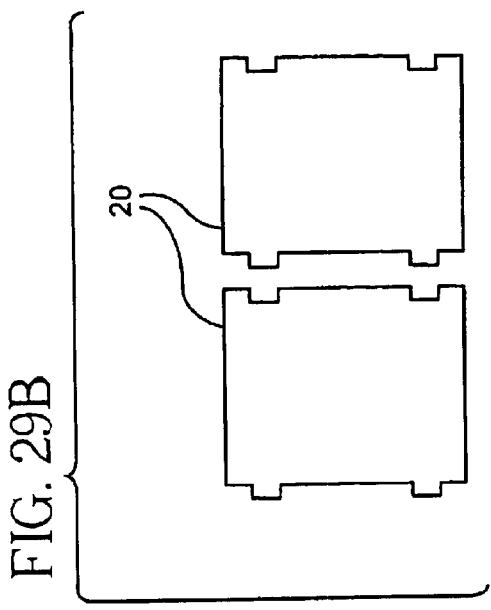
FIGS. 29a–29c illustrate, schematically, several embodiments of an optical amplifier modules that include mechanical registration to facilitate alignment.
Figure 29B:
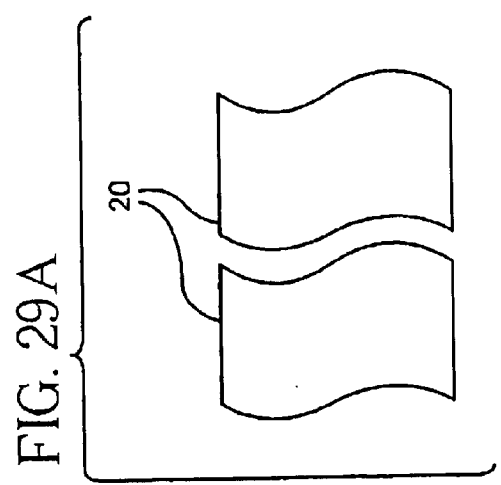
Figure 29C:
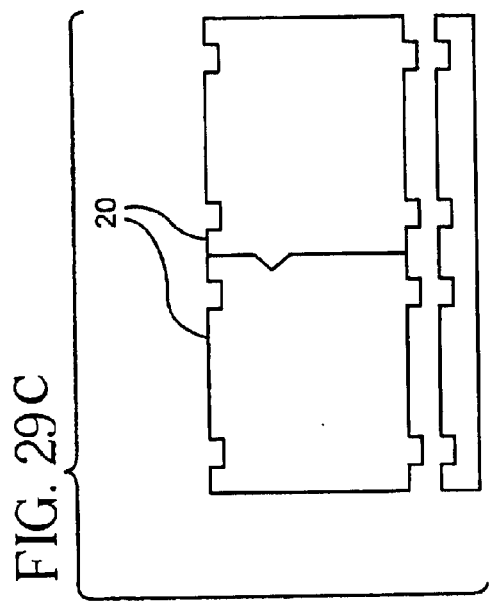

In the mechanical design of the amplifier, consideration is given to the overall mechanical architecture. More specifically, the individual module form factors must be derived so as to allow the resulting, assembled amplifier to achieve an overall size and shape required by the customer. Furthermore, it is advantageous in manufacture to design the three-dimensional form factors such that, when combined, they are compact, and fit together in a correct manner. FIGS. 29a–29c illustrate a method of mechanical registration used between modules in order to ensure correct orientation and fit. Modules may be connected by mating mechanical compression fit or spring-loaded connections, with or without electronic/electrical and/or thermal connections. Furthermore, modules may be connected by snap-fit mechanical connectors, mating guides and rails, mating pins and apertures, or mating non-planar surfaces. Mating non-planar surfaces are illustrated schematically in FIG. 29a, mating pins and apertures are illustrated schematically in FIG. 29b, and a combination of mating guides and rails (between modules 20) and mating pins and apertures (between modules 20 and the substrate/motherboard) are illustrated schematically in FIG. 29c.

The modules may also be assembled as optical/electrical circuit chips on a common motherboard, where the chips may be upgraded as needed.

The present invention provides for novel segmentation of the design of an optical amplifier into configurable modules, based on functional requirements and technical and manufacturing advantage. It is an advantage of this invention that a minimal number of configurable modules can be utilized to create a wide variety of custom-made amplifiers at minimum cost. It is a specific additional benefit that amplifiers implemented in this way could be provided with additional or improved modules in order to change and/or upgrade the amplifier functionality.

In manufacturing, the manufactured volumes of commonly used modules will typically be higher than for any individual custom amplifier. Higher volumes of more commonly used modules will reduce the manufacturing costs of modules as well as that of the resulting amplifiers. Furthermore, manufacturing costs can be subsequently reduced by novel integration, automation and manufacturing optimization of each module.

In development, new amplifier designs can incorporate previously designed, tested, and available module designs, significantly reducing amplifier design and development costs, as well as reducing development time-to-market.

Furthermore, as another advantage of the present invention, inventory risks can be reduced due to the ability to create a wide variety of amplifiers from the same modules.

Finally, it is an advantage of the present invention that the modules themselves are configurable. That is, the optical circuits employed in the modules are designed to optionally allow the inclusion or exclusion of certain optical, opto-electrical, and electronic functions during manufacturing, without design changes. This is accomplished, in such a way as to ensure that allowable combinations of options result in modules that can become part of a variety of commercial amplifiers designed to meet differing customer needs. In one embodiment of the present invention, optical, opto-electrical, and electronic functions components may be included or not included in the optical circuit. As an example, the optical circuit of the third, monitoring and access module, may or may not include an optical tap with an optical sensor with dependent electrical output, by way of presence or absence of the component function. The design of the module is such as to allow the component to be present or absent from the module, and present or absent from the optical path that makes up the optical circuit. In another embodiment of the present invention, optical components may be present within or accessible to the optical circuit but be disabled. As an example, the optical circuit of the first, Optical Power Supply module, may include a light source that is present, but not activated. Such a design would allow for manufacturing an amplifier with upgrade capability resident within the amplifier, accessible by the customer only after the purchase of, for example a software key, or optionally activated by the customer only following failure of a system component. Finally, in another embodiment of the present invention, a predetermined location may be reserved in a material within the optical circuit to allow the selective creation of an optical function directly within the light path. As an example, a grating may optionally be written into a section of optical fiber provided within the optical circuit to create a light filter. As a second example, in a planar waveguide implementation of the third Monitoring and Access module, the present invention would allow for a predetermined space in the optical path within the planar waveguide component within which to create an optical tap or bidirectional light combiner/separator function.

For a more complete understanding of the invention, its objects and advantages refer to the following specification and to the accompanying drawings. Additional features and advantages of the invention are set forth in the detailed description, which follows.

It should be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various features and embodiments of the invention, and together with the description serve to explain the principles and operation of the invention. It is intended that the present invention cover the modifications and adaptations of the disclosed embodiments, as defined by the appended claims and their equivalents.

Accordingly, it will be apparent to those skilled in the art that various modifications and adaptations can be made to the present invention without departing from the spirit and scope of the invention.

What is claimed is:

1. An amplification module for an optical amplifier, said amplification module comprising: a housing containing a plurality of optical ports, said housing (i) at least partially enclosing at least one amplification medium, (ii) providing at least one position for at least one optical filter, and (iii) including a first optical port configured to provide both signal and pump light to said amplification module, wherein said amplification module does not include an internal optical pump.

2. The amplification module according to claim 1, wherein said amplification module does not include a wavelength division multiplexer WDM for multiplexing pump light and signal light.

3. The amplification module according to claim 2, wherein said least one amplification medium includes a plurality of rare-earth doped fiber coils.

4. The amplification module according to claim 1, wherein said at least one position is a position for an optional gain flattening filter.

5. An amplification module according to claim 4, further comprising a gain flattening filter located in said position.

6. The amplification module, according to claim 5, wherein said gain flattening filter is written into said at least one amplification medium.

7. The amplification module according to claim 1 further comprising a WDM, said WDM separating optical signal light from optical pump light.

8. The amplification module according to claim 7, further comprising an optical absorber, wherein said WDM provides said optical pump light to said optical absorber.

9. The amplification module according to claim 7, comprising a first and a second optical port, wherein said WDM and a GFF are positioned between said amplification medium and said second optical port.

10. An amplification module according to claim 1, wherein said housing at least partially encloses at least two amplification media optically coupled to one another and an optical isolator located in the optical path there between.

11. An amplification module according to claim 1, wherein, said housing at least partially encloses at least two sets of optical amplification media, said two sets of optical amplification media sharing an isolator and comprising a plurality of gain coils.

12. The amplification module according to claim 1, wherein said amplification medium is optical fiber.

13. The amplification module according to claim 12, wherein said amplification medium is erbium doped optical fiber.

14. The amplification module according to claim 1, further comprising a second optical port, wherein said additional optical filter is positioned between said amplification medium and said second optical port, said optical filter being a bidirectional light combiner/separator.

15. The amplification module according to claim 1, further comprising a second optical port, wherein said additional optical filter is positioned between said amplification medium and said second optical port, said optical filter is a VOA filter.

16. The amplification module according to claim 1, further comprising a second optical port, wherein said additional optical filter is positioned between said amplification medium and said second optical port, said optical filter is a GFF.

17. The amplification module according to claim 1, wherein said module includes a plurality of amplification optical circuits, with at least one of the optical circuits including: (i) at least two optical ports, (ii) at least one amplification medium, and at least one additional optical component connected between the amplification medium and one optical port.

18. The amplification module according to claim 17, wherein said at least one additional optical component connected between the amplification medium and one optical port is a light filter.

19. The amplification module according to claim 17, wherein said at least one additional optical component connected between a first amplification medium and one optical port is a light filter and a bidirectional light combiner/separator, said light filter and said bidirectional light combiner/separator being located between a second amplification medium and one optical port.

20. The amplification module according to claim 1, wherein said module is marked by an identifying color, identifying said module as the Amplification module.

21. The amplification module according to claim 1, wherein said module includes a label containing information characterizing said module.

22. The amplification module according to claim 21, wherein said label contains manufacturing processing instructions.

23. The amplification module according to claim 22, wherein said information is accessible by an electronic interrogator device.

24. The amplification module according to claim 23, wherein said electronic interrogator device is a computer.

25. The amplification module according to claim 23, wherein said electronic interrogator device is a radio wave receiver/transmitter.

26. The amplification module according to claim 21, wherein said label contains module test instructions.

27. The amplification module according to claim 21, wherein said label contains manufacturing processing data.

28. The amplification module according to claim 21, wherein said label is an interactive electronic device, configured such that said information can be added or modified electronically.

29. The amplification module according to claim 28, wherein said label contains field history data.

30. An amplification module comprising: a housing (i) containing a plurality of optical ports and an optical circuit including a plurality of amplification mediums; and (ii) providing at least one position for an additional optional optical component forming a part of said optical circuit.

31. The amplification module according to claim 30, wherein said ports are configured to be detachably engageable to corresponding ports of an optical device.

32. The amplification module according to claim 30, further including at least two amplification media optically coupled to one another, wherein said at least one position for an additional optional optical component is located between said two amplification media.

* * * * *